US010452986B2

(12) United States Patent
Ito et al.

(10) Patent No.: US 10,452,986 B2
(45) Date of Patent: Oct. 22, 2019

(54) DATA PROCESSING APPARATUS, DATA PROCESSING METHOD, AND PROGRAM

(71) Applicant: Sony Corporation, Tokyo (JP)

(72) Inventors: Masato Ito, Tokyo (JP); Kohtaro Sabe, Tokyo (JP)

(73) Assignee: Sony Corporation, Tokyo (JP)

( * ) Notice: Subject to any disclaimer, the term of this patent is extended or adjusted under 35 U.S.C. 154(b) by 1023 days.

(21) Appl. No.: 14/387,307

(22) PCT Filed: Mar. 29, 2013

(86) PCT No.: PCT/JP2013/002182
§ 371 (c)(1),
(2) Date: Sep. 23, 2014

(87) PCT Pub. No.: WO2013/145779
PCT Pub. Date: Oct. 3, 2013

(65) Prior Publication Data
US 2015/0046135 A1    Feb. 12, 2015

(30) Foreign Application Priority Data

Mar. 30, 2012  (JP) ................................ 2012-079579
Mar. 30, 2012  (JP) ................................ 2012-079580

(51) Int. Cl.
*G06F 17/50*     (2006.01)
*G06N 7/00*      (2006.01)
(Continued)

(52) U.S. Cl.
CPC ............ *G06N 7/005* (2013.01); *G06F 17/10* (2013.01); *G06F 17/18* (2013.01); *G06N 20/00* (2019.01);
(Continued)

(58) Field of Classification Search
CPC .................................................. G06F 17/5018
(Continued)

(56) References Cited

U.S. PATENT DOCUMENTS 4,858,141 A     8/1989  Hart et al.
6,453,284 B1 *  9/2002  Paschall ................ G10L 21/028
                                                            381/94.3

(Continued)

FOREIGN PATENT DOCUMENTS

JP      07-035811 A      2/1995
JP      2001-330630 A    11/2001
(Continued)

OTHER PUBLICATIONS

Bishop, C.M. Statistical prediction by Bishop, pattern recognition, and machine learning lower-Bayesian theory, Japan, Springer Japan, Inc., Jul. 1, 2008, the 1st edition, pp. 352-353.
(Continued)

*Primary Examiner* — Andy Ho
(74) *Attorney, Agent, or Firm* — Wolf, Greenfield & Sacks, P.C.

(57)    ABSTRACT

Apparatus, methods and programs for estimating a parameter for modeling a time series signal with stochastic dynamics model, A method for obtaining data representing the mixed signals of two or more time series signals; estimating a parameter for modeling a time series signal with stochastic dynamics model. The present technology relates to a data processing apparatus, a data processing method, and a program.

9 Claims, 30 Drawing Sheets

(51) Int. Cl.

| | | |
|---|---|---|
| G06N 20/00 | (2019.01) | |
| G06F 17/10 | (2006.01) | |
| G06Q 50/06 | (2012.01) | |
| G06Q 10/06 | (2012.01) | |
| G06F 17/18 | (2006.01) | |
| G01D 4/00 | (2006.01) | |
| G01R 21/133 | (2006.01) | |

(52) U.S. Cl.
CPC ......... *G06Q 10/0631* (2013.01); *G06Q 50/06* (2013.01); *G01D 4/00* (2013.01); *G01R 21/133* (2013.01); *Y04S 20/38* (2013.01)

(58) Field of Classification Search
USPC .......................................................... 703/2
See application file for complete search history.

(56) References Cited

U.S. PATENT DOCUMENTS

| | | | | |
|---|---|---|---|---|
| 7,231,019 | B2* | 6/2007 | Pascovici ................ | G10L 17/04 379/88.02 |
| 7,363,227 | B2* | 4/2008 | Mapes-Riordan ...... | G10L 21/06 704/273 |
| 8,369,549 | B2* | 2/2013 | Bartkowiak .......... | H04R 25/505 381/312 |
| 8,423,364 | B2* | 4/2013 | Yu ......................... | G10L 15/063 704/231 |
| 8,812,427 | B2* | 8/2014 | Kim .................... | G06F 11/3006 706/52 |
| 9,366,704 | B2* | 6/2016 | Haghighat-Kashani ..................... | G06Q 10/04 |
| 2004/0117186 | A1 | 6/2004 | Ramakrishnan et al. | |
| 2012/0072141 | A1 | 3/2012 | Hidai et al. | |
| 2012/0278272 | A1 | 11/2012 | Kim et al. | |
| 2013/0222696 | A1 | 8/2013 | Yamazaki et al. | |
| 2013/0263276 | A1 | 10/2013 | Maruyama et al. | |

FOREIGN PATENT DOCUMENTS

| | | |
|---|---|---|
| JP | 2003-099085 A | 4/2003 |
| JP | 2006-338274 A | 12/2006 |
| JP | 2010-182072 A | 8/2010 |
| JP | 2011-243088 A | 12/2011 |
| JP | 2012-064023 A | 3/2012 |
| WO | WO 01/77696 A1 | 10/2001 |
| WO | WO 2006/080149 A1 | 8/2006 |

OTHER PUBLICATIONS

Ito et al., A method of appliance detection based on features of power waveform. Proceedings of the 2004 International Symposium on Applications and the Internet (SAINT '04) IEEE. pp. 291-294, Dec. 2004.
Ghahramani et al., Factorial Hidden Markov Models. Machine Learning, Kluwer Academic Publishers. Nov. 1997. vol. 29(Feb. 2003), p. 245-273.
Hart, Nonintrusive Appliance Load Monitoring. Proceeding of the IEEE. New York. Dec. 1992, vol. 80(12), p. 1870-1891.
Kim et al., Unsupervised Disaggregation of Low Frequency Power Measurements. Siam International Conference on Data Mining. Apr. 28-30, 2011, p. 747-758.
Parson, Using hidden markov models for non-intrusive appliance load monitoring. Nine-Month Report. University of Southampton School of Electronics and Computer Science. Jun. 2011;p. 1-39.
Kolter et al., REDD: A public data set for energy disaggregation research. SustKDD 2011, pp. 1-6, Aug. 31, 2011.
Bishop, Pattern Recognition and Machine Learning. Springer, 2006. pp. 591 and 633-635.
Laughman et al., Power Signature Analysis, IEEE Power & Energy Magazine (Mar./Apr. 2003), pp. 56-63.
Nakamura et al., Load Monitoring System of Electric Appliances Based on Hidden Markov Model. IEEJ Transactions B, vol. 126, No. 12, pp. 1223-1229, 2006.
International Search Report and Written Opinion dated Oct. 8, 2013 in connection with Application No. PCT/JP2013/002182.
International Preliminary Report on Patentability dated Oct. 9, 2014 in connection with Application No. PCT/JP2013/002182.
Japanese Office Action dated Oct. 1, 2015 and English translation thereof in connection with Japanese Application No. 2012-079580.
Singapore Written Opinion dated Mar. 17, 2015 in connection with Singapore Application No. 11201405498X.
Japanese Office Action dated Feb. 8, 2016 and dated Feb. 16, 2016 in connection with Japanese Application No. 2012-079579. English translation.
Japanese Office Action dated Apr. 26, 2016 in connection with Japanese Application No. 2012-079580, English translation only.
Chinese Office Action dated May 23, 2016 in connection with Chinese Application No. 201380016155.8, and English translation thereof.
Chinese Office Action dated Dec. 29, 2016 in connection with Chinese Application No. 201380016155.8, and English translation thereof.
Chinese Office Action dated Jun. 22, 2017 in connection with Chinese Application No. 201380016155.8, and English translation thereof.
Communication pursuant to Article 94(3) EPC dated Jul. 7, 2017 in connection with European Application No. 13 716 073.5.
U.S. Appl. No. 13/772,776, filed Feb. 21, 2013, Yamazaki et al.
U.S. Appl. No. 13/792,301, filed Mar. 11, 2013, Maruyama et al.
Korean Office Action dated Apr. 29, 2019 in connection with Korean Application No. 10-2014-7026147, and English translation thereof.

* cited by examiner

FIG. 7

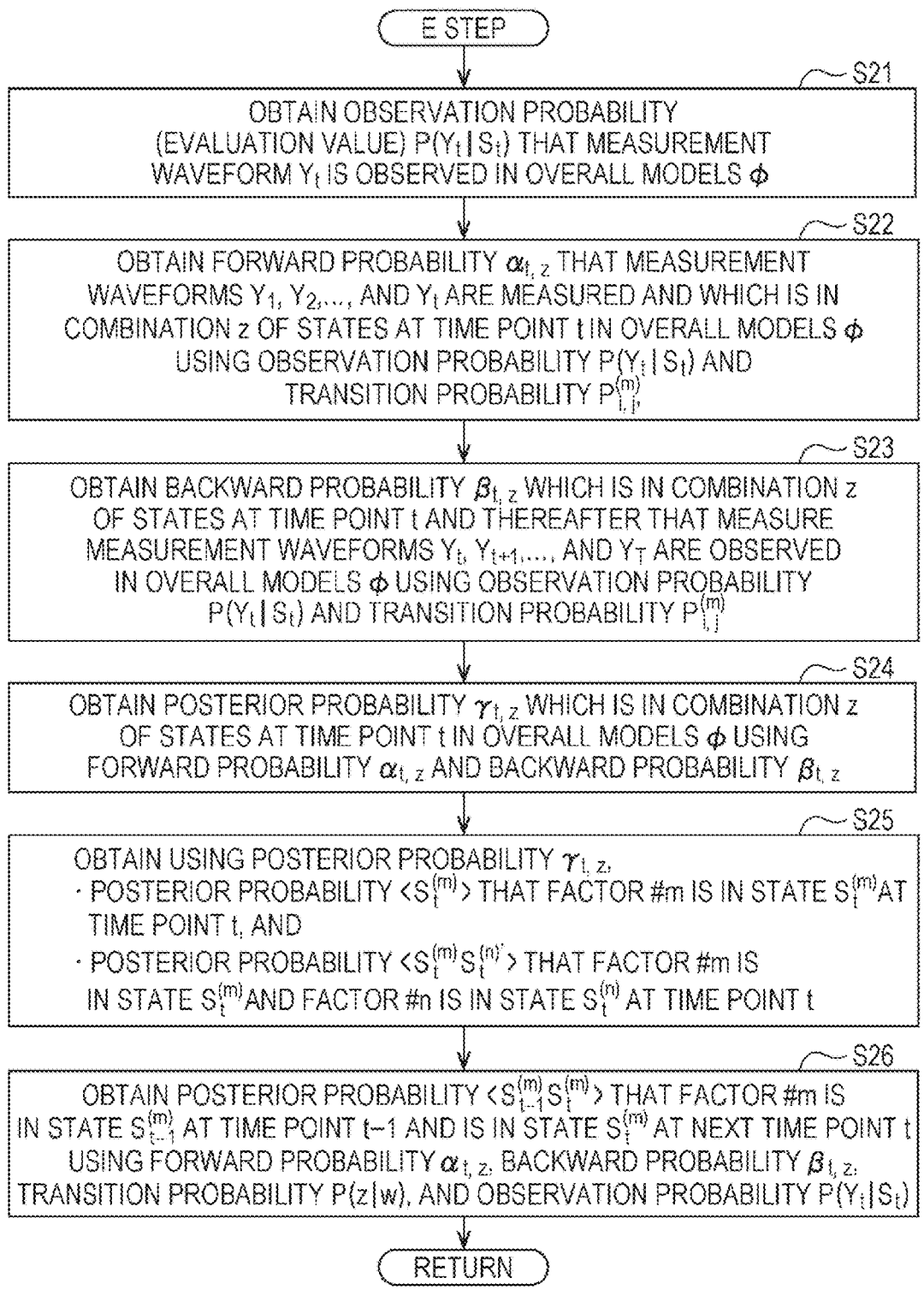

```
                    ┌─────────────┐
                    │   E STEP    │
                    └──────┬──────┘
                           ▼                            S21
┌──────────────────────────────────────────────────────┐
│           OBTAIN OBSERVATION PROBABILITY              │
│  (EVALUATION VALUE) P(Y_t|S_t) THAT MEASUREMENT       │
│    WAVEFORM Y_t IS OBSERVED IN OVERALL MODELS φ       │
└──────────────────────┬───────────────────────────────┘
                       ▼                                S22
┌──────────────────────────────────────────────────────┐
│  OBTAIN FORWARD PROBABILITY α_{t,z} THAT MEASUREMENT │
│  WAVEFORMS Y_1, Y_2,..., AND Y_t ARE MEASURED AND     │
│  WHICH IS IN COMBINATION z OF STATES AT TIME POINT t  │
│  IN OVERALL MODELS φ USING OBSERVATION PROBABILITY    │
│  P(Y_t|S_t) AND TRANSITION PROBABILITY P_{i,j}^{(m)}  │
└──────────────────────┬───────────────────────────────┘
                       ▼                                S23
┌──────────────────────────────────────────────────────┐
│  OBTAIN BACKWARD PROBABILITY β_{t,z} WHICH IS IN      │
│  COMBINATION z OF STATES AT TIME POINT t AND          │
│  THEREAFTER THAT MEASURE MEASUREMENT WAVEFORMS        │
│  Y_t, Y_{t+1},..., AND Y_T ARE OBSERVED IN OVERALL    │
│  MODELS φ USING OBSERVATION PROBABILITY P(Y_t|S_t)    │
│  AND TRANSITION PROBABILITY P_{i,j}^{(m)}             │
└──────────────────────┬───────────────────────────────┘
                       ▼                                S24
┌──────────────────────────────────────────────────────┐
│  OBTAIN POSTERIOR PROBABILITY γ_{t,z} WHICH IS IN     │
│  COMBINATION z OF STATES AT TIME POINT t IN OVERALL   │
│  MODELS φ USING FORWARD PROBABILITY α_{t,z} AND       │
│  BACKWARD PROBABILITY β_{t,z}                         │
└──────────────────────┬───────────────────────────────┘
                       ▼                                S25
┌──────────────────────────────────────────────────────┐
│  OBTAIN USING POSTERIOR PROBABILITY γ_{t,z}:          │
│  · POSTERIOR PROBABILITY <S_i^{(m)}> THAT FACTOR #m   │
│    IS IN STATE S_i^{(m)} AT TIME POINT t, AND         │
│  · POSTERIOR PROBABILITY <S_t^{(m)}S_t^{(n)}> THAT    │
│    FACTOR #m IS IN STATE S_i^{(m)} AND FACTOR #n IS   │
│    IN STATE S_i^{(n)} AT TIME POINT t                 │
└──────────────────────┬───────────────────────────────┘
                       ▼                                S26
┌──────────────────────────────────────────────────────┐
│  OBTAIN POSTERIOR PROBABILITY <S_{t-1}^{(m)}S_t^{(m)}>│
│  THAT FACTOR #m IS IN STATE S_{t-1}^{(m)} AT TIME     │
│  POINT t-1 AND IS IN STATE S_t^{(m)} AT NEXT TIME     │
│  POINT t USING FORWARD PROBABILITY α_{t,z}, BACKWARD  │
│  PROBABILITY β_{t,z}, TRANSITION PROBABILITY P(z|w),  │
│  AND OBSERVATION PROBABILITY P(Y_t|S_t)               │
└──────────────────────┬───────────────────────────────┘
                       ▼
                ┌─────────────┐
                │   RETURN    │
                └─────────────┘
```

DATA PROCESSING APPARATUS, DATA PROCESSING METHOD, AND PROGRAM

RELATED APPLICATIONS

This application is the National Stage of International Application No. PCT/JP2013/002182, filed in the Japanese Patent Office as a Receiving Office on Mar. 29, 2013 which claims priority to Japanese Priority Patent Application JP 2012-079579, filed in the Japan Patent Office on Mar. 30, 2012, and to Japanese Priority Patent Application JP 2012-079580, filed in the Japan Patent Office on Mar. 30, 2012, each of which are hereby incorporated by reference in its entirety.

TECHNICAL FIELD

The present technology relates to a data processing apparatus, a data processing method, and a program, and particularly to a data processing apparatus, a data processing method, and a program, capable of easily and accurately obtaining power consumption or the like of, for example, each of a plurality of electrical appliances in households.

BACKGROUND ART

As a method of presenting power consumption or current consumption of, for example, each of electrical appliances such as household electrical appliances (electrical appliances for households) in a household or the like to a user in the household and realizing so-called "visualization" of power consumption or the like, there is a method of, for example, installing a smart tap in each outlet.

The smart tap has a measurement function of measuring power which is consumed by an outlet (to which a household electrical appliance is connected) in which the smart tap is installed and a communication function with an external device.

In the smart tap, power (consumption) measured with the measurement function is transmitted to a display or the like with the communication function, and, in the display, the power consumption from the smart tap is displayed, thereby realizing "visualization" of power consumption of each household electrical appliance.

However, installing smart taps in all the outlets in a household is not easy in terms of costs.

In addition, a household electrical appliance fixed in a house, such as a so-called built-in air conditioner may be directly connected to a power line without using outlets in some cases, and thus it is difficult to use the smart tap for such a household electrical appliance.

Therefore, a technique called NILM (Non-Intrusive Load Monitoring) in which, for example, in a household or the like, from information on current measured in a distribution board (power distribution board), power consumption or the like of each household electrical appliance in the household connected ahead thereof has attracted attention.

In the NILM, for example, using current measured in a location, power consumption of each household electrical appliance (load) connected ahead therefrom is obtained without individual measurement.

For example, PTL 1 discloses an NILM technique in which active power and reactive power are calculated from current and voltage measured in a location, and an electrical appliance is identified by clustering respective variation amounts.

In the technique disclosed in PTL 1, since variations in active power and reactive power when a household electrical appliance is turned on and off are used, variation points of the active power and reactive power are detected. For this reason, if detection of variation points fails, it is difficult to accurately identify the household electrical appliance.

Further, in recent household electrical appliances, it is difficult to represent operating states as two states of ON and OFF, and thus it is difficult to accurately identify household electrical appliances merely by using variations in active power and reactive power in an ON state and OFF state.

Therefore, for example, PTLs 2 and 3 disclose an NILM technique in which LMC (Large Margin Classifier) such as SVM (Support Vector Machine) is used as an identification model (discriminative model, Classification) of household electrical appliances.

However, in the NILM using the identification model, unlike a generative model such as an HMM (Hidden Markov Model), existing learning data is prepared for each household electrical appliance, and learning of an identification model using the learning data is required to be completed in advance.

For this reason, in the NILM using an identification model, it is difficult to handle a household electrical appliance where learning of an identification model is not performed using known learning data.

Therefore, for example, NPLs 1 and 2 disclose an NILM technique in which an HMM which is a generative model is used instead of an identification model of which learning is required using known learning data in advance.

CITATION LIST

Patent Literature

PTL 1: Specification of U.S. Pat. No. 4,858,141
PTL 2: Japanese Unexamined Patent Application Publication No. 2001-330630
PTL 3: International Publication brochure WO01/077696

Non Patent Literature

NPL 1: Bons M., Deville Y., Schang D. 1994. Non-intrusive electrical load monitoring using Hidden Markov Models. Third international Energy Efficiency and DSM Conference, October 31, Vancouver, Canada., p. 7
NPL 2: Hisahide NAKAMURA, Koichi ITO, Tatsuya SUZUKI, "Load Monitoring System of Electric Appliances Based on Hidden Markov Model", IEEJ Transactions B, Vol. 126, No. 12, pp. 12231229, 2006

SUMMARY OF INVENTION

Technical Problem

However, in the NILM using a simple HMM, if the number of household electrical appliances increases, the number of states of the HMM becomes enormous, and thus implementation thereof is difficult.

Specifically, for example, in a case where an operating state of each household electrical appliance is two states of ON and OFF, the number of states of the HMM necessary to represent (a combination of) operation states of M household electrical appliances is 2M, and the number of transition probabilities of states is $(2M)^2$ which is a square of the number of the states.

Therefore, even if the number M of household electrical appliances in a household is, for example, 20, although it cannot be said that there are many household electrical appliances recently, the number of states of the HMM is $2^{20}=1,048,576$, and the number of transition probabilities is 1,099,511,627,776 corresponding to the square thereof, which is more enormous in a tera-order.

At present, there is a demand for proposal of an NILM technique capable of easily and accurately obtaining power consumption or the like of a household electrical appliance of which operating states are not only two states of ON and OFF, that is, each electrical appliance such as a household electrical appliance (variable load household electrical appliance), for example, an air conditioner of which power (current) consumption varies depending on modes, settings, or the like.

The present technology has been made in consideration of these circumstances and enables power consumption of each electrical appliance to be easily and accurately obtained.

Solution to Problem

According to an aspect of the present disclosure, there is provided a method for estimating current consumption of an electrical device, including: obtaining data representing a sum of electrical signals of two or more electrical devices, the two or more electrical devices including a first electrical device; processing the data with a Factorial Hidden Markov Model (FHMM) to produce an estimate of an electrical signal of the first electrical device; and outputting the estimate of the electrical signal of the first electrical device, wherein the FHMM has a factor corresponding to the first electrical device, the factor having three or more states.

In some embodiments, the three or more states of the factor correspond to three or more respective electrical signals of the first electrical device in three or more respective operating states of the first electrical device.

In some embodiments, the method further includes: restricting the FHMM such that a number of factors of the FHMM which undergo state transition at a same time point is less than a threshold number.

According to another aspect of the present disclosure, there is provided a monitoring apparatus, including: a data acquisition unit for obtaining data representing a sum of electrical signals of two or more electrical devices, the two or more electrical devices including a first electrical device; a state estimation unit for processing the data with a Factorial Hidden Markov Model (FHMM) to produce an estimate of an operating state of the first electrical device, the FHMM having a factor corresponding to the first electrical device, the factor having three or more states; and a data output unit for outputting an estimate of an electrical signal of the first electrical device, the estimate of the electrical signal being based at least in part on the estimate of the operating state of the first electrical device.

According to another aspect of the present disclosure, there is provided a monitoring apparatus, including: a data acquisition unit for obtaining data representing a sum of electrical signals of two or more electrical devices, the two or more electrical devices including a first electrical device; a state estimation unit for processing the data with a Factorial Hidden Markov Model (FHMM) to produce an estimate of an operating state of the first electrical device, the FHMM having a factor corresponding to the first electrical device, the factor having three or more states; a model learning unit for updating one or more parameters of the FHMM, wherein updating the one or more parameters of the FHMM comprises performing restricted waveform separation learning; and a data output unit for outputting an estimate of an electrical signal of the first electrical device, the estimate of the electrical signal being based at least in part on the estimate of the operating state of the first electrical device.

Advantageous Effects of Invention

According to the aspect of the present technology, it is possible to easily and accurately obtain power consumption of each of electrical appliances.

BRIEF DESCRIPTION OF DRAWINGS

FIG. 7 is a flowchart illustrating a process of the E step performed in step S13 by the monitoring system.

DESCRIPTION OF EMBODIMENTS

<Outline of Present Technology>

Figure 1:
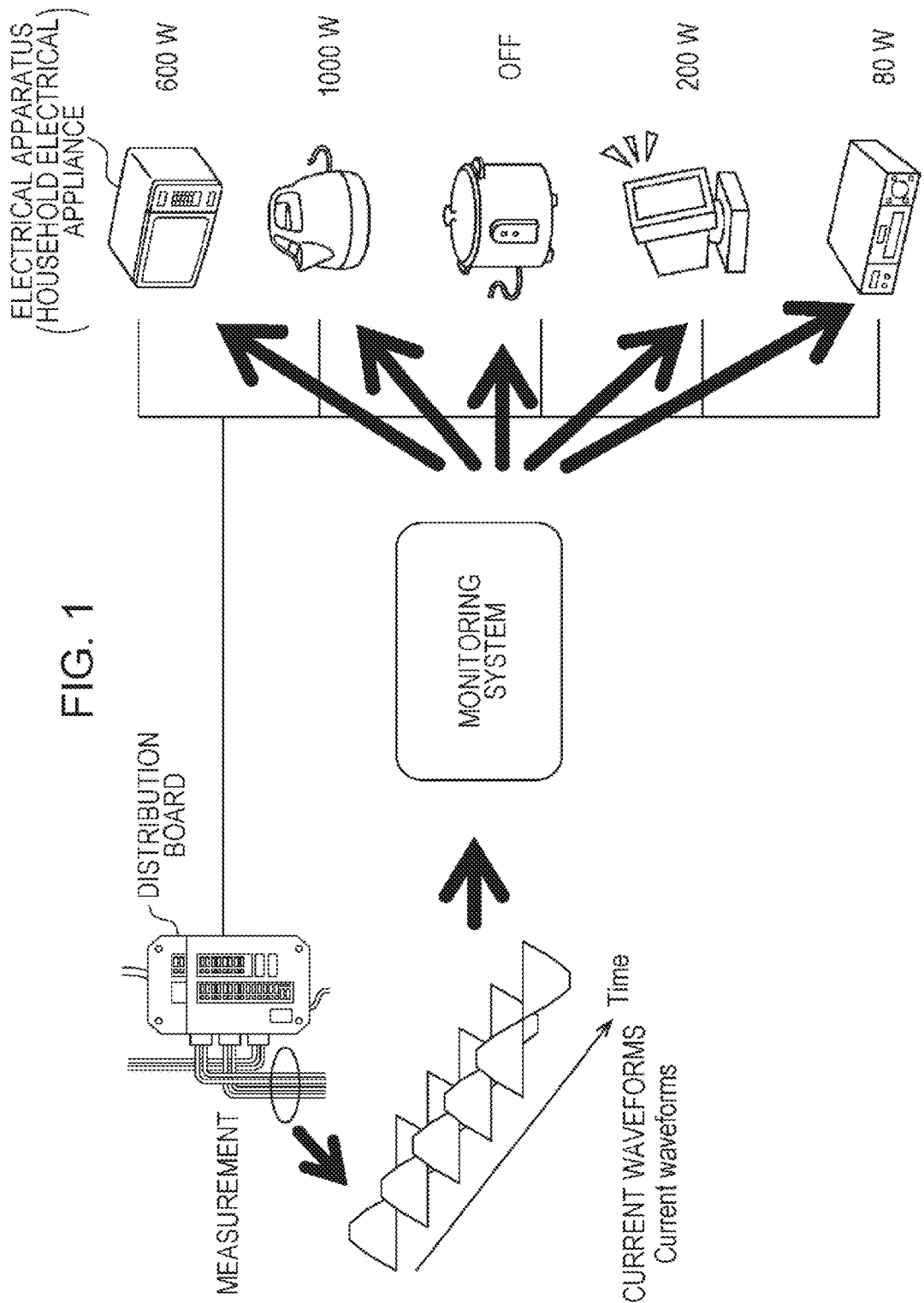
FIG. 1 is a diagram illustrating an outline of an embodiment of a monitoring system to which a data processing apparatus of the present technology is applied.

FIG. 1 is a diagram illustrating an outline of an embodiment of a monitoring system to which a data processing apparatus of the present technology is applied. In some embodiments, a monitoring system may be referred to as a smart meter.

In each household, power provided from an electric power company is drawn to a distribution board (power distribution board) and is supplied to electrical appliances such as household electrical appliances (connected to outlets) in the household.

The monitoring system to which the present technology is applied measures a sum total of current which is consumed by one or more household electrical appliances in the household in a location such as the distribution board, that is, a source which supplies power to the household, and performs household electrical appliance separation where power (current) consumed by individual household electrical appliance such as, for example, an air conditioner or a vacuum cleaner in the household, from a series of the sum total of current (current waveforms).

In addition, as input data which is input to the monitoring system, in addition to the sum total of current itself consumed by each household electrical appliance, sum total data regarding the sum total of current consumed by each household electrical appliance may be employed.

As the sum total data, a sum total of values which can be added may be employed. Specifically, as the sum total data, in addition to the sum total of current itself consumed by each household electrical appliance, for example, a sum total of power consumed by each household electrical appliance, or a sum total of frequency components obtained by performing FFT (Fast Fourier Transform) for waveforms of current consumed by each household electrical appliance, may be employed.

In addition, in the household electrical appliance separation, information regarding current consumed by each household electrical appliance can be separated from the sum total data in addition to power consumed by each household electrical appliance. Specifically, in the household electrical appliance separation, current consumed by each household electrical appliance or a frequency component thereof can be separated from the sum total data.

In the following description, as the sum total data, for example, a sum total of current consumed by each household electrical appliance is employed, and, for example, a waveform of current consumed by each household electrical appliance is separated from waveforms of the sum total of current which is the sum total data.

Figure 2:
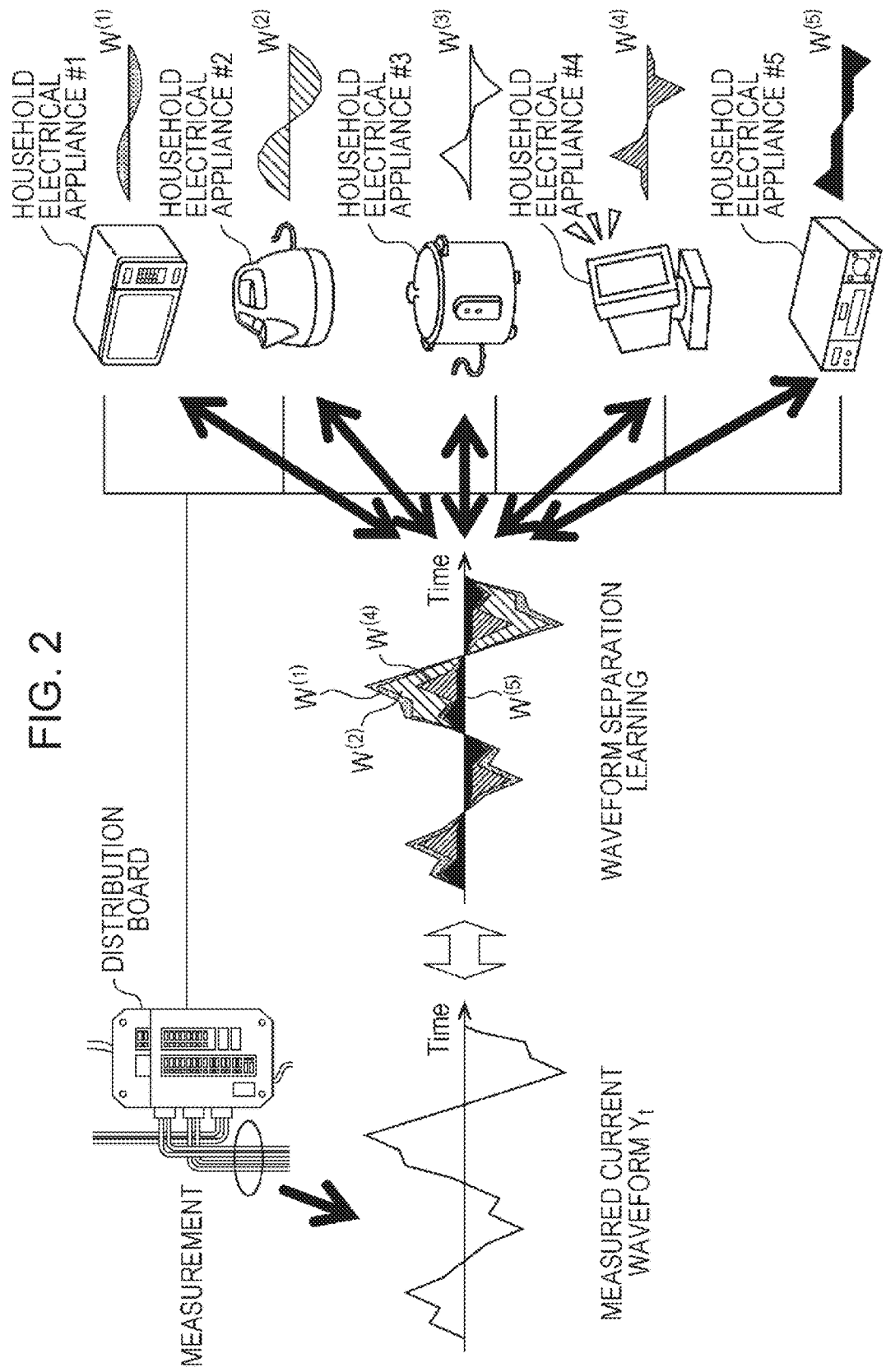
FIG. 2 is a diagram illustrating an outline of waveform separation learning performed in household electrical appliance separation.

FIG. 2 is a diagram illustrating an outline of the waveform separation learning performing the household electrical appliance separation.

In the waveform separation learning, a current waveform $Y_t$ which is sum total data at the time point t is set as an addition value (sum total) of a current waveform $W^{(m)}$ of current consumed by each household electrical appliance #m, and the current waveform $W^{(m)}$ consumed by each household electrical appliance #m is obtained from the current waveform $Y_t$.

In FIG. 2, there are five household electrical appliances #1 to #5 in the household, and, of the five household electrical appliances #1 to #5, the household electrical appliances #1, #2, #4 and #5 are in an ON state (state where power is consumed), and the household electrical appliance #3 is in an OFF state (state where power is not consumed).

For this reason, in FIG. 2, the current waveform $Y_t$ as the sum total data becomes an addition value (sum total) of current consumption $W^{(1)}$, $W^{(2)}$, $W^{(4)}$ and $W^{(5)}$ of the respective household electrical appliances #1, #2, #4 and #5.

First Embodiment of Monitoring System to which Present Technology is Applied

Figure 3:
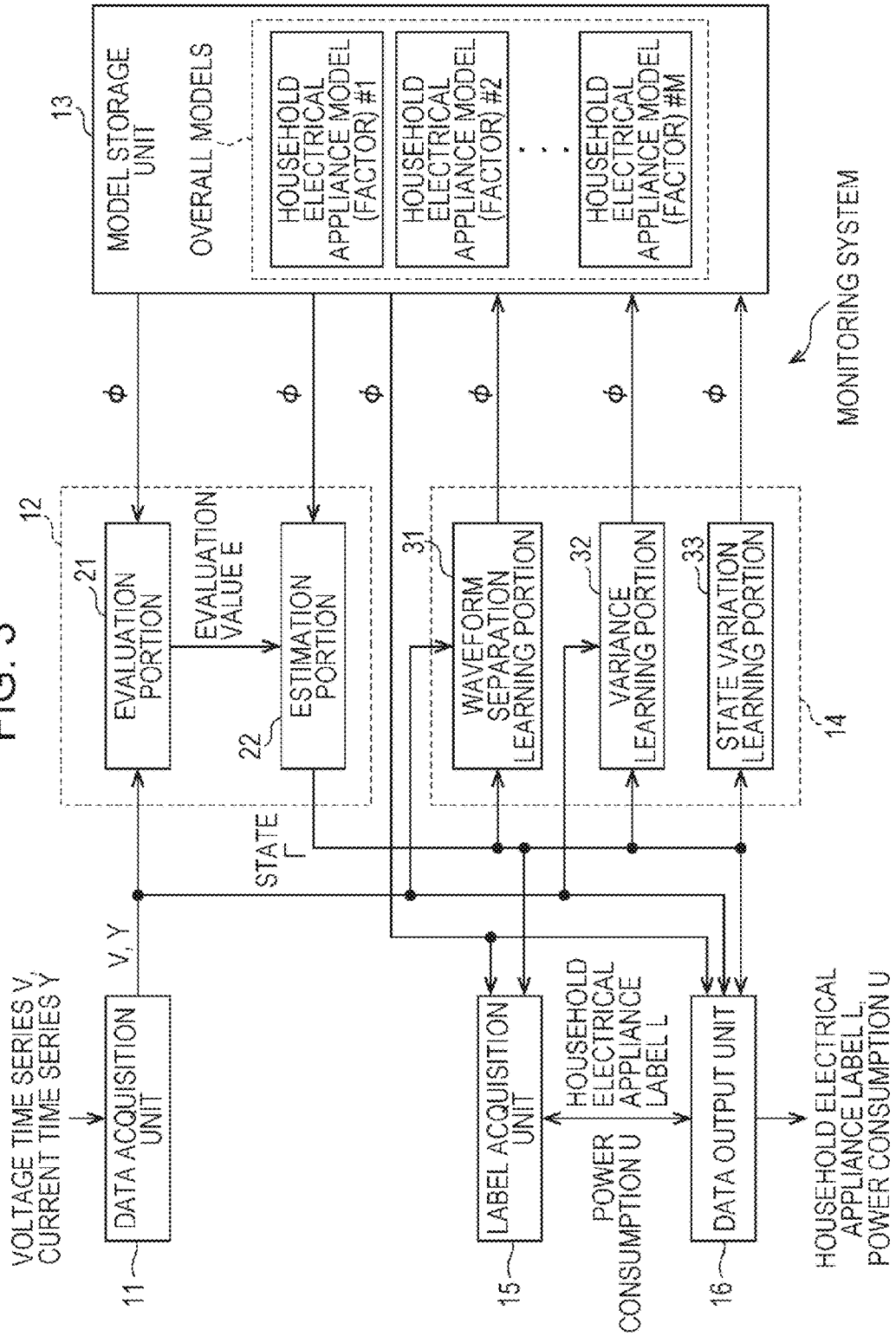
FIG. 3 is a block diagram illustrating a configuration example of the first embodiment of the monitoring system to which the present technology is applied.

FIG. 3 is a block diagram illustrating a configuration example of the first embodiment of the monitoring system to which the present technology is applied.

In FIG. 3, the monitoring system includes a data acquisition unit 11, a state estimation unit 12, a model storage unit 13, a model learning unit 14, a label acquisition unit 15, and a data output unit 16.

The data acquisition unit 11 acquires a time series of current waveforms Y (current time series) as sum total data, and a time series of voltage waveforms (voltage time series) V corresponding to the current waveforms Y, so as to be supplied to the state estimation unit 12, the model learning unit 14, and the data output unit 16.

In other words, the data acquisition unit 11 is constituted by a measurement device (sensor) which measures, for example, current and voltage.

The data acquisition unit 11 measures the current waveform Y as a sum total of current consumed by each household electrical appliance in which the monitoring system is installed in the household, for example, in a distribution board or the like and measures the corresponding voltage waveform V, so as to be supplied to the state estimation unit 12, the model learning unit 14, and the data output unit 16.

The state estimation unit 12 performs state estimation for estimating an operating state of each household electrical appliance by using the current waveform Y from the data acquisition unit 11, and overall models (model parameters thereof)

$\phi$ which are stored in the model storage unit 13 and are models of overall household electrical appliances in which the monitoring system is installed in the household. In addition, the state estimation unit 12 supplies an operating state $\Gamma$ of each household electrical appliance which is an estimation result of the state estimation, to the model learning unit 14, the label acquisition unit 15, and the data output unit 16.

In other words, in FIG. 3, the state estimation unit 12 has an evaluation portion 21 and an estimation portion 22.

The evaluation portion 21 obtains an evaluation value E where the current waveform Y supplied (to the state estimation unit 12) from the data acquisition unit 11 is observed in each combination of states of a plurality of household electrical appliance models #1 to #M forming the overall models $\phi$ stored in the model storage unit 13, so as to be supplied to the estimation portion 22.

The estimation portion 22 estimates a state of each of a plurality of household electrical appliances #1 to #M forming the overall models $\phi$ stored in the model storage unit 13, that is, an operating state $\Gamma$ of a household electrical appliance indicated by the household electrical appliance model #m (a household electrical appliance modeled by the household electrical appliance model #m) by using the evaluation value E supplied from the evaluation portion 21, so as to be supplied to the model learning unit 14, the label acquisition unit 15, and the data output unit 16.

The model storage unit 13 stores overall models (model parameters)

$\phi$ which are a plurality of overall models.

The overall models $\phi$ include household electrical appliance models #1 to #M which are M models (representing current consumption) of a plurality of household electrical appliances.

The parameters $\phi$ of the overall models include a current waveform parameter indicating current consumption for each operating state of a household electrical appliance indicated by the household electrical appliance model #m.

The parameters $\phi$ of the overall models may include, for example, a state variation parameter indicating transition (variation) of an operating state of the household electrical appliance indicated by the household electrical appliance model #m, an initial state parameter indicating an initial state of an operating state of the household electrical appliance indicated by the household electrical appliance model #m, and a variance parameter regarding a variance of observed values of the current waveform Y which is observed (generated) in the overall models.

The model parameters $\phi$ of the overall models stored in the model storage unit 13 are referred to by the evaluation portion 21 and the estimation portion 22 of the state estimation unit 12, the label acquisition unit 15, and the data output unit 16, and are updated by a waveform separation learning portion 31, a variance learning portion 32, and a state variation learning portion 33 of the model learning unit 14, described later.

The model learning unit 14 performs model learning for updating the model parameters $\phi$ of the overall models stored in the model storage unit 13, using the current waveform Y supplied from the data acquisition unit 11 and the estimation result (the operating state of each household electrical appliance)

$\Gamma$ of the state estimation supplied from (the estimation portion 22 of) the state estimation unit 12.

In other words, in FIG. 3, the model learning unit 14 includes the waveform separation learning portion 31, the variance learning portion 32, and the state variation learning portion 33.

The waveform separation learning portion 31 performs waveform separation learning for obtaining (updating) a current waveform parameter which is the model parameter $\phi$ by using the current waveform Y supplied (to the model learning unit 14) from the data acquisition unit 11 and the operating state $\Gamma$ of each household electrical appliance supplied from (the estimation portion 22 of) the state estimation unit 12, and updates the current waveform parameter stored in the model storage unit 13 to a current waveform parameter obtained by the waveform separation learning.

The variance learning portion 32 performs variance learning for obtaining (updating) a variance parameter which is the model parameter $\phi$ by using the current waveform Y supplied (to the model learning unit 14) from the data acquisition unit 11 and the operating state $\Gamma$ of each household electrical appliance supplied from (the estimation portion 22 of) the state estimation unit 12, and updates the variance parameter stored in the model storage unit 13 to a variance parameter obtained by the variance learning.

The state variation learning portion 33 performs state variation learning for obtaining (updating) an initial state parameter and a state variation parameter which are the model parameters $\phi$ by using the operating state $\Gamma$ of each household electrical appliance supplied from (the estimation portion 22 of) the state estimation unit 12, and updates the initial state parameter and the state variation parameter stored in the model storage unit 13 to an initial state parameter and a state variation parameter obtained by the variance learning.

The label acquisition unit 15 acquires a household electrical appliance label $L^{(m)}$ for identifying a household electrical appliance indicated by each household electrical appliance model #m by using the operating state

Γ of each household electrical appliance supplied from (the estimation portion 22 of) the state estimation unit 12, the overall models

ϕ stored in the model storage unit 13, and the power consumption $U^{(m)}$ of a household electrical appliance of each household electrical appliance model #m, which is obtained by the data output unit 16, as necessary, so as to be supplied to the data output unit 16.

The data output unit 16 obtains power consumption $U^{(m)}$ of a household electrical appliance indicated by each household electrical appliance model #m by using the voltage waveform V supplied from the data acquisition unit 11, the operating state

Γϕ of each household electrical appliance supplied from (the estimation portion 22 of) the state estimation unit 12, and the overall models stored in the model storage unit 13, so as to be displayed on a display (not shown) and be presented to a user.

In addition, in the data output unit 16, the power consumption $U^{(m)}$ of a household electrical appliance indicated by each household electrical appliance model #m may be presented to a user along with the household electrical appliance label $L^{(m)}$ supplied from the label acquisition unit 15.

In the monitoring system configured in the above-described way, as the overall models stored in the model storage unit 13, for example, an FHMM (Factorial Hidden Markov Model) may be employed.

Figure 4:
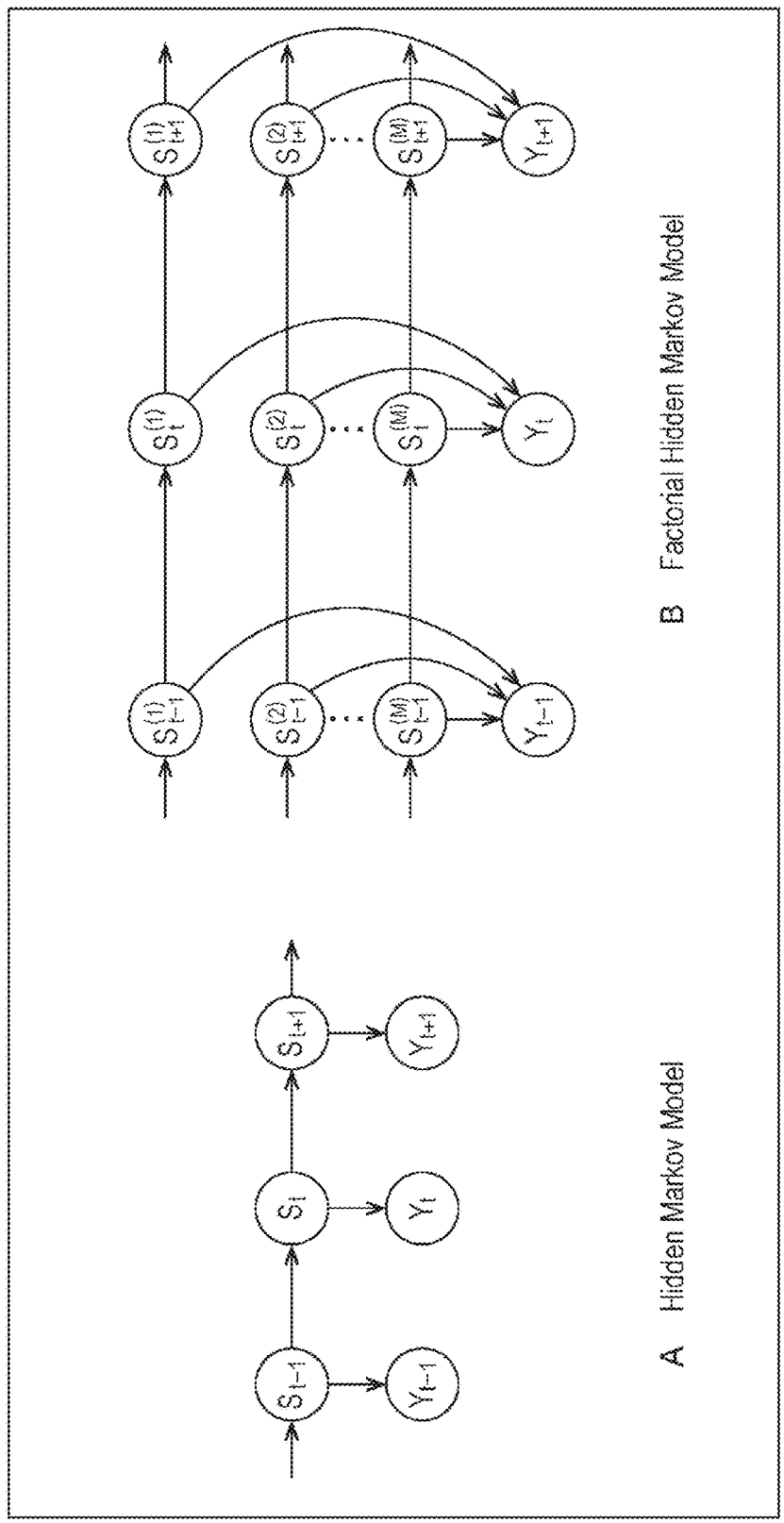
FIG. 4 is a diagram illustrating an FHMM.

FIG. 4 is a diagram illustrating the FHMM.

In other words, A of FIG. 4 shows a graphical model of a normal HMM, and B of FIG. 4 shows a graphical model of the FHMM.

In the normal HMM, at the time point t, a single observation value $Y_t$ is observed in a single state $S_t$ which is at the time point t.

On the other hand, in the FHMM, at the time point t, a single observation value $Y_t$ is observed in a combination of a plurality of states $S^{(1)}_t$, $S^{(2)}_t$, . . . , and $S^{(M)}_t$ which are at the time point t.

The FHMM is a probability generation model proposed by Zoubin Ghahramani et al., and details thereof are disclosed in, for example, Zoubin Ghahramani, and Michael I. Jordan, Factorial Hidden Markov Models', Machine Learning Volume 29, Issue 2-3, November/December 1997 (hereinafter, also referred to as a document A).

Figure 5:
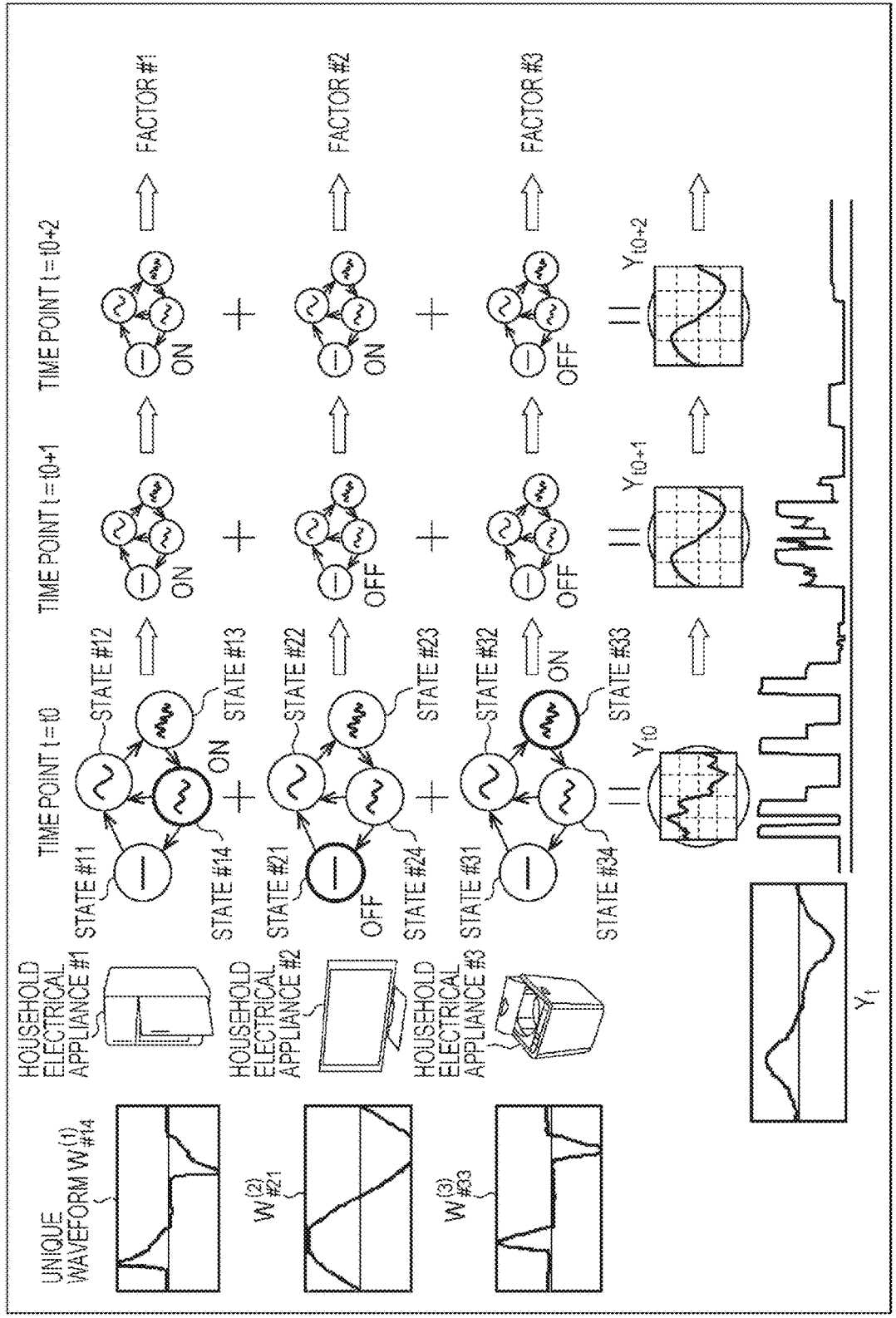
FIG. 5 is a diagram illustrating an outline of the formulation of the household electrical appliance separation using the FHMM.

FIG. 5 is a diagram illustrating an outline of the formulation of the household electrical appliance separation using the FHMM.

Here, the FHMM includes a plurality of HMMs. Each HMM included in the FHMM is also referred to as a factor, and an m-th factor is indicated by a factor #m.

In the FHMM, a combination of a plurality of states $S^{(1)}_t$, to $S^{(M)}_t$ which are at the time point t is a combination of states of the factor #m (a set of a state of the factor #1, a state of the factor #2, . . . , and a state of the factor #M).

FIG. 5 shows the FHMM where the number M of the factors is three.

In the household electrical appliance separation, for example, a single factor corresponds to a single household electrical appliance (a single factor is correlated with a single household electrical appliance). In FIG. 5, the factor #m corresponds to the household electrical appliance #m.

In the FHMM, the number of states forming a factor is arbitrary for each factor, and, in FIG. 5, the number of states of each of the three factors #1, #2 and #3 is four.

In FIG. 5, at the time point t=t0, the factor #1 is in a state #14 (indicated by the thick line circle) among four states #11, #12, #13 and #14, and the factor #2 is in a state #21 (indicated by the thick line circle) among four states #21, #22, #23 and #24. In addition, at the time point t=t0, the factor #3 is in a state #33 (indicated by the thick line circle) among four states #31, #32, #33 and #34.

In the household electrical appliance separation, a state of a factor #m corresponds to an operating state of the household electrical appliance #m corresponding to the factor #m.

For example, in the factor #1 corresponding to the household electrical appliance #1, the state #11 corresponds to an OFF state of the household electrical appliance #1, and the state #14 corresponds to an ON state in a so-called normal mode of the household electrical appliance #1. In addition, in the factor #1 corresponding to the household electrical appliance #1, the state #12 corresponds to an ON state in a so-called sleep mode of the household electrical appliance #1, and the state #13 corresponds to an ON state in a so-called power saving mode of the household electrical appliance #1.

In the FHMM, in a state #mi of the factor #m, a unique waveform $W^{(m)}_{\#mi}$ which is a unique waveform for each state of the factor is observed (generated).

In FIG. 5, in the factor #1, a unique waveform $W^{(1)}_{\#14}$ is observed in the state #14 which is at the time point t=t0, and, in the factor #2, a unique waveform $W^{(2)}_{\#21}$ is observed in the state #21 which in at the time point t=t0. Further, in the factor #3, a unique waveform $W^{(3)}_{\#33}$ is observed in the state #33 which in at the time point t=t0.

In the FHMM, a synthesis waveform obtained by synthesizing unique waveforms observed in states of the respective factors is generated as an observation value which is observed in the FHMM.

Here, as the synthesis of unique waveforms, for example, a sum total (addition) of the unique waveforms may be employed. In addition, as the synthesis of unique waveforms, for example, weight addition of the unique waveforms or logical sum (a case where a value of unique waveforms is 0 and 1) of the unique waveforms may be employed, and, in the household electrical appliance separation, a sum total of unique waveforms is employed.

In the learning of the FHMM, model parameters of the FHMM are obtained (updated) such that current waveforms $Y_{t0}$, $Y_{t0+1}$, . . . are observed which are sum total data at the respective time points t= . . . , t0, t1, . . . in the FHMM.

In a case of employing the above-described FHMM as the overall models

ϕ stored in the model storage unit 13 (FIG. 3), a household electrical appliance model #m forming the overall models

ϕ corresponds to the factor #m.

In addition, as the number M of factors of the FHMM, a value larger than the maximum number of household electrical appliances expected as existing in a household by a predetermined amount which is a margin is employed.

In addition, the FHMM as the overall models

ϕ employs an FHMM where each factor has three or more states.

This is because, in a case where a factor has only two state, only two states of, for example, an OFF state and an ON state are represented as operating states of a household electrical appliance corresponding to the factor, and it is difficult to obtain accurate power consumption with respect to a household electrical appliance (hereinafter, also referred to as a variable load household electrical appliance) such as an air conditioner of which power (current) consumption varies depending on modes or settings.

That is to say, if the FHMM as the overall models

φ employs an FHMM where each factor has three or more states is employed, it is possible to obtain power consumption or the like with reference to the variable load household electrical appliance.

In a case where the FHMM is employed as overall models φ, a simultaneous distribution $P(\{S_t, Y_t\})$ of a series of the current waveform $Y_t$ observed in the FHMM and a combination $S_t$ of a state $S^{(m)}_t$ of the factor #m is calculated using Math (1) assuming the Markov property.

[Math. 1]

$$P(\{S_t, Y_t\}) = P(S_1)P(Y_1 \mid S_1) \prod_{t=2}^{1} P(S_t \mid S_{t-1})P(Y_t \mid S_t) \quad (1)$$

Here, the simultaneous distance $P(\{S_t, Y_t\})$ indicates the probability that the current waveform $Y_t$ is observed in a combination (a combination of states of M factors) $S_t$ of a state $S^{(m)}_t$ of the factor #m at the time point t.

$P(S_1)$ indicates the initial state probability which is in a combination $S_1$ of a state $S^{(m)}_1$ of the factor #m is in at the initial time point t=1.

$P(S_t \mid S_{t-1})$ indicates the transition probability that a factor is in a combination $S_{t-1}$ of states at the time point t-1 and transitions to a combination $S_t$ of states at the time point t.

$P(Y_t \mid S_t)$ indicates the observation probability that the current waveform $Y_t$ is observed in the combination $S_t$ of states at the time point t.

The combination $S_t$ of states at the time point t is a combination of states $S^{(1)}_t, S^{(2)}_t, \ldots,$ and $S^{(M)}_t$ at the time point t of M factors #1 to #M, and is represented by the Math $S_t = \{S^{(1)}_t, S^{(2)}_t, \ldots, \text{and } S^{(M)}_t\}$.

In addition, an operating state of the household electrical appliance #m is assumed to vary independently from another household electrical appliance #m', and a state $S^{(m)}_t$ of the factor #m transitions independently from a state $S^{(m')}_t$ of another factor #m'.

Further, the number $K^{(m)}$ of states of an HMM which is the factor #m of the FHMM may employ the number independent from the number $K^{(m')}$ of states of an HMM which is another factor #m'. However, here, for simplicity of description, the numbers $K^{(1)}$ to $K^{(M)}$ of the factors #1 to #M are the same number K as indicated by the Math $K^{(1)} = K^{(2)} = \ldots = K^{(M)} = K$.

In the FHMM, the initial state probability $P(S_1)$, the transition probability $P(S_t \mid S_{t-1})$, and the observation probability $P(Y_t \mid S_t)$ which are necessary to calculate the simultaneous distance $P(S_t, Y_t)$ in Math (1) may be calculated as follows.

That is to say, the initial state probability $P(S_1)$ may be calculated according to Math (2).

[Math. 2]

$$P(S_1) = \prod_{m=1}^{M} P(S_1^{(m)}) \quad (2)$$

Here, $P(S^{(m)}_1)$ indicates the initial state probability that the state $S^{(m)}_1$ of the factor #m is a state (initial state) which is at the initial time point t=1.

The initial state probability $P(S^{(m)}_1)$ is, for example, a column vector of K rows (a matrix of K rows and one column) which has an initial state probability in the k-th (where k=1, 2, ..., and K) state of the factor #m as a k-th row component.

The transition probability $P(S_t \mid S_{t-1})$ may be calculated according to Math (3).

[Math. 3]

$$P(S_t \mid S_{t-1}) = \prod_{m=1}^{M} P(S_1^{(m)} \mid S_{t-1}^{(m)}) \quad (3)$$

Here, $P(S^{(m)}_1 \mid S^{(m)}_{t-1})$ indicates the transition probability that the factor #m is in a state $S^{(m)}_{t-1}$ at the time point t-1 and transitions to a state $S^{(m)}_t$ at the time point t.

The transition probability $P(S^{(m)}_1 \mid S^{(m)}_{t-1})$ is, for example, a matrix (square matrix) of K rows and K columns which has a transition probability that the factor #m transitions from the k-th state #k to the k'-th (where k'=1, 2, ..., and K) state #k' as a k-th row and k'-th column component.

The observation probability $P(Y_t \mid S_t)$ may be calculated according to Math (4).

[Math. 4]

$$P(Y_t \mid S_t) = |C|^{-1/2}(2\pi)^{-D/2}\exp\left\{-\frac{1}{2}(Y_t - \mu_t)'0^{-1}(Y_t - \mu_t)\right\}. \quad (4)$$

Here, the dash (') indicates transposition, and the superscript -1 indicates an inverse number (inverse matrix). Further, |C| indicates an absolute value (determinant) (determinant calculation) of C.

Further, D indicates a dimension of the observation value $Y_t$.

For example, the data acquisition unit 11 in FIG. 3 samples a current corresponding to one cycle (1/50 seconds or 1/60 seconds) with a predetermined sampling interval using zero crossing timing when a voltage is changed from a negative value to a positive value as timing when a phase of a current is 0, and outputs a column vector which has the sampled values as components, as the current waveform $Y_t$ corresponding to one time point.

If the number of samplings where the data acquisition unit 11 samples a current corresponding to one cycle is D, the current waveform $Y_t$ is a column vector of D rows.

According to the observation probability $P(Y_t \mid S_t)$ of Math (4), the observation value $Y_t$ follows the normal distribution where a variance (covariance matrix) is C when an average value (average vector) is $\mu_t$.

The average value $\mu_t$ is, for example, a column vector of D rows which is the same as the current waveform $Y_t$, and the variance C is, for example, a matrix (a matrix of which diagonal components are a variance) of D rows and D columns.

The average value $\mu_t$ is represented by Math (5.1) using the unique waveform $W^{(m)}$ described with reference to FIG. 5.

$$\mu_t = \sum_{m=1}^{M} W^{(m)} S_t^{*(m)} \qquad \text{[Math. 5.1]}$$

[Math.5.2]

$$P(T_t|S_t) = |C|^{-1/2}(2\pi)^{-\Box/2}\mathrm{Exp}\{-\tfrac{1}{2}(\Box-\mu)C(|-\mu)+\lambda [St\ne 0]\} \qquad (5.2)$$

Observation Probability $P(Y_t|S_t)$ may also be calculated according to Math (5.2), where
$[S_t \ne 0]$
is a number of non-zero states (states with non-zero data output) in all factors, and lambda is a positive penalty to observation error. This additional term will control to minimize the number of non-zero states.

Here, if a unique waveform of the state #k of the factor #m is indicated by unique waveform $W^{(m)}{}_k$, a unique waveform $W^{(m)}{}_k$ of the state #k of the factor #m is, for example, a column vector of D rows which is the same as the current waveform $Y_t$.

In addition, the unique waveform $W^{(m)}$ is a collection of the unique waveforms $W^{(m)}{}_1, W^{(m)}{}_2, \ldots,$ and $W^{(m)}{}_K$ of the respective states #1, #2#, $\ldots$, and #K of the factor #m, and is a matrix of D rows and K columns which has a column vector which is the unique waveform $W^{(m)}{}_k$ of the state #k of the factor #m as the k-th component.

In addition, $S^{*(m)}{}_t$ indicates a state of the factor #m which is at the time point t, and, hereinafter, $S^{*(m)}{}_t$ is also referred to as a present state of the factor #m at the time point t. The present state $S^{*(m)}{}_t$ of the factor #m at the time point t is, for example, as shown in Math (6), a column vector of K rows where a component of only one row of K rows is 0, and components of the other rows are 0.

[Math. 6]

$$S_t^{*(m)} = \begin{pmatrix} 0 \\ \vdots \\ 1 \\ \vdots \\ 0 \end{pmatrix} \qquad (6)$$

In a case where a state of the factor #m at the time point t is the state #k, in a column vector $S^{*(m)}{}_t$ of K rows which is the present state $S^{*(m)}{}_t$ at the time point t, only the k-th row component is 1, and the other components are 0.

According to Math (5.1), a sum total of the unique waveform $W^{(m)}{}_k$ of the state #k of each factor #m at the time point t is obtained as the average value
$\mu_t$
of the current waveform $Y_t$ at the time point t.

The model parameters
$\phi$
of the FHMM are the initial state probability $P(S^{(m)}{}_1)$ of Math (2), the transition probability $P(S^{(m)}{}_t | S^{(m)}{}_{t-1})$ of Math (3), the variance C of the Math (4), and the unique waveform $W^{(m)} (=W^{(m)}{}_1, W^{(m)}{}_2, \ldots,$ and $W^{(m)}{}_K)$ of Math (5.1), and the model parameters
$\phi$
of the FHMM are obtained in the model learning unit 14 of FIG. 3.

In other words, the waveform separation learning portion 31 obtains the unique waveform $W^{(m)}$ as a current waveform parameter through the waveform separation learning. In the variance learning portion 32, the variance C is obtained as a variance parameter through the variance learning. The state variation learning portion 33 obtains the initial state probability $P(S^{(m)}{}_1)$ and the transition probability $P(S^{(m)}{}_t | S^{(m)}{}_{t-1})$ as an initial state probability and a state variation parameter through the station variation learning.

Here, as described above, for example, even if operating states of each household electrical appliance are two states of ON and OFF, in a case of representing (a combination of) operating states of twenty household electrical appliances by using a normal HMM, the number of states of HMMs is $2^{20} = 1,048,576$, and the number of transition probabilities is 1,099,511,627,776 which is the square thereof.

On the other hand, according to the FHMM, M household electrical appliances of which operating states are only two states of ON and OFF can be represented by M factors each factor of which has two states. Therefore, since, in each factor, the number of states is two, and the number of transition probabilities is four which is the square thereof, in a case of representing operating states of household electrical appliances (factors) of M=20 using the FHMM, the number (total number) of states of the FHMM is $$40 = 2 \times 20$$

which is small, and the number of transition probabilities is $$80 = 4 \times 20$$

which is also small.

The learning of the FHMM, that is, update of the initial state probability $P(S^{(m)}{}_1)$, the transition probability $P(S^{(m)}{}_t | S^{(m)}{}_{t-1})$, the variance C, and the unique waveform $W^{(m)}$ which are the model parameters
$\phi$
of the FHMM, may be performed, for example, according to an EM (Expectation-Maximization) algorithm as disclosed in the document A.

In the learning of the FHMM using the EM algorithm, a process of the E step and a process of M step are alternately repeated in order to maximize an expected value
$Q(\phi^{new}|\phi)$
of a conditional complete data log likelihood of Math (7).

[Math.7]

$$Q(\phi^{new}|\phi) E\{\log P(\{S_t, Y_t\}|\phi^{new})|\phi, \{S_t, Y_t\}\}. \qquad (7)$$

Here, the expected value
$Q(\phi^{new}|\phi)$
of the conditional complete data log likelihood means an expected value of the log likelihood
$\log(P(\{S_t,Y_t\}|\phi^{new}))$
that the complete data $\{S_t, Y_t\}$ is observed under new model parameters
$\phi^{new}$
in a case where the complete data $\{S_t,Y_t\}$ is observed under the model parameters
$\phi$.

In a process of the E step of the EM algorithm, (a value corresponding to) an expected value
$Q(\phi^{new}|\phi)$
of the conditional complete data log likelihood of Math (7) is obtained, in a process of the M step of the EM algorithm, new model parameters
$\phi^{new}$
for further increasing the expected value
$Q(\phi^{new}|\phi)$ obtained through the process of the E step are obtained, and the model parameters $\phi$ are updated to the new model parameters $\phi^{new}$ (for further increasing the expected value $Q(\phi^{new}|\phi)$).

Figure 6:
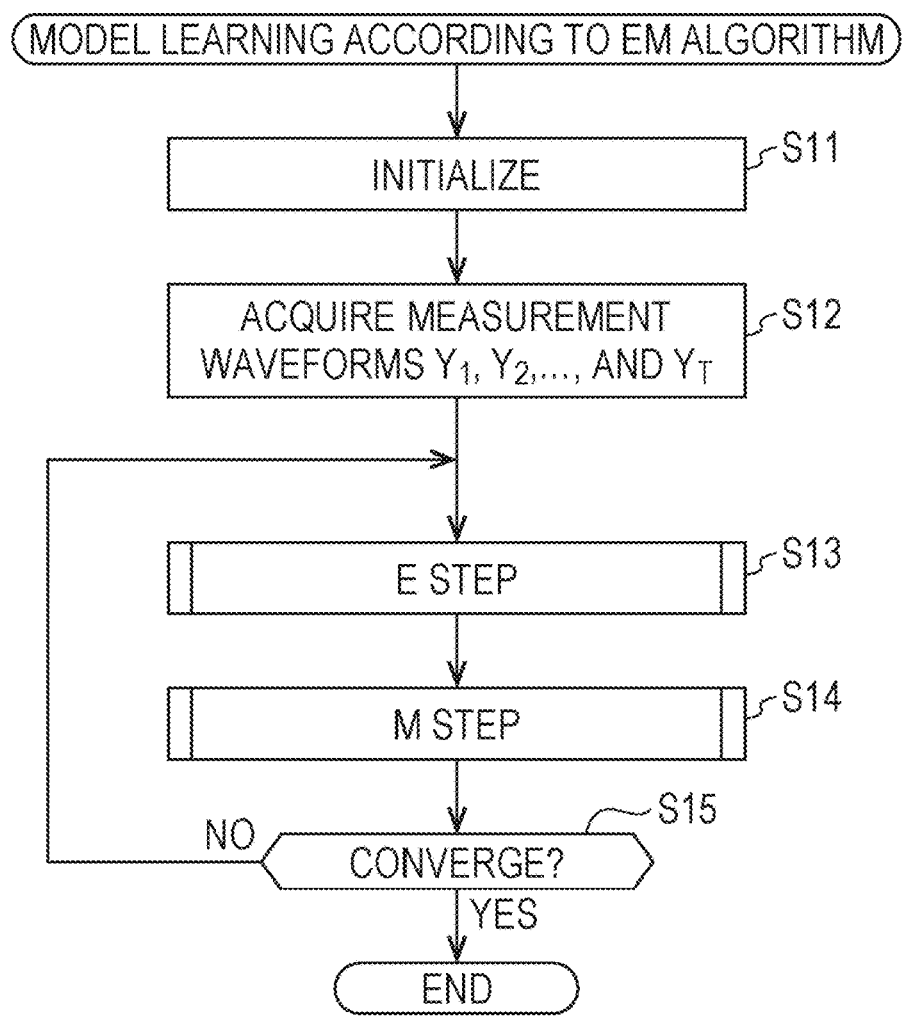
FIG. 6 is a flowchart illustrating a process of learning (learning process) of the FHMM according to an EM algorithm, performed by the monitoring system.

FIG. 6 is a flowchart illustrating a process of learning (learning process) of the FHMM according to the EM algorithm, performed by the monitoring system (FIG. 3).

In step S11, the model learning unit 14 initializes the initial state probability $P(S^{(m)}_1)$, the transition probability $P(S^{(m)}_t|S^{(m)}_{t-1})$, the variance C, and the unique waveform $W^{(m)}$ which are the model parameters $\phi$ of the FHMM stored in the model storage unit 13, and the process proceeds to step S12.

Here, a k-th row component of the column vector of K rows which is the initial state probability $P(S^{(m)}_1)$, that is, a k-th initial state probability $\pi^{(m)}_k$ of the factor #m is initialized to, for example, 1/K.

An i-th row and j-th column component (where i and j=1, 2, ..., and K) of the matrix of K rows and K columns which is the transition probability $P(S^{(m)}_t|S^{(m)}_{t-1})$, that is, the transition probability $P^{(m)}_{i,j}$ that the factor #m transitions from the i-th state #i to the j-th state #j is initialized using random numbers so as to satisfy a Math $P^{(m)}_{i,1}+P^{(m)}_{i,2}+ \ldots +P^{(m)}_{i,K}=1$.

The matrix of D rows and D columns which is the variance C is initialized to, for example, a diagonal matrix of D rows and D columns where diagonal components are set using random numbers and the other components are 0.

A k-th column vector of the matrix of D rows and K columns which is the unique waveform $W^{(m)}$, that is, each component of the column vector of D rows which is the unique waveform $W^{(m)}_k$ of the state #k of the factor #m is initialized using, for example, random numbers.

In step S12, the data acquisition unit 11 acquires current waveforms corresponding to a predetermined time T and supplies current waveforms at the respective time points t=1, 2, ..., and T to the state estimation unit 12 and the model learning unit 14 as measurement waveforms $Y_1, Y_2, \ldots$, and $Y_T$, and the process proceeds to step S13.

Here, the data acquisition unit 11 also acquires voltage waveforms along with the current waveforms at the time points t=1, 2, ..., and T. The data acquisition unit 11 supplies the voltage waveforms at the time points t=1, 2, ..., and T to the data output unit 16.

In the data output unit 16, the voltage waveforms from the data acquisition unit 11 are used to calculate power consumption.

In step S13, the state estimation unit 12 performs the process of the E step using the measurement waveforms $Y_1$ to $Y_T$ from the data acquisition unit 11, and the process proceeds to step S14.

In other words, in step S13, the state estimation unit 12 performs state estimation for obtaining a state probability or the like which is in each state of each factor #m of the FHMM stored in the model storage unit 13 by using the measurement waveforms $Y_1$ to $Y_T$ from the data acquisition unit 11, and supplies an estimation result of the state estimation to the model learning unit 14 and the data output unit 16.

Here, as described with reference to FIG. 5, in the household electrical appliance separation, a state of the factor #m corresponds to an operating state of the household electrical appliance #m corresponding to the factor #m. Therefore, the state probability in the state #k of the factor #m of the FHMM indicates an extent that an operating state of the household electrical appliance #m is the state #k, and thus it can be said that the state estimation for obtaining such a state probability is to obtain (estimate) an operating state of a household electrical appliance.

In step S14, the model learning unit 14 performs the process of the M step using the measurement waveforms $Y_1$ to $Y_T$ from the data acquisition unit 11 and the estimation result of the state estimation from the state estimation unit 12, and the process proceeds to step S15.

In other words, in step S14, the model learning unit 14 performs learning of the FHMM of which each factor has three or more state, stored in the model storage unit 13 by using the measurement waveforms $Y_1$ to $Y_T$ from the data acquisition unit 11 and the estimation result of the state estimation from the state estimation unit 12, thereby updating the initial state probability $\pi^{(m)}_k$, the transition probability $P^{(m)}_{i,j}$, and the variance C, and the unique waveform $W^{(m)}$, which are the model parameters $\phi$ of the FHMM stored in the model storage unit 13.

In step S15, the model learning unit 14 determines whether or not a convergence condition of the model parameters $\phi$ is satisfied.

Here, as the convergence condition of the model parameters $\phi$, for example, a condition in which the processes of the E step and the M step are repeatedly performed a predetermined number of times set in advance, or a condition that a variation amount in the likelihood that the measurement waveforms $Y_1$ to $Y_T$ are observed before update of the model parameters $\phi$ and after update thereof in the FHMM is in a threshold value set in advance, may be employed.

In step S15, if it is determined that the convergence condition of the model parameters $\phi$ is not satisfied, the process returns to step S13, and, thereafter, the same process is repeatedly performed.

Further, if it is determined that the convergence condition of the model parameters $\phi$ is satisfied in step S15, the learning process finishes.

FIG. 7 is a flowchart illustrating a process of the E step performed in step S13 of FIG. 6 by the monitoring system of FIG. 3.

In step S21, the evaluation portion 21 obtains the observation probability $P(Y_t|S_t)$ of Math (4) as an evaluation value E with respect to each combination $S_t$ of states at the time points t={1, 2, ..., and T} by using the variance C of the FHMM as the overall models $\phi$ stored in the model storage unit 13, the unique waveform $W^{(m)}$, and the measurement waveforms $Y_t=\{Y_1, Y_2, \ldots,$ and $Y_T\}$ from the data acquisition unit 11, so as to be supplied to the estimation portion 22, and the process proceeds to step S22.

In step S22, the estimation portion 22 obtains the forward probability
$\alpha_{t,z}$
(ALPHA$_{t,z}$) that the measurement waveforms $Y_1$, $Y_2$, ..., and $Y_t$ are measured and which is in a combination (a combination of a state of the factor #1, a state of the factor #2, ..., and a state of the factor #M at the time point t) z of states at the time point t, by using the observation probability $P(Y_t|S_t)$ from the evaluation portion 21, and the transition probability $P^{(m)}_{i,j}$ (and the initial state probability $\pi^{(m)}$)
of $p^{(m)}$ the FHMM as the overall models
$\phi$
stored in the model storage unit 13, and the process proceeds to step S23.

Here, a method of obtaining a forward probability of an HMM is disclosed in, for example, p. 336 of C. M. Bishop "Pattern Recognition And Machine Learning (II): Statistical Inference based on Bayes Theory", Springer Japan, 2008 (hereinafter, also referred to as a document B).

The forward probability
$\alpha_{t,z}$
may be obtained according to, for example, the recurrence formula $\alpha_{t,z} = \Sigma \alpha_{t-1,w} P(z|w) P(Y_t|z)$ using the forward probability
$\alpha_{t-1,w}$
before one time point.
In the recurrence formula $\alpha_{t,z} = \Sigma \alpha_{t-1,w} P(z|w) P(Y_t|z), \Sigma$ indicates summation taken by changing w to all the combinations of states of the FHMM.
In addition, in the recurrence formula $\alpha_{t,z} = \Sigma \alpha_{t-1,w} P(z|w) P(Y_t|z),$ w indicates a combination of states at the time point t−1 before one time point. P(z|w) indicates the transition probability that a factor is in the combination w of states at the time point t−1 and transitions to the combination z of states at the time point t. $P(Y_t|z)$ indicates the observation probability that the measurement waveform $Y_t$ is observed in the combination z of states at the time point t.

In addition, as an initial value of the forward probability $\alpha_{t,z}$,
that is, the forward probability
$\alpha_{1,z}$
at the time point t=1, a product of the initial state probability
$\pi^{(m)}_k$
of the state #k of each factor #m forming the combination z of states.

In step S23, the estimation portion 22 obtains the backward probability
$\beta_{t,z}$
(BETA$_{t,z}$) which is in the combination z of states at the time point t and, thereafter, that the measurement waveforms $Y_t, Y_{t+1}, \ldots,$ and $Y_T$ are observed, by using the observation probability $P(Y_t|S_t)$ from the evaluation portion 21, and the transition probability $P^{(m)}_{i,j}$ of the FHMM as the overall models
$\phi$
stored in the model storage unit 13, and the process proceeds to step S24.

Here, a method of obtaining the backward probability of an HMM is disclosed, for example, in page 336 of the above-described document B.

The backward probability
$\beta_{t,z}$
may be obtained according to the recurrence formula $\beta_{t,z} = \Sigma P(Y_t|z) P(z|w) \beta_{t+1,w}$ using the forward probability
$\beta_{t+1,w}$
after one time point.
In the recurrence formula $\beta_{t,z} = \Sigma P(Y_t|z) P(z|w) \beta_{t+1,w}, \Sigma$ indicates summation taken by changing w to all the combinations of states of the FHMM.
Further, in the recurrence formula $\beta_{t,z} = \Sigma P(Y_t|z) P(z|w) \beta_{t+1,w}, w$ indicates a combination of states at the time point t+1 after one time point. P(z|w) indicates the transition probability that a factor is in the combination z of states at the time point t and transitions to the combination w of states at the time point t+1. $P(Y_t|z)$ indicates the observation probability that the measurement waveform $Y_t$ is observed in the combination z of states at the time point t.

In addition, as an initial value of the backward probability $\beta_{t,z}$,
that is, the backward probability
$\beta_{t,z}$
at the time point t=T, 1 is employed.

In step S24, the estimation portion 22 obtains a posterior probability
$\gamma_{t,z}$
which is in the combination z of states at the time point t in the FHMM as the overall models
$\phi$
according to Math (8) by using the forward probability
$\alpha_{t,z}$
and the backward probability
$\beta_{t,z}$,
and process proceeds to step S25.

[Math. 8]

$$\gamma_{t,z} = \frac{\alpha_{t,z} \beta_{t,z}}{\sum_{w \in S_t} \alpha_{t,w} \beta_{t,w}} \quad (8)$$

Here,
$\Sigma$
of the denominator of the right side of Math (8) indicates summation taken by changing w to all the combinations $S_t$ of states which can be taken at the time point t.

According to Math (8), the posterior probability
$\gamma_{t,z}$
is obtained by normalizing a product
$\alpha_{t,z} \beta_{t,z}$
of the forward probability
$\alpha_{t,z}$
and the backward probability
$\beta_{t,z}$
with a sum total
$\Sigma \alpha_{t,w} \beta_{t,z}$
of the product
$\alpha_{t,w} \beta_{t,w}$
for combinations
$w \in S_t$
of states which can be taken by the FHMM.

In step S25, the estimation portion 22 obtains the posterior probability $<S^{(m)}_t>$ that the factor #m is in the state $S^{(m)}_t$ at the time point t and the posterior probability $<S^{(m)}_t S^{(n)}_t>$ that the factor #m is in the state $S^{(m)}_t$ and another factor #n is in the state $S^{(n)}_t$ at the time point t, by using the posterior probability $\gamma_{t,z}$, and the process proceeds to step S26.

Here, the posterior probability $<S^{(m)}_t>$ may be obtained according to Math (9).

[Math. 9]

$$\langle S_t^{(m)} \rangle = \sum_{z \in S_t^{(n)}(n \neq m)} \gamma_{t,z} \quad (9)$$

According to Math (9), the posterior probability $<S^{(m)}_t>$ that the factor #m is in the state $S^{(m)}_t$ at the time point t is obtained by marginalizing the posterior probability $\gamma_{t,z}$ in the combination z of state at the time point t with respect to the combination z of states which does not include states of the factor #m.

In addition, the posterior probability $<S^{(m)}_t>$ is, for example, a column vector of K rows which has a state probability (posterior probability) that the factor #m is in the k-th state of K states thereof at the time point t as a k-th row component.

The posterior probability $<S^{(m)}_t S^{(n)}_t>$ may be obtained according to Math (10).

[Math. 10]

$$\langle S_t^{(m)} S_t^{(n)'} \rangle = \sum_{z \in S_t^{(n)}(r \neq m \wedge r \neq n)} \gamma_{t,z} \quad (10)$$

According to Math (10), the posterior probability $<S^{(m)}_t S^{(n)}_t>$ that the factor #m is in the state $S^{(m)}_t$ and another factor #n is in the state $S^{(n)}_t$ at the time point t is obtained by marginalizing the posterior probability $\gamma_{t,z}$ in the combination z of states at the time point t with respect to the combination z of state which does not include any of states of the factor #m and states of the factor #n.

In addition, the posterior probability $<S^{(m)}_t S^{(n)}_t>$ is, for example, a matrix of K rows and K columns which has a state probability (posterior probability) in the state #k of the factor #m and the state #k' of another factor #n as a k-th row and k'-th column component.

In step S26, the estimation portion 22 obtains the posterior probability $<S^{(m)}_{t-1} S^{(m)}_t>$ that the factor #m is in the state $S^{(m)}_{t-1}$ at the time point t−1 and is in the state $S^{(m)}_t$ at the nex time point t, by using the forward probability $\alpha_{t,z}$, the backward probability $\beta_{t,z}$, the transition probability P(z|w), and the observation probability $P(Y_t|S_t)$ from the evaluation portion 21.

In addition, the estimation portion 22 supplies the posterior probabilities $<S^{(m)}_t>$, $<S^{(m)}_t S^{(n)}_t>$ and $<S^{(m)}_{t-1} S^{(m)}_t>$ to the model learning unit 14, the label acquisition unit 15, and the data output unit 16 as an estimation result of the state estimation, and returns from the process of the E step.

Here, the posterior probability $<S^{(m)}_{t-1} S^{(m)}_t>$ may be obtained according to Math (11).

[Math. 11]

$$\langle S_{t-1}^{(m)} S_t^{(m)'} \rangle = \frac{\sum_{w=S_{t-1}^{(n)}, z \in S_t^{(1)}(n \neq m \wedge r \neq m)} \alpha_{t-1,w} P(z|w) P(Y_t|z) \beta_{t,z}}{\sum_{w=S_{t-1}, z \in S_t} \alpha_{t-1,w} P(z|w) P(Y_t|z) \beta_{t,z}} \quad (11)$$

In calculation of the posterior probability $<S^{(m)}_{t-1} S^{(m)}_t>$ of Math (11), the transition probability P(z|w) that a factor transitions from the combination w of states to the combination z of states is obtained as a product $P^{(1)}_{i(1),j(1)} \times P^{(2)}_{i(2),j(2)} \times \ldots \times P^{(M)}_{i(M),j(M)}$ of the transition probability $P^{(1)}_{i(1),j(1)}$ from the state #i(1) of the factor #1 forming the combination w of states to the state #j(1) of the factor #1 forming the combination z of states, the transition probability $P^{(2)}_{i(2),j(2)}$ from the state #i(2) of the factor #2 forming the combination w of states to the state #j(2) of the factor #2 forming the combination z of states, ..., and the transition probability $P^{(M)}_{i(M),j(M)}$ from the state #i(M) of the factor #M forming the combination w of states to the state #j(M) of the factor #M forming the combination z of states, according to Math (3).

In addition, the posterior probability $<S^{(m)}_{t-1} S^{(m)}_t>$ is, for example, a matrix of K rows and K columns which has a state probability (posterior probability) that the factor #m is in the state #i at the time point t−1, and is in the state j at the next time point t as an i-th row and j-th column component.

Figure 8:
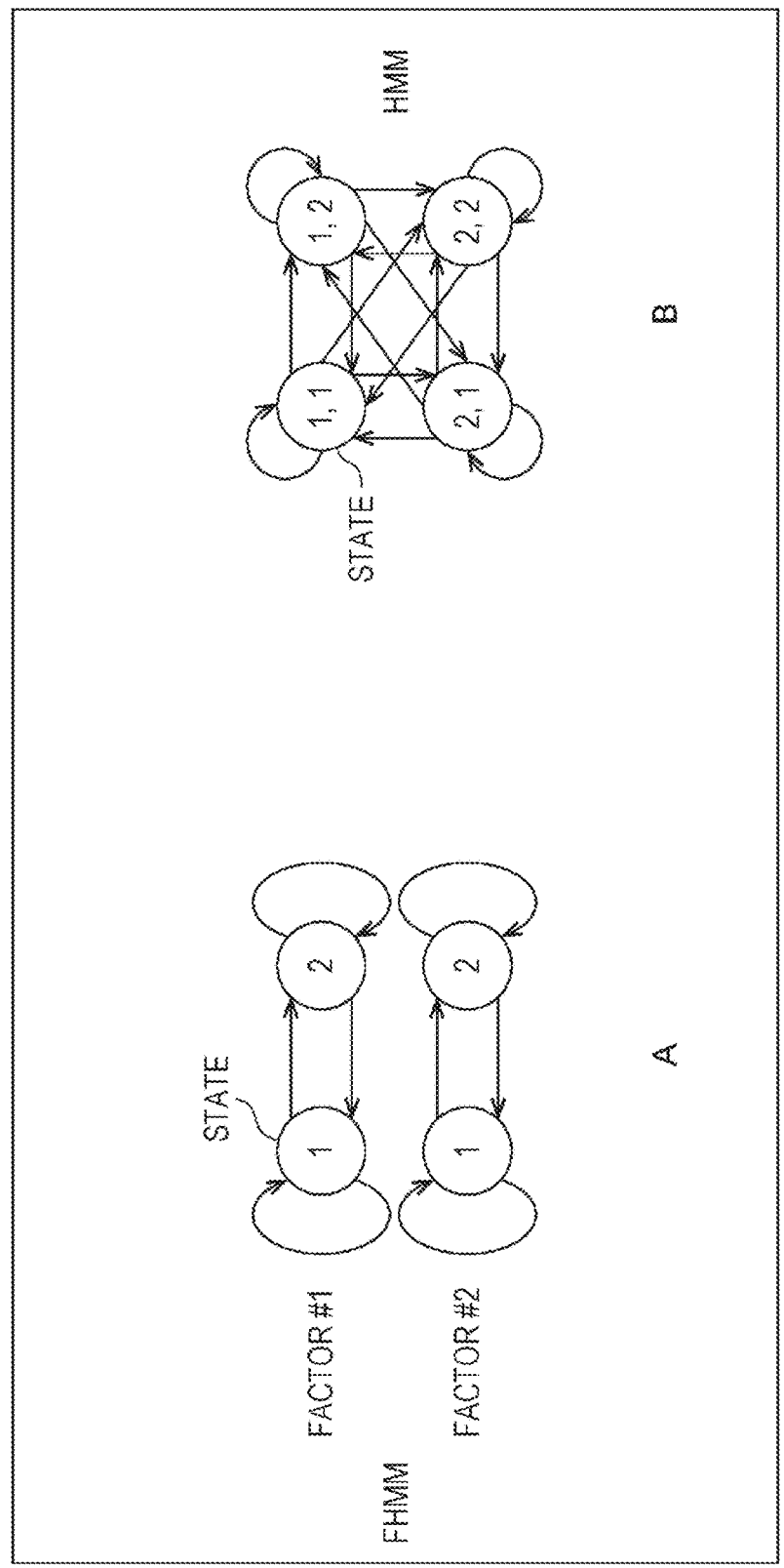
FIG. 8 is a diagram illustrating relationships between the forward probability $\text{ALPHA}_{t,z}$ and the backward probability $\text{BETA}_{t,z}$ of the FHMM, and forward probability $\text{ALPHA}_{t,i}$ and the backward probability $\text{BETA}_{t,j}$ of the HMM.

FIG. 8 is a diagram illustrating a relationship between the forward probability $\alpha_{t,z}$ and the backward probability $\beta_{t,z}$ of the FHMM, and the forward probability $\alpha_{t,i}$ (ALPHA$_{t,i}$) and the backward probability $\beta_{t,j}$ (BETA$_{t,j}$) of a (normal) HMM.

In relation to the FHMM, an HMM equivalent to the FHMM can be configured.

An HMM equivalent to a certain FHMM has states corresponding to the combination z of states of respective factors of the FHMM.

In addition, the forward probability $\alpha_{t,z}$ and the backward probability $\beta_{t,z}$ of the FHMM conform to the forward probability $\alpha_{t,i}$ and the backward probability $\beta_{t,i}$ of the HMM equivalent to the FHMM.

A of FIG. 8 shows an FHMM including the factors #1 and #2 each of which has two states #1 and #2.

In the FHMM of A of FIG. 8, as a combination z=[k,k'] of the state #k of the factor #1 and the state #k' of the factor #2, there are four combinations, a combination [1,1] of the state #1 of the factor #1 and the state #1 of the factor #2, a combination [1,2] of the state #1 of the factor #1 and the state #2 of the factor #2, a combination [2,1] of the state #2 of the factor #1 and the state #1 of the factor #2, and a combination [2,2] of the state #2 of the factor #1 and the state #2 of the factor #2.

B of FIG. 8 shows an HMM equivalent to the FHMM of A of FIG. 8.

The HMM of B of FIG. 8 has four states #(1,1), #(1,2) #(2,1) #(2,2) which respectively correspond to the four combinations [1,1], [1,2], [2,1], and [2,2] of the states of the FHMM of A of FIG. 8.

In addition, the forward probability $$\alpha_{t,z} = \{\alpha_{t,[1,1]}, \alpha_{t,[1,2]}, \alpha_{t,[2,1]}, \alpha_{t,[2,2]}\}$$

of the FHMM of A of FIG. 8 conforms to the forward probability $$\alpha_{t,i} = \{\alpha_{t,[1,1]}, \alpha_{t,[1,2]}, \alpha_{t,[2,1]}, \alpha_{t,[2,2]}\}$$

of the HMM of B of FIG. 8.

Similarly, the backward probability $$\beta_{t,z} = \{\beta_{t,[1,1]}, \beta_{t,[1,2]}, \beta_{t,[2,1]}, \beta_{t,[2,2]}\}$$

of the FHMM of A of FIG. 8 conforms the forward probability $$\beta_{t,i} = \{\beta_{t,[1,1]}, \beta_{t,[1,2]}, \beta_{t,[2,1]}, \beta_{t,[2,2]}\}$$

of the HMM of B of FIG. 8.

For example, the denominator of the right side of the above-described Math (8), that is, the sum total $\Sigma \alpha_{t,w} \beta_{t,w}$ of the product $\alpha_{t,w} \beta_{t,w}$ for combinations $w \in S_t$ of states which can be taken by the FHMM is indicated by the Math $$\Sigma \alpha_{t,w} \beta_{t,w} = \alpha_{t,[1,1]} \beta_{t,[1,1]} + \alpha_{t,[1,2]} \beta_{t,[1,2]} + \alpha_{t,[2,1]} \beta_{t,[2,1]} + \beta_{t,[2,2]} \beta_{t,[2,2]}$$

for the FHMM of A of FIG. 8.

Figure 9:
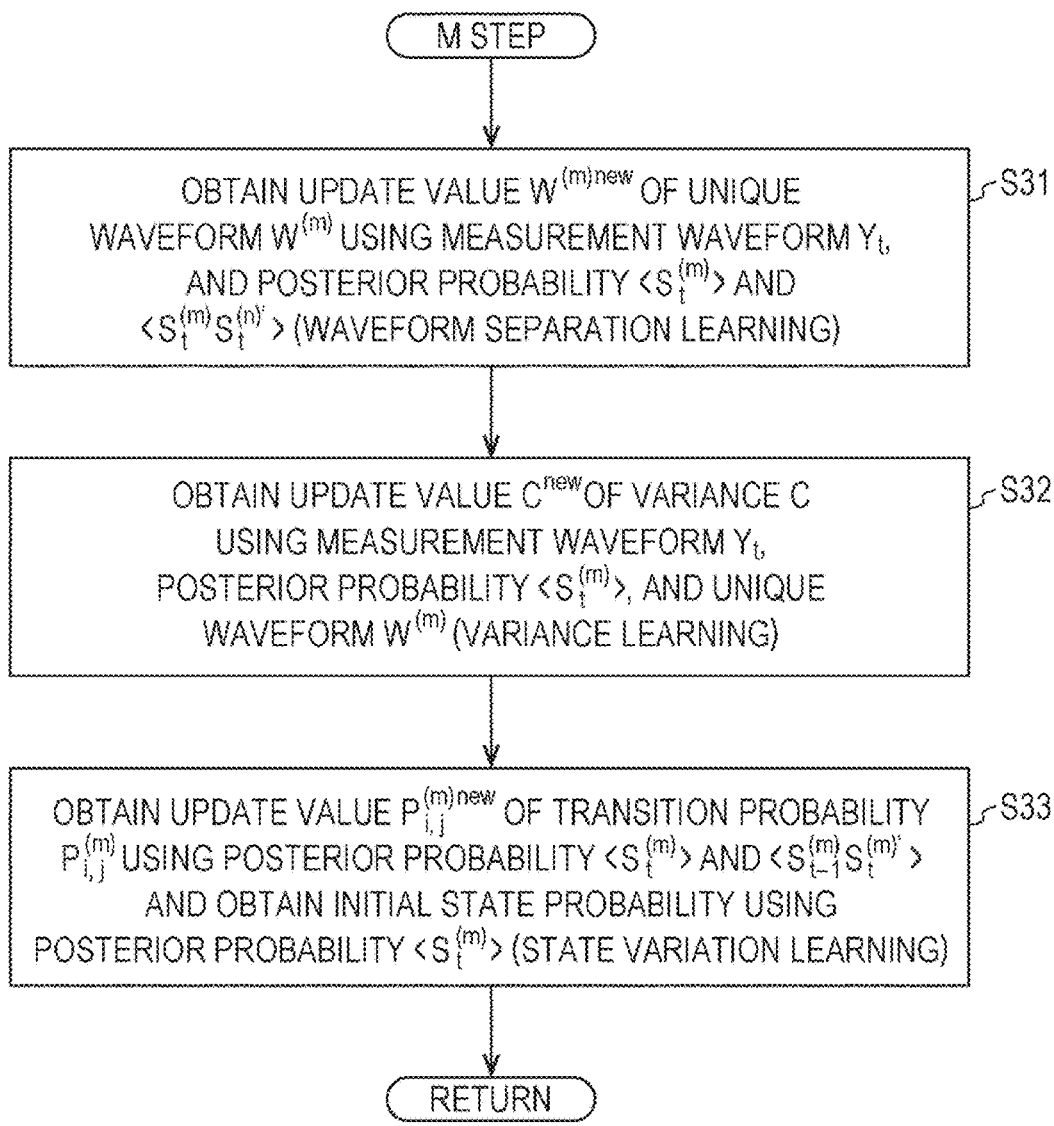
FIG. 9 is a flowchart illustrating a process of the M step performed in step S14 by the monitoring system.

FIG. 9 is a flowchart illustrating a process of the M step performed in step S14 of FIG. 6 by the monitoring system of FIG. 3.

In step S31, the waveform separation learning portion 31 performs the waveform separation learning by using the measurement waveform $Y_t$ from the data acquisition unit 11, and the posterior probabilities $<S^{(m)}_t>$ and $<S^{(m)}_t S^{(m)}_t>$ from the estimation portion 22, so as to obtain an update value $W^{(m)new}$ of the unique waveform $W^{(m)}$, and updates the unique waveform $W^{(m)}$ stored in the model storage unit 13 to the update value $W^{(m)new}$, and the process proceeds to step S32.

In other words, the waveform separation learning portion 31 calculates Math (12) as the waveform separation learning, thereby obtaining the update value $W^{(m)new}$ of the unique waveform $W^{(m)}$.

[Math. 12]

$$W^{new} = \left(\sum_{t=1}^{T} Y_t \langle S'_t \rangle\right)\left(\sum_{t=1}^{T} \langle S_t S'_t \rangle\right)^* \quad (12)$$

Here, $W^{new}$ is a matrix of D rows and K×M columns in which the update value $W^{(m)new}$ of the unique waveform $W^{(m)}$ of the factor #m which is a matrix of D rows and K columns is arranged in order of the factor (index thereof) #m from the left to the right. A column vector of (m−1)K+k columns of the unique waveform (update value thereof) $W^{new}$ which is a matrix of D rows and K×M columns is a unique waveform $W^{(m)}_k$ (update value thereof) of the state #k of the factor #m.

$<S'_t>$ is a row vector of K×M columns obtained by transposing a column vector of K×M rows in which the posterior probability $<S^{(m)}_t>$ which is a column vector of K rows is arranged in order of the factor #m from the top to the bottom. A ((m−1)K+k)-th column component of the posterior probability $<S'_t>$ which is the row vector of K×M columns is a state probability which is in the state #k of the factor #m at the time point t.

$<S_t S'_t>$ is a matrix of K×M rows and K×M columns in which the posterior probability $<S^{(m)}_t S^{(n)}_t>$ which is a matrix of K rows and K columns is arranged in order of the factor #m from the top to the bottom and is arranged in order of the factor #n from the left to the right. A ((m−1)K+k)-th row and ((n−1)K+k')-th column component of the posterior probability $<S_t S'_t>$ which is a matrix of K×M rows and K×M columns is a state probability which is in is in the state #k of the factor #m and is in the state #k' of another factor #n at the time point t.

The superior asterisk (*) indicates an inverse matrix or a pseudo-inverse matrix.

According to the waveform separation learning for calculating Math (12), the measurement waveform $Y_t$ is separated into a unique waveform $W^{(m)}$ such that an error between the measurement waveform $Y_t$ and the average value $$\mu_t = \Sigma W^{(m)} S^{*(m)}_t),$$

of Math (5.1) becomes as small as possible.

In step S32, the variance learning portion 32 performs the variance learning by using the measurement waveform $Y_t$ from the data acquisition unit 11, the posterior probability $<S^{(m)}_t>$ from the estimation portion 22, and the unique waveform $W^{(m)}$ stored in the model storage unit 13, so as to obtain an update value $C^{new}$ of the variance C, and updates the variance C stored in the model storage unit 13, and the process proceeds to step S33.

In other words, the variance learning portion 32 calculates Math (13) as the variance learning, thereby obtaining the update value $C^{new}$ of the variance C.

[Math. 13]

$$C^{new} = \frac{1}{T}\sum_{t=1}^{T} Y_t Y'_t - \frac{1}{T}\sum_{t=1}^{T}\sum_{m=1}^{M} W^{(m)} \langle S^{(m)}_t \rangle Y'_t \quad (13)$$

In step S33, the state variation learning portion 33 performs the station variation learning by using the posterior probabilities $<S^{(m)}_t>$ and $<S^{(m)}_t S^{(m)}_t>$ from the estimation portion 22 so as to obtain an update value $P^{(m)\,new}_{i,j}$ of the transition probability $P^{(m)}_{i,j}$ and an update value $\pi^{(m)new}$ of the initial state probability $\pi^{(m)}$, and updates the transition probability $P^{(m)}_{i,j}$ and the initial state probability
$\pi^{(m)}$
stored in the model storage unit 13 to the update value $P^{(m)\ new}_{i,j}$ of the update value
$\pi^{(m)new}$,
and the process returns from the process of the M step.

In other words, the state variation learning portion 33 calculates Math (14) and (15) as the state variation learning, thereby obtaining the update value $P^{(m)\ new}_{i,j}$ of the transition probability $P^{(m)}_{i,j}$ and the update value
$\pi^{(m)new}$
of the initial state probability
$\pi^{(m)}$.

[Math. 14]

$$P^{(m)new}_{i,j} = \frac{\sum_{t=2}^{T} \langle S^{(m)}_{t-1,i}, S^{(m)}_{t,j} \rangle}{\sum_{t=2}^{T} \langle S^{(m)}_{t-1,i} \rangle} \tag{14}$$

[Math. 15]

$$\pi^{(m)new} = \langle S^{(m)}_1 \rangle \tag{15}$$

Here, $\langle S^{(m)}_{t-1,i} S^{(m)}_{t,j} \rangle$ is an i-th row and j-th column component of the posterior probability $\langle S^{(m)}_{t-1} S^{(m)}_{t}{}' \rangle$ which is a matrix of K rows and K columns, and indicates a state probability that the factor #m is in the state #i at the time point t−1 and is in the state #j at the next time point t.

$\langle S^{(m)}_{t-1,i} \rangle$ is an i-th row component of the posterior probability $\langle S^{(m)}_{t-1} \rangle$ which is a column vector of K rows, and indicates a state probability that the factor #m is in the state #i at the time point t−1.

$\pi^{(m)}(\pi^{(m)new})$
is a column vector of K rows which has (the update value $\pi^{(m)\ new}_{k}$ of)
the initial state probability
$\pi^{(m)}_{k}$
of the state #k of the factor #m as a k-th row component.

Figure 10:
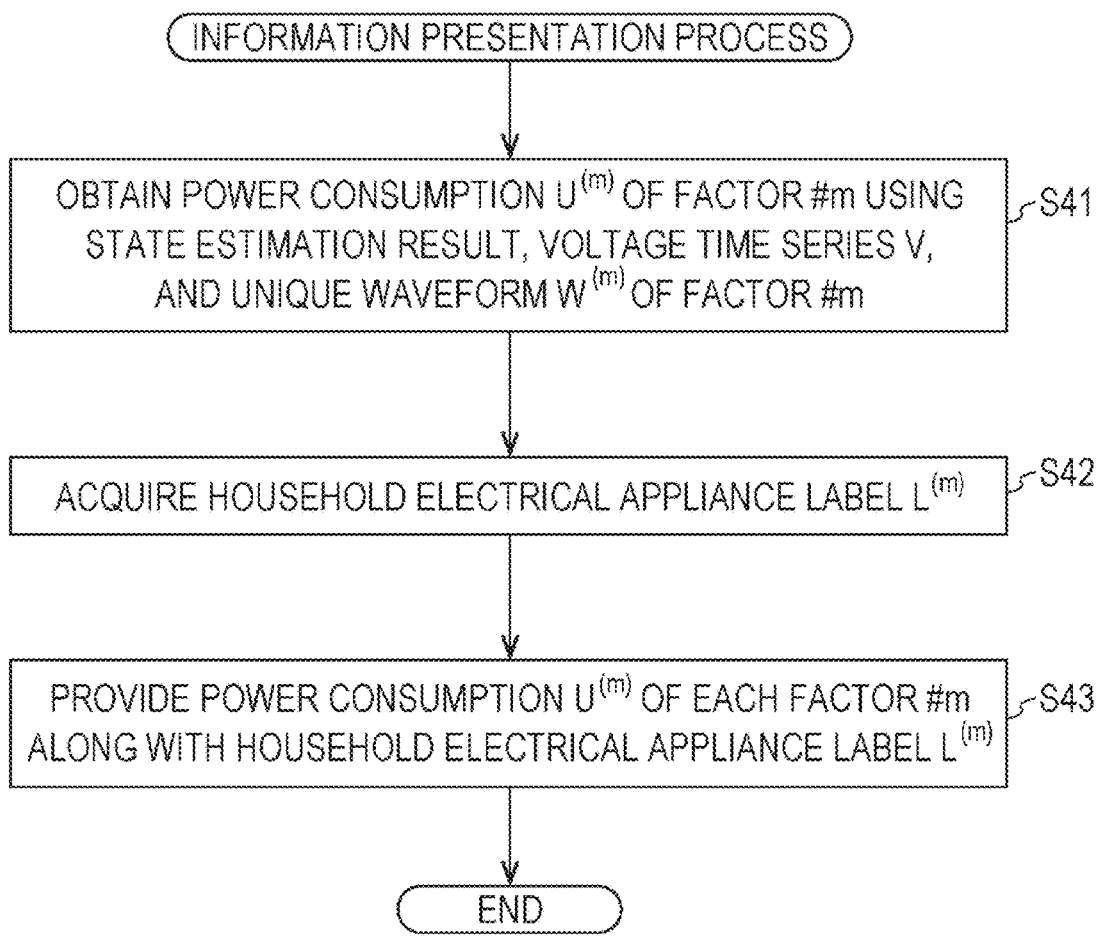
FIG. 10 is a flowchart illustrating an information presenting process of presenting information on a household electrical appliance #m, performed by the monitoring system.

FIG. 10 is a flowchart illustrating an information presenting process of presenting information on a household electrical appliance #m, performed by the monitoring system (FIG. 3).

In step S41, the data output unit 16 obtains power consumption $U^{(m)}$ of each factor #m by using the voltage waveform (a voltage waveform corresponding to the measurement waveform $Y_t$ which is a current waveform) $V_t$ from the data acquisition unit 11, the posterior probability $\langle S^{(m)}_t \rangle$ which is the estimation result of the state estimation from the state estimation unit 12, and the unique waveform $W^{(m)}$ stored in the model storage unit 13, and the process proceeds to step S42.

Here, the data output unit 16 obtains the power consumption $U_{(m)}$ of the household electrical appliance #m corresponding to the factor #m at the time point t by using the voltage waveform $V_t$ at the time point t and the current consumption $A_t$ of the household electrical appliance #m corresponding to the factor #m at the time point t.

In the data output unit 16, the current consumption $A_t$ of the household electrical appliance #m corresponding to the factor #m at the time point t may be obtained as follows.

That is to say, for example, in the factor #m, the data output unit 16 obtains the unique waveform $W^{(m)}$ of the state #k where the posterior probability $\langle S^{(m)}_t \rangle$ is the maximum, as the current consumption $A_t$ of the household electrical appliance #m corresponding to the factor #m at the time point t.

In addition, the data output unit 16 obtains weighted addition values of the unique waveforms $W^{(m)}_1$, $W^{(m)}_2$, ..., and $W^{(m)}_K$ of each state of the factor #m using the state probability of each state of the factor #m at the time point t which is a component of the posterior probability $\langle S^{(m)}_t \rangle$ which is a column vector of K columns as a weight, as the current consumption $A_t$ of the household electrical appliance #m corresponding to the factor #m at the time point t.

In addition, if the learning of the FHMM progresses, and the factor #m becomes a household electrical appliance model which appropriately represents the household electrical appliance #m, in relation to the state probability of each state of the factor #m at the time point t, the state probability of a state corresponding to an operating state of the household electrical appliance #m at the time point t becomes nearly 1, and the state probabilities of the remaining (K−1) states become nearly 0.

As a result, in the factor #m, the unique waveform $W^{(m)}$ of the state #k where the posterior probability $\langle S^{(m)}_t \rangle$ is the maximum is substantially the same as the weighted addition values of the unique waveforms $W^{(m)}_1$, $W^{(m)}_2$, ..., and $W^{(m)}_K$ of each state of the factor #m using the state probability of each state of the factor #m at the time point t as a weight.

In step S42, the label acquisition unit 15 acquires a household electrical appliance label $L^{(m)}$ for identifying a household electrical appliance #m indicated by each household electrical appliance model #m, that is, a household electrical appliance #m corresponding to each factor #m of the FHMM, so as to be supplied to the data output unit 16, and, the process proceeds to step S43.

Here, the label acquisition unit 15 may display, for example, the current consumption $A_t$ or the power consumption $U^{(m)}$ of the household electrical appliance #m corresponding to each factor #m, obtained in the data output unit 16, and a use time slot of the household electrical appliance #m recognized from the power consumption $U^{(m)}$, receive the name of a household electrical appliance matching the current consumption $A_t$ or the power consumption $U^{(m)}$, and the use time slot from a user, and acquire the name of the household electrical appliance input by the user as the household electrical appliance label $L^{(m)}$.

Further, the label acquisition unit 15 may prepare for a database in which, with respect to various household electrical appliances, attributes such as power consumption thereof, a current waveform (current consumption), and a use time slot are registered in correlation with names of the household electrical appliances in advance, and acquire the name of a household electrical appliance correlated with the current consumption $A_t$ or the power consumption $U^{(m)}$ of the household electrical appliance #m corresponding to each factor #m, obtained in the data output unit 16, and a use time slot of the household electrical appliance #m recognized from the power consumption $U^{(m)}$, as the household electrical appliance label $L^{(m)}$.

In addition, in the label acquisition unit 15, in relation to the factor #m corresponding to the household electrical appliance #m of which the household electrical appliance label $L^{(m)}$ has already been acquired and supplied to the data output unit 16, the process in step S42 may be skipped.

In step S43, the data output unit 16 displays the power consumption $U^{(m)}$ of each factor #m on a display (not shown) along with the household electrical appliance label $L^{(m)}$ of each factor #m so as to be presented to a user, and the information presenting process finishes.

Figure 11:
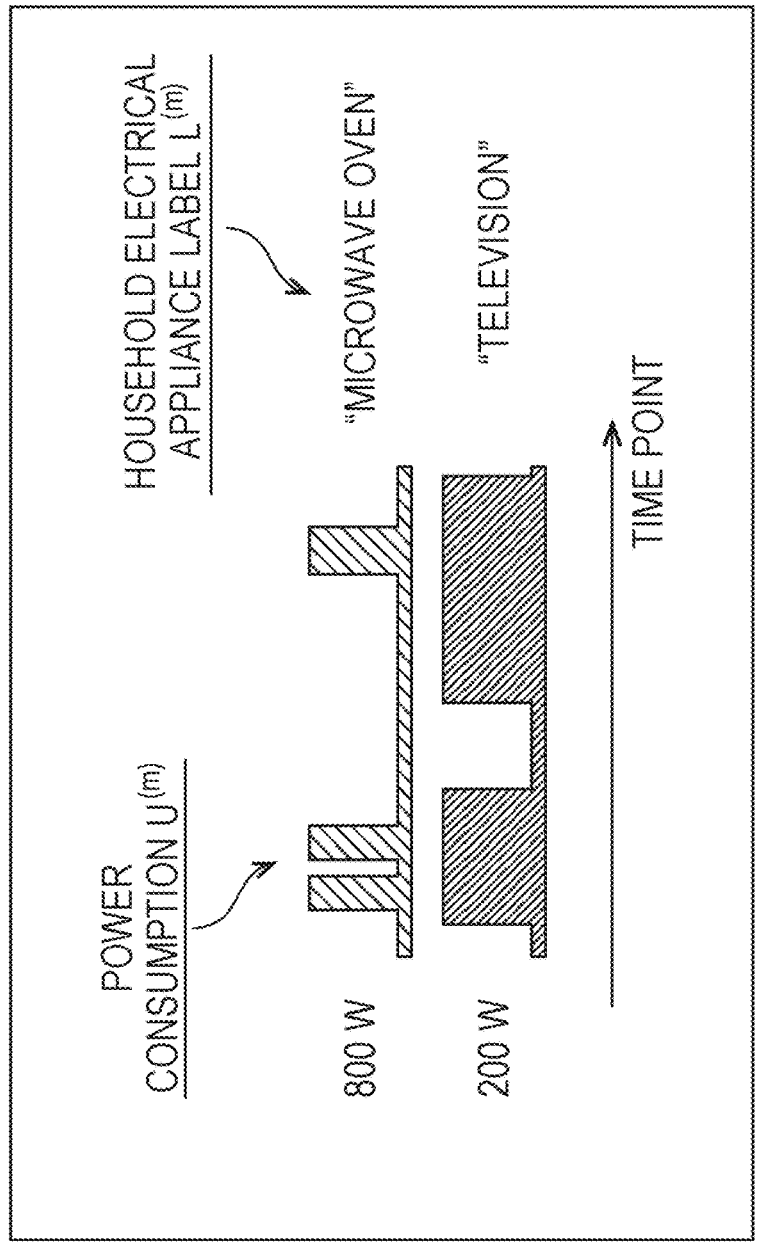
FIG. 11 is a diagram illustrating a display example of the power consumption $U^{(m)}$ performed in the information presenting process.

FIG. 11 is a diagram is a diagram illustrating a display example of the power consumption $U^{(m)}$, performed in the information presenting process of FIG. 10.

The data output unit 16 displays, for example, as shown in FIG. 11, a time series of the power consumption $U^{(m)}$ of the household electrical appliance #m corresponding to each factor #m on a display (not shown) along with the household electrical appliance label $L^{(m)}$ such as the name of the household electrical appliance #m.

As described above, the monitoring system performs learning of the FHMM for modeling an operating state of each household electrical appliance using the FHMM of which each factor has three or more states, and thus it is possible to obtain accurate power consumption or the like with respect to a variable load household electrical appliance such as an air conditioner of which power (current) consumption varies depending on modes, settings, or the like.

In addition, since, in the monitoring system, a sum total of current consumed by each household electrical appliance in a household is measured in a location such as a distribution board, and thereby power consumption of each household electrical appliance in the household can be obtained, it is possible to easily realize "visualization" of power consumption of each household electrical appliance in the household in terms of both costs and efforts as compared with a case of installing a smart tap in each outlet.

In addition, by the "visualization" of power consumption of each household electrical appliance in a household, for example, it is possible to raise the awareness of power saving in the household.

Further, power consumption of each household electrical appliance in a household obtained by the monitoring system is collected by, for example, a server, and, a use time slot of the household electrical appliance, and further a life pattern may be estimated from the power consumption of the household electrical appliances of each household and be helpful in marketing and the like.

Second Embodiment of Monitoring System to which Present Technology is Applied

Figure 12:
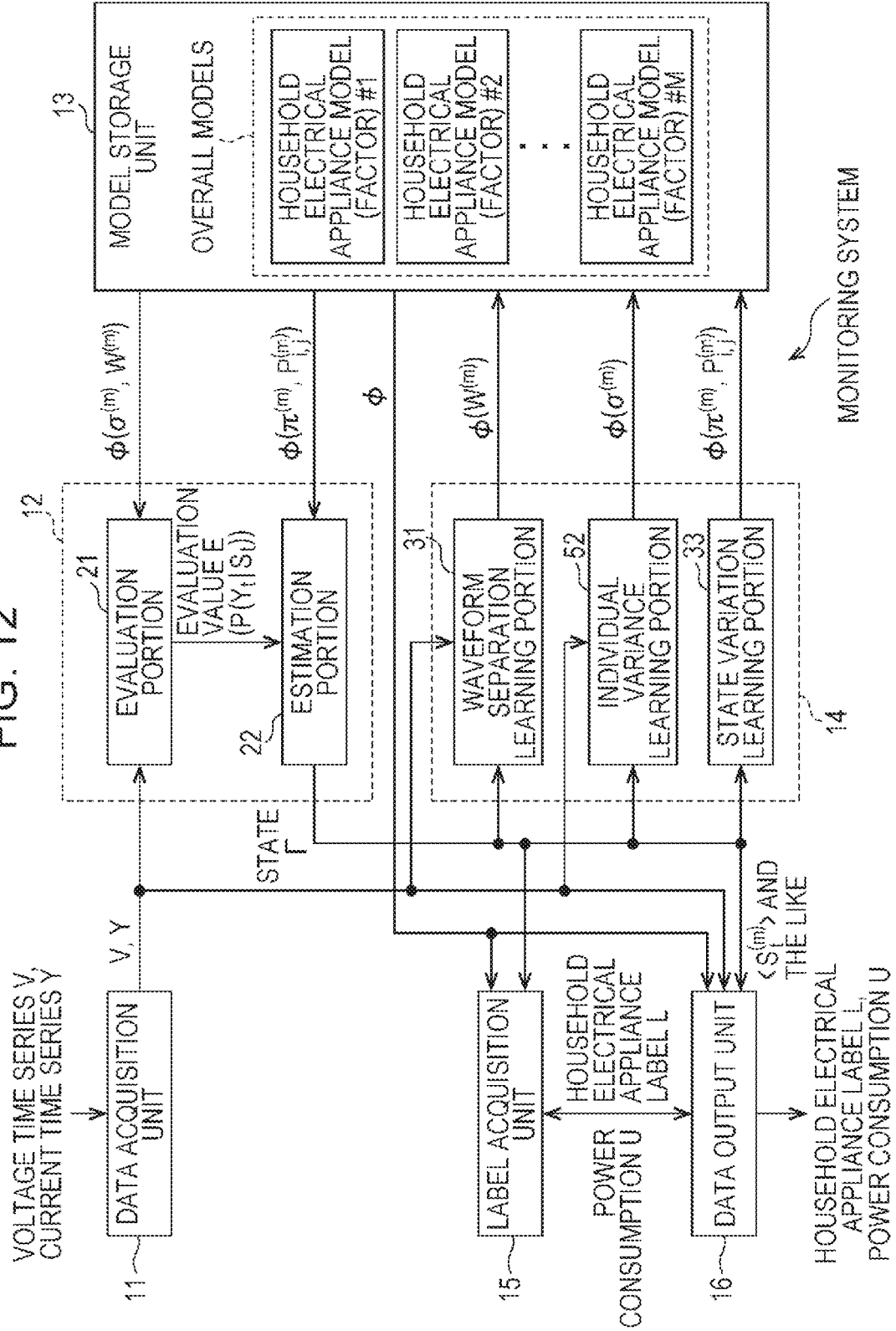
FIG. 12 is a block diagram illustrating a configuration example of the second embodiment of the monitoring system to which the present technology is applied.

FIG. 12 is a block diagram illustrating a configuration example of the second embodiment of the monitoring system to which the present technology is applied.

In addition, in the figure, portions corresponding to the case of FIG. 3 are given the same reference numerals, and, hereinafter, description thereof will be appropriately omitted.

The monitoring system of FIG. 12 is common to the monitoring system of FIG. 3 in that the data acquisition unit 11 to the data output unit 16 are provided.

However, the monitoring system of FIG. 12 is different from the monitoring system of FIG. 3 in that an individual variance learning portion 52 is provided instead of the variance learning portion 32 of the model learning unit 14.

In the variance learning portion 32 of FIG. 3, a single variance C is obtained for the FHMM as overall models in the variance learning, but, in the individual variance learning portion 52 of FIG. 12, an individual variance $\sigma^{(m)}$ is obtained for the FHMM as overall models in the variance learning for each factor #m or for each state #k of each factor #m.

Here, in a case where the individual variance $\sigma^{(m)}$ is an individual variance for each state #k of each factor #m, the individual variance $\sigma^{(m)}$ is, for example, a row vector of K columns which has a variance $\sigma^{(m)}_k$ of the state #k of the factor #m as a k-th column component.

In addition, hereinafter, for simplicity of description, in a case where the individual variance $\sigma^{(m)}$ is an individual variance for each factor #m, all the components $\sigma^{(m)}_1, \sigma^{(m)}_2, \ldots$, and $\sigma^{(m)}_K$ of the row vector of K columns which is the individual variance $\sigma^{(m)}$ are set to the same value (the same scalar value as a variance for the factor #m, or a (covariance) matrix) common to the factor #m, and thereby the individual variance $\sigma^{(m)}$ which is separate for each factor #m is treated to be the same as the individual variance $\sigma^{(m)}$ which is separate for each state #k of each factor #m.

The variance $\sigma^{(m)}_K$ of the state #k of the factor #m which is a k-th column component of the row vector of K columns which is the individual variance $\sigma^{(m)}$ is a scalar value which is a variance, or a matrix of D rows and D columns which is a covariance matrix.

In a case where the individual variance $\sigma^{(m)}$ is obtained in the individual variance learning portion 52, the evaluation portion 21 obtains the observation probability $P(Y_t|S_t)$ according to Math (16) instead of Math (4) by using the individual variance $\sigma^{(m)}$.

[Math. 16]

$$P(Y_t|S_t) = |\Sigma_t|^{-1/2} (2\pi)^{-D/2} \exp\left\{-\frac{1}{2}(Y_t - \mu_t)' \Sigma_t^{-1} (Y_t - \mu_t)\right\}. \quad (16)$$

Here, $\Sigma t$ of Math (16) may be obtained according to Math (17).

[Math. 17]

$$\Sigma_t = \sum_{m=1}^{M} \sigma^{(m)} S_t^{*(m)} \quad (17)$$

$S^{*(m)}_t$ indicates a state of the factor #m at the time point t as shown in Math (6), and, is a column vector of K rows where a component of only one row of K rows is 0, and components of the other components are 0.

In the individual variance learning portion 52, the individual variance
$$\sigma^{(m)}$$
may be obtained as follows.

That is to say, an expected value
$$<\sigma>$$
of the variance
$$\sigma$$
of the FHMM as the overall models
$$\phi$$
for the measurement waveform $Y_t$ which is actually measured (observed) is the same as an expected value $<|Y_t-Y\hat{}_t|^2>$ of the square error $|Y_t-Y\hat{}_t|^2$ of a current waveform which is the measurement waveform $Y_t$ and a current waveform which is a generation waveform $Y\hat{}_t$ generated (observed) in the FHMM as the overall models
$$\phi,$$
as indicated in Math (18).

[Math.18]

$$<\sigma>=\langle |Y_t-Y\hat{}_t|^2 \rangle \qquad (18)$$

The expected value
$$<\sigma>$$
of the variance
$$\sigma$$
is equivalent to a sum total
$$\sigma^{(1)}<S^{(1)}_t>+\sigma^{(2)}<S^{(2)}_t>+\ldots+\sigma^{(M)}<S^{(M)}_t>$$
for the factor #m of an expected value
$$\sigma^{(m)}<S^{(m)}_t>$$
of the individual variance
$$\sigma^{(m)}$$
which is separate for each state #k of each factor #m.

In addition, the expected value $<|Y_t-Y\hat{}_t|^2>$ of the square error $|Y_t-Y\hat{}_t|^2$ of the measurement waveform $Y_t$ and the generation waveform $Y\hat{}_t$ is equivalent to the square error $|Y_t-(W^{(1)}<S^{(1)}_t>+W^{(2)}<S^{(2)}_t>+\ldots+W^{(M)}<S^{(M)}_t>)|^2$ of the measurement waveform $Y_t$ and a sum total $W^{(1)}<S^{(1)}_t>+W^{(2)}<S^{(2)}_t>+\ldots+W^{(M)}<S^{(M)}_t>$ of an expected value $W^{(m)}<S^{(m)}_t>$ of an individual waveform $W^{(m)}$ for the factor #m.

Therefore, Math (18) is equivalent to Math (19).

[Math. 19]

$$\sum_{m=1}^{M} \sigma^{(m)}\langle S_t^{(m)}\rangle = \left|Y_t - \sum_{m=1}^{M} W^{(m)}\langle S_t^{(m)}\rangle\right|^2 \qquad (19)$$

The individual variance
$$\sigma^{(m)}=\sigma^{(m)new}$$
satisfying Math (19) may be obtained according to Math (20) using a restricted quadratic programming with a restriction where the individual variance
$$\sigma^{(m)}$$
is not negative.

[Math. 20]

$$\sigma^{(m)new} = \underset{\sigma^{(m)}}{\operatorname{argmin}}$$

$$\sum_{t=1}^{T}\left\|\left|Y_t - \sum_{m=1}^{M} W^{(m)}\langle S_t^{(m)}\rangle\right|^2 - \sum_{m=1}^{M}\sigma^{(m)}\langle S_t^{(m)}\rangle\right\|^2 \text{ subject } 0 < \sigma^{(m)} \qquad (20)$$

The individual variance learning portion 52 an update value
$$\sigma^{(m)new}$$
of the individual variance
$$\sigma^{(m)}$$
according to Math (20), and updates the individual variance
$$\sigma^{(m)}$$
stored in the model storage unit 13 to the update value
$$\sigma^{(m)new}.$$

As described above, in the individual variance learning portion 52, in a case where the individual variance
$$\sigma^{(m)}$$
is obtained for each factor #m or for each state #k of each factor #m, representation performance where the FHMM as the overall models
$$\phi$$
represents a household electrical appliance is improved as compared with a case of using a single variance C, accuracy of state estimation of the estimation portion 22 is also improved, and thus it is possible to obtain power consumption or the like more accurately.

Particularly, for example, with respect to a variable load household electrical appliance such as a vacuum cleaner of which current consumption varies depending on a sucking state, it is possible to power consumption more accurately by using the individual variance
$$\sigma^{(m)}.$$

The monitoring system of FIG. 12 performs the same processes (the learning process of FIG. 6 or the information presenting process of FIG. 10) as the monitoring system of FIG. 3 except that the individual variance
$$\sigma^{(m)}$$
is used instead of the variance C.

Figure 13:
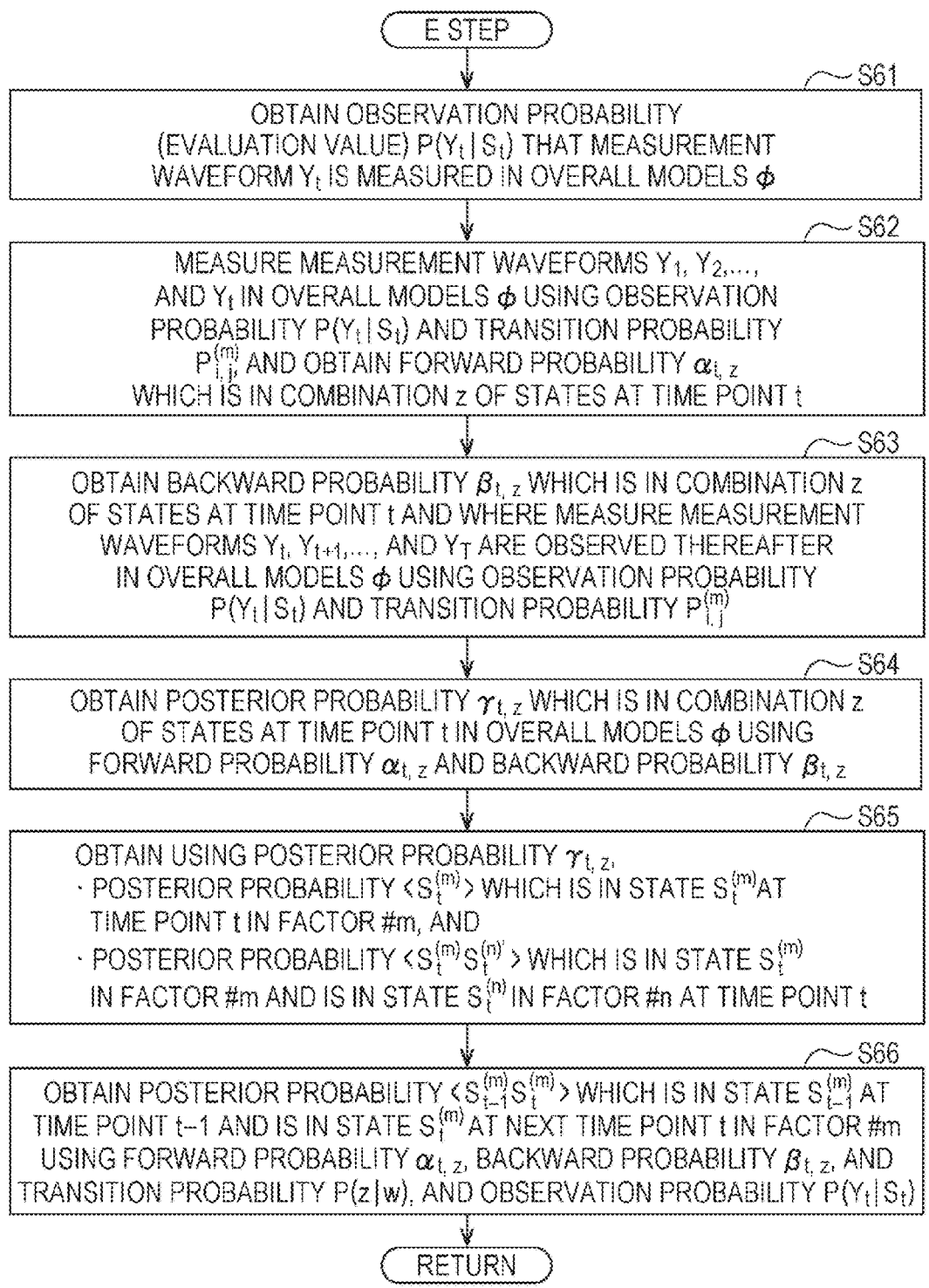
FIG. 13 is a flowchart illustrating a process of the E step performed in step S13 by the monitoring system.

FIG. 13 is a flowchart illustrating a process of the E step performed in step S13 of FIG. 6 by the monitoring system of FIG. 12.

In step S61, the evaluation portion 21 obtains the observation probability $P(Y_t|S_t)$ as an evaluation value E in each combination $S_t$ of states at the time points $t=\{1, 2, \ldots,$ and $T\}$ according to Math (16) and (17) (instead of Math (4)) by using the individual variance
$$\sigma^{(m)}$$
of the FHMM as the overall models
$$\phi$$
stored in the model storage unit 13, the unique waveform $W^{(m)}$, and the measurement waveforms $Y_t=\{Y_1, Y_2, \ldots,$ and $Y_T\}$ from the data acquisition unit 11, so as to be supplied to the estimation portion 22, and the process proceeds to step S62.

Hereinafter, in steps S62 to S66, the same processes as in steps S22 to S26 of FIG. 7 are respectively performed.

Figure 14:
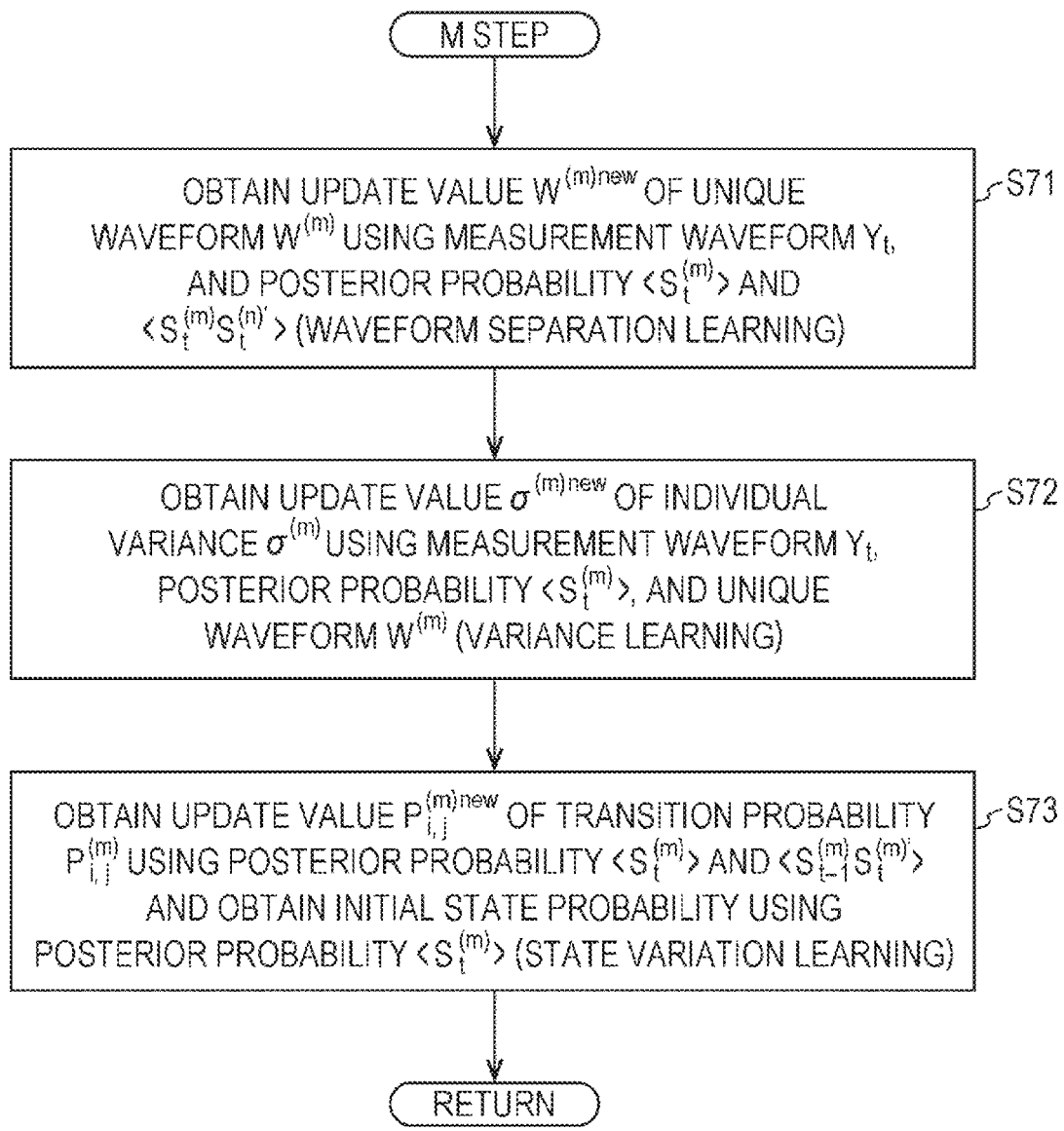
FIG. 14 is a flowchart illustrating a process of the M step performed in step S14 by the monitoring system.

FIG. 14 is a flowchart illustrating a process of the M step performed in step S14 of FIG. 6 by the monitoring system of FIG. 12.

In step S71, in the same manner as step S31 of FIG. 9, the waveform separation learning portion 31 performs the waveform separation learning so as to obtain an update value $W^{(m)new}$ of the unique waveform $W^{(m)}$, and updates the unique waveform $W^{(m)}$ stored in the model storage unit 13 to the update value $W^{(m)new}$, and the process proceeds to step S72.

In step S72, the individual variance learning portion 52 performs the variance learning according to Math (20) by using the measurement waveform $Y_t$ from the data acquisition unit 11, the posterior probability $<S^{(m)}_t>$ from the estimation portion 22, and the unique waveform $W^{(m)}$ stored in the model storage unit 13, so as to obtain an update value $\sigma^{(m)new}$ of the individual variance $\sigma^{(m)}$.

In addition, the individual variance learning portion 52 updates the individual variance $\sigma^{(m)}$ stored in the model storage unit 13 to the update value $\sigma^{(m)new}$ of the individual variance $\sigma^{(m)}$, and the process proceeds to step S73 from step S72.

In step S73, in the same manner as step S33 of FIG. 9, the state variation learning portion 33 performs the station variation learning so as to obtain an update value $P^{(m)\ new}_{i,j}$ of or the transition probability $P^{(m)}_{i,j}$ and an update value $\pi^{(m)new}$ of the initial state probability $\pi^{(m)}$, and updates the transition probability $P^{(m)}_{i,j}$ and the initial state probability $\pi^{(m)}$ stored in the model storage unit 13 to the update value $P^{(m)\ new}_{i,j}$ of the update value $\pi^{(m)new}$, and the process returns from the process of the M step.

Third Embodiment of Monitoring System to which Present Technology is Applied

Figure 15:
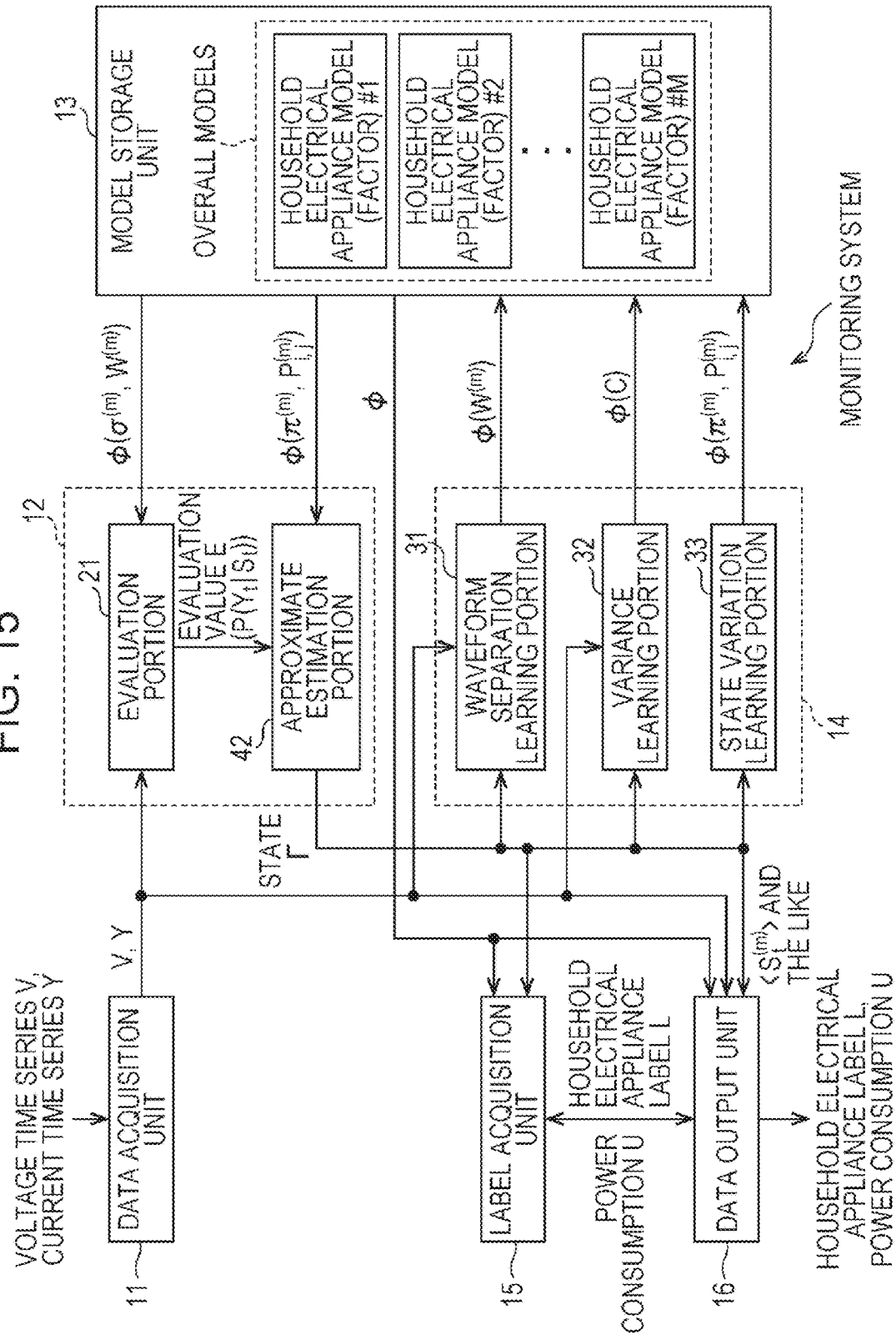
FIG. 15 is a block diagram illustrating a configuration example of the third embodiment of the monitoring system to which the present technology is applied.

FIG. 15 is a block diagram illustrating a configuration example of the third embodiment of the monitoring system to which the present technology is applied.

In addition, in the figure, portions corresponding to the case of FIG. 3 are given the same reference numerals, and, hereinafter, description thereof will be appropriately omitted.

The monitoring system of FIG. 15 is common to the monitoring system of FIG. 3 in that the data acquisition unit 11 to the data output unit 16 are provided.

However, the monitoring system of FIG. 15 is different from the monitoring system of FIG. 3 in that an approximate estimation portion 42 is provided instead of the estimation portion 22 of the state estimation unit 12.

The approximate estimation portion 42 obtains the posterior probability (state probability) $<S^{(m)}_t>$ under a state transition restriction where the number of factors of which a state transitions for one time point is restricted.

Here, for example, the posterior probability $<S^{(m)}_t>$ is obtained by marginalizing the posterior probability $\gamma_{t,z}$ according to Math (9).

The posterior probability $\gamma_{t,z}$ may be obtained in related to all the combinations z of states of the respective factors of the FHMM by using the forward probability $\alpha_{t,z}$ and the backward probability $\beta_{t,z}$ according to Math (8).

However, the number of the combinations z of states of the respective factors of the FHMM is $K^M$ and is thus increased in an exponential order if the number M of factors is increased.

Therefore, in a case where the FHMM has a number of factors, if the forward probability $\alpha_{t,z}$, the backward probability $\beta_{t,z}$, and the posterior probability $\gamma_{t,z}$ are strictly calculated for all the combinations z of states of the respective factors as disclosed in the document A, a calculation amount becomes enormous.

Therefore, in relation to state estimation of the FHMM, for example, an approximate estimation method such as Gibbs Sampling, Completely Factorized Variational Approximation, or Structured Variational Approximation is proposed in the document A. However, in the approximate estimation method, there are cases where a calculation amount is still large, or accuracy is considerably reduced due to approximation.

However, a probability that operating states of the overall household electrical appliances in a household are changed (varied) at each time is considerably low except for an abnormal case such as power failure.

Therefore, the approximate estimation portion 42 obtains the posterior probability $<S^{(m)}_t>$ under a state transition restriction where the number of factors of which a state transitions for one time point.

The state transition restriction may employ a restriction where the number of factors of which a state transitions for one time point is restricted to one, or several or less.

According to the state transition restriction, the number of combinations z of states which require strict calculation of the posterior probability $\gamma_{t,z}$, and, further the forward probability $\alpha_{t,z}$ and the backward probability $\beta_{t,z}$ used to obtain the posterior probability $<S^{(m)}_t>$ is greatly reduced, and, the reduced combinations of states are combinations which have a considerably low occurrence probability, thereby notably reducing a calculation amount without greatly damaging accuracy of the posterior probability (state probability)$<S^{(m)}_t>$ or the like.

In the approximate estimation portion 42, as methods of obtaining the posterior probability $<S^{(m)}_t>$ under the state transition restriction for restricting the number of factors of which a state transitions for one time point, there is a method of applying a particle filter to a process of the E step, that is, applying a particle filter to a combination z of states of the FHMM.

Here, the particle filter is disclosed in, for example, page 364 of the above-described document B.

In addition, in the present embodiment, the state transition restriction employs a restriction where the number of factors of which a state transitions for one time point is restricted to, for example, one or less.

In a case of applying the particle filter to the combination z of states of the FHMM, a p-th particle $S_p$ of the particle filter represents a certain combination of states of the FHMM.

Here, the particle $S_p$ is a combination of a state $S^{(1)}_p$ of the factor #1, a state $S^{(2)}_p$ of the factor #2, ..., and a state $S^{(M)}_p$ of the factor #M, represented by the particle $S_p$, and is expressed by the Math particle $S_p = \{S(S^{(1)}_p, S^{(2)}_p, \ldots, \text{and } S^{(M)}_p\}$.

In addition, in a case of applying the particle filter to the combination z of states of the FHMM, instead of the observation probability $P(Y_t|S_p)$ of Math (4) that the measurement waveform $Y_t$ is observed in a combination $S_t$ of states, observation probability $P(Y_t|S_p)$ that the measurement waveform $Y_t$ is observed in the particle $S_p$ (a combination of states represented thereby) is used.

The observation probability $P(Y_t|S_p)$ may be calculated, for example, according to Math (21).

[Math. 21]

$$P(Y_t|S_p) = |C|^{-1/2}(2\pi)^{-D/2}\exp\left\{-\frac{1}{2}(Y_t - \mu_p)'C^{-1}(Y_t - \mu_p)\right\} \quad (21)$$

The observation probability $P(Y_t|S_t)$ of Math (21) is different from the observation probability $P(Y_t|S_p)$ of Math (4) in that an average value (average vector) is not $\mu_t$ but $\mu_p$.

In the same manner as the average value $\mu_t$, the average value $\mu_p$ is, for example, a column vector of D rows which is the same as the current waveform Y and is expressed by the Math (22) using the unique waveform $W^{(m)}$.

[Math. 22]

$$\mu_p = \sum_{m=1}^{M} W^{(m)} S_p^{*(m)} \quad (22)$$

Here, $S^{*(m)}_p$ indicates a state of the factor #m of states forming a combination of the states which is the particle $S_p$, and, is hereinafter also referred to as a state $S^{*(m)}_p$ of the factor #m of the particle $S_p$. The state $S^{*(m)}_p$ of the factor #m of the particle $S_p$ is, for example, as shown in Math (23), a column vector of K rows where a component of only one row of K rows is 0, and components of the other rows are 0.

[Math. 23]

$$S_p^{*(m)} = \begin{pmatrix} 0 \\ \vdots \\ 1 \\ \vdots \\ 0 \end{pmatrix} \quad (23)$$

In a case where a state of the factor #m forming a combination of states as the particle $S_p$ is the state #k, in a column vector $S^{*(m)}_p$ of K rows which is the state $S^{*(m)}_p$ of the factor #m of the particle $S_p$, only the k-th row component is 1, and the other components are 0.

According to Math (22), a sum total of the unique waveform $W^{(m)}_k$ of the state #k of each factor #m forming a combination of states as the particle $S_p$ is obtained as the average value $\mu_p$ of the current waveform $Y_t$ at the time point t.

Figure 16:
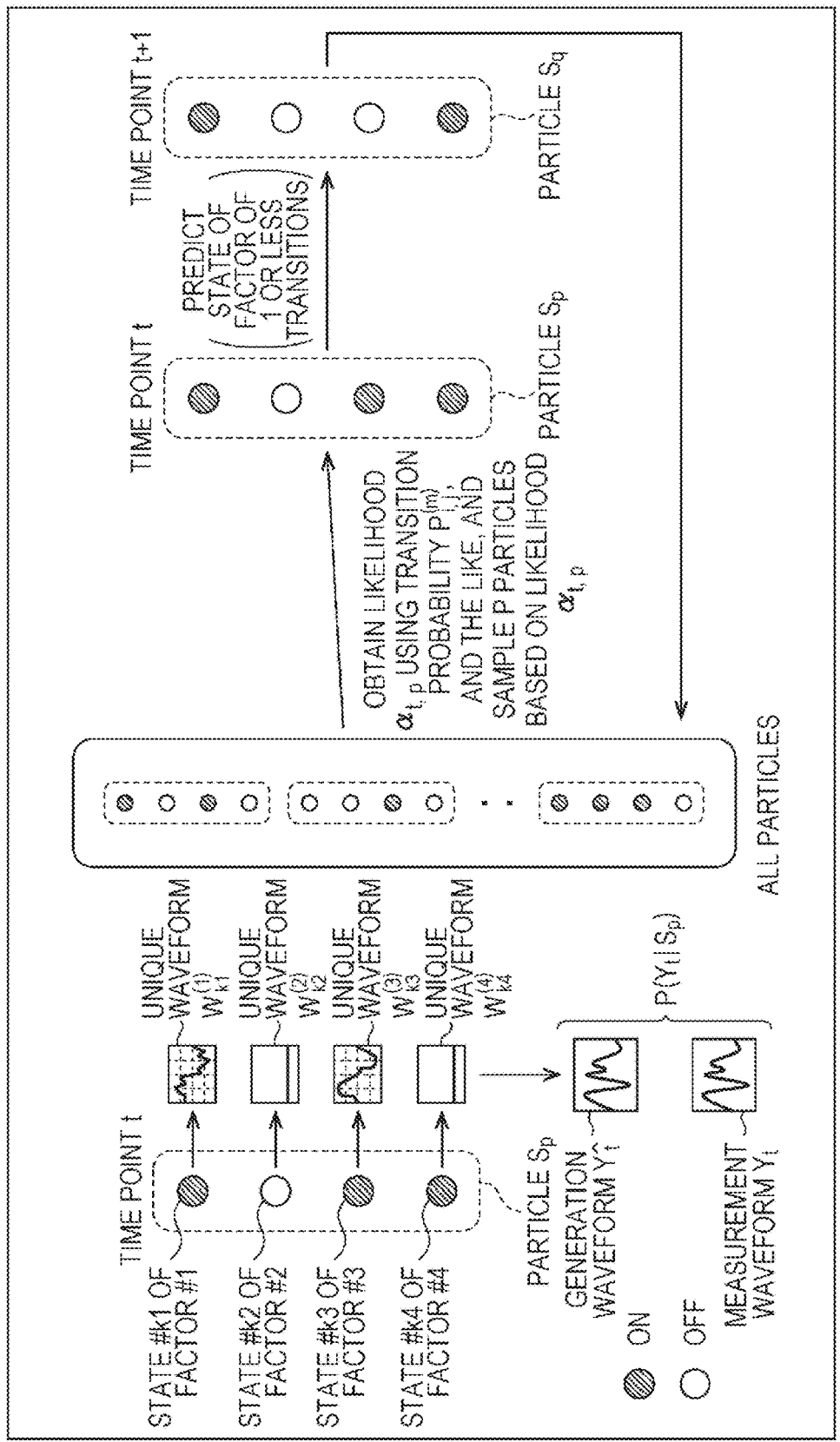
FIG. 16 is a diagram illustrating a method of obtaining the forward probability $\text{ALPHA}_{t,p}$ by applying a particle filter to a combination z of states of the FHMM.

FIG. 16 is a diagram illustrating a method of obtaining the forward probability $\alpha_{t,p}$ (ALPHA$_{t,p}$) by applying the particle filter to the combination z of states of the FHMM.

In FIG. 16 (the same for FIGS. 17 and 18 described later), for example, the number of factors of the FHMM is four, and, each factor has two states representing an ON state and an OFF state as operating states.

The evaluation portion 21 obtains the observation probability $P(Y_t|S_p)$ of Math (21) in a combination of states as each particle $S_p=\{S_1, S_2, \ldots, $ and $S_R\}$ at the time points t=$\{1, 2, \ldots, $ and T$\}$ by using the variance C of the FHMM as the overall models $\phi$ stored in the model storage unit 13, the unique waveform $W^{(m)}$, and the measurement waveforms $Y_t=\{Y_t, Y_2, \ldots, $ and $Y_T\}$ from the data acquisition unit 11, so as to be supplied to the approximate estimation portion 42.

The approximate estimation portion 42 obtains the forward probability $\alpha_{t,p}$ that the measurement waveforms $Y_1, Y_2, \ldots,$ and $Y_t$ are measured and which is in a combination as the particle $S_p$ at the time point t by using the observation probability $P(Y_t|S_p)$ from the evaluation portion 21, and the transition probability $P^{(m)}_{i,j}$ (and the initial state probability $\pi^{(m)}$)

of the FHMM as the overall models $\phi$ stored in the model storage unit 13.

The forward probability $\alpha_{t,p}$ may be obtained according to, for example, the recurrence formula $\alpha_{t,p}=\Sigma\alpha_{t-1,r}P(S_p|r)P(Y_t|S_p)$ using the forward probability $\alpha_{t-1,r}$ before one time point.

In the recurrence formula $\alpha_{t,p}=\Sigma\alpha_{t-1,r}P(S_p|r)P(Y_t|S_p)$, r indicates a combination r of states as a particle at the time point t−1 which can transition to a combination of states as the particle $S_p$ at the time point t under the state transition restriction where the number of factors of which a state transitions for one time point is restricted to one state or less.

Therefore, a combination of states where a combination of states equal to a combination of states as the particle $S_p$ is different from the combination of states as the particle $S_p$ only by one state can become the combination r of states.

In the recurrence formula $\alpha_{t,p}=\Sigma\alpha_{t-1,r}P(S_p|r)P(Y_t|S_p),\Sigma$ indicates summation taken for all the combinations r of states.

In addition, in the recurrence formula $\alpha_{t,p}=\Sigma\alpha_{t-1,r}P(S_p|r)P(Y_t|S_p),P(S_p|r)$ indicates the transition probability that a factor is in the combination r of states as the particle $S_p$ at the time point t−1 and transitions to a combination of states as the particle $S_p$ at the time point t, and may be obtained according to Math (3) by using the transition probability $P^{(m)}_{i,j}$ of the FHMM as the overall models $\phi$.

In addition, as an initial value of the forward probability $\alpha_{t,p}$, for example, the forward probability $\alpha_{1,z}$ at the time point t=1, a product of the initial state probability $\pi^{(m)}{}_k$ of the state #k of each factor #m forming a combination of states which is randomly selected as the particle $S_p$ from all the combinations of states.

The approximate estimation portion 42 obtains the forward probability $\alpha_{t,p}$ with respect to not all the combinations of states which can be taken by the FHMM but only a combination of states as the particle $S_p$.

If the number of the particle $S_p$ which exists at the time point t is R, R forward probabilities $\alpha_{t,p}$ are obtained.

If the forward probability $\alpha_{t,p}$ is obtained with respect to R particles $S_p=\{S_1, S_2, \ldots, $ and $S_R\}$ at the time point t, the approximate estimation portion 42 samples particles from the R particles $S_p=\{S_1, S_2, \ldots, $ and $S_R\}$ on the basis of the forward probability $\alpha_{t,p}$.

In other words, the approximate estimation portion 42 samples predetermined P particles $S_p=\{S_1, S_2, \ldots, $ and $S_P\}$ in descending order of the forward probability $\alpha_{t,p}$ from the R particles $S_p=\{S_1, S_2, \ldots, $ and $S_R\}$, and leaves only the P particles $S_p$ as particles at the time point t.

In addition, if P≥R, all of the R particles $S_p$ are sampled.

In addition, the number P of the particles $S_p$ to be sampled is a value smaller than the number of combinations of states which can be taken by the FHMM, and, is set, for example, based on calculation costs allowable for the monitoring system.

If P particles $S_p=\{S_1, S_2, \ldots, $ and $S_P\}$ at the time point t are sampled, the approximate estimation portion 42 predicts particles at the time point t+1 after one time point in each of the P particles $S_p=\{S_1, S_2, \ldots, $ and $S_P\}$ under the state transition restriction.

Under the state transition restriction where the number of factors of which a state transitions for one time point is restricted to one state or less, as a particle $S_q$ at the time point t+1, a combination of states where a combination of states equal to a combination of states as the particle $S_p$ is different from the combination of states as the particle $S_p$ only by one state is predicted.

As described above, in a case where the number of factors of the FHMM is four, and each factor has two states representing an ON state and an OFF state as operating states, in relation to the particle $S_p$ at the time point t, a total of five combinations with a combination of states equal to a combination of states as the particle $S_p$ at the time point t and four combinations which are different from the combination of states as the particle $S_p$ at the time point t only by one state, are predicted as particles $S_q$ at the time point t+1.

The approximate estimation portion 42 predicts the particles $S_q=\{S_1, S_2, \ldots, S_Q\}$ at the time point t+1, then obtains the forward probability with respect to the particles $S_q$ at the time point t+1 in the same manner as the particles $S_p$ at the time point t, and, thereafter, obtains forward probabilities at the time points t=1, 2, ..., and T in the same manner.

As described above, the approximate estimation portion 42 obtains the forward probability $\alpha_{t,z}$ of a combination z of states as a particle for each time point by using a combination of states of each factor #m as a particle while repeatedly predicting particles after one time point under the state transition restriction and sampling a predetermined number of particles on the basis of the forward probability $\alpha_{t,z}$.

Figure 17:
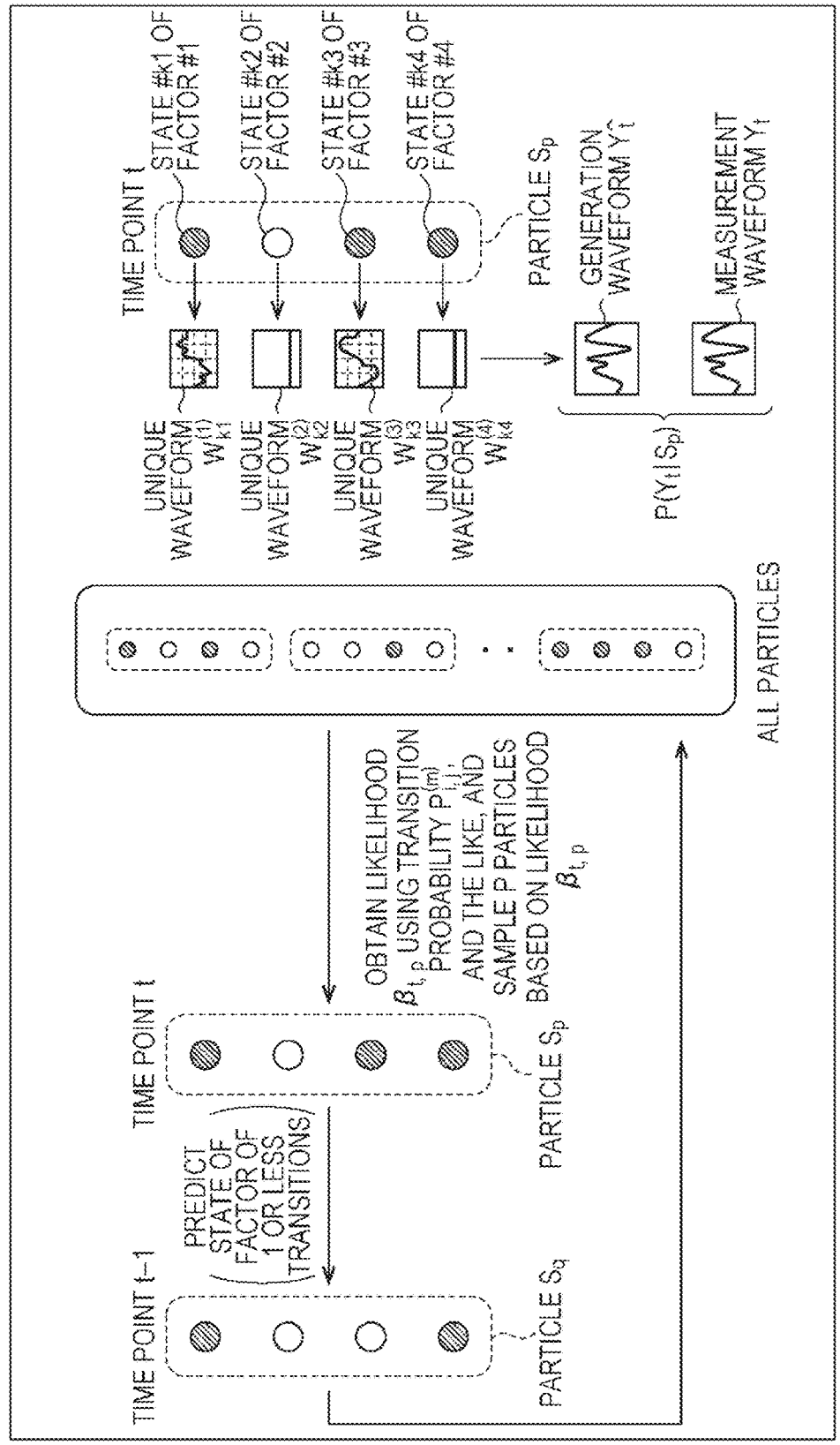
FIG. 17 is a diagram illustrating a method of obtaining the backward probability $\text{BETA}_{t,p}$ by applying a particle filter to a combination z of states of the FHMM.

FIG. 17 is a diagram illustrating a method of obtaining the backward probability $\beta_{t,p}$ ($BETA_{t,p}$) by applying a particle filter to the combination z of states of the FHMM.

The approximate estimation portion 42 obtains the backward probability $\beta_{t,p}$ which is in a combination a of states as the particle $S_p$ at the time point t, and, thereafter, that the measurement waveforms $Y_t, T_{t+1}, \ldots,$ and $Y_T$ are observed, by using the observation probability $P(Y_t|S_t)$ from the evaluation portion 21, and the transition probability $P^{(m)}{}_{i,j}$ of the FHMM as the overall models $\phi$ stored in the model storage unit 13.

The backward probability $\beta_{t,p}$ may be obtained according to the recurrence formula $\beta_{t,p}=\Sigma P(Y_t|S_p)P(r|S_p)\beta_{t+1,r}$ using the forward probability $\beta_{t+1,r}$ after one time point.

In the recurrence formula $\beta_{t,p}=\Sigma P(Y_t|S_p)P(r|S_p)\beta_{t+1,r}$, r indicates a combination r of states as a particle at the time point t+1 which can transition to a combination of states as the particle $S_p$ at the time point t under the state transition restriction where the number of factors of which a state transitions for one time point is restricted to one state or less.

Therefore, a combination of states where a combination of states equal to a combination of states as the particle $S_p$ is different from the combination of states as the particle $S_p$ only by one state can become the combination r of states.

In the recurrence formula $\beta_{t,p}=\Sigma P(Y_t|S_p)P(r|S_p)\beta_{t+1,r}, \Sigma$ indicates summation taken for all the combinations r of states.

In the recurrence formula $\beta_{t,p}=\Sigma P(Y_t|S_p)P(r|S_p)\beta_{t+1,r}$, $P(r|S_p)$ indicates the transition probability that a factor is in the combination r of states as the particle $S_p$ at the time point t and transitions to a combination of states as the particle $S_p$ at the time point t+1, and may be obtained according to Math (3) by using the transition probability $P^{(m)}{}_{i,j}$ of the FHMM as the overall models $\phi$.

In addition, an initial value $\beta_{T,p}$ of the backward probability $\beta_{t,p}$ employs 1.

In the same manner as the forward probability $\alpha_{t,p}$, the approximate estimation portion 42 obtains the backward probability $\beta_{t,p}$ with respect to not all the combinations of states which can be taken by the FHMM but only a combination of states as the particle $S_p$.

If the number of the particle $S_p$ which exists at the time point t is R, R backward probabilities $\beta_{t,p}$ are obtained.

If the backward probability $\beta_{t,p}$ is obtained with respect to R particles $S_p = \{S_1, S_2, \ldots,$ and $S_R\}$ at the time point t, the approximate estimation portion 42 samples particles from the R particles $S_p = \{S_1, S_2, \ldots,$ and $S_R\}$ on the basis of the backward probability $\beta_{t,p}$.

In other words, in the same manner as a case of the forward probability $\alpha_{t,p}$, the approximate estimation portion 42 samples predetermined P particles $S_p = \{S_1, S_2, \ldots,$ and $S_P\}$ in descending order of the backward probability $\beta_{t,p}$ from the R particles $S_p = \{S_1, S_2, \ldots,$ and $S_R\}$, and leaves only the P particles $S_p$ as particles at the time point t.

If P particles $S_p = \{S_1, S_2, \ldots,$ and $S_P\}$ at the time point t are sampled, the approximate estimation portion 42 predicts particles at the time point t−1 before one time point in each of the P particles $S_p = \{S_1, S_2, \ldots,$ and $S_P\}$ under the state transition restriction.

Under the state transition restriction where the number of factors of which a state transitions for one time point is restricted to one state or less, as a particle $S_q$ at the time point t−1, a combination of states where a combination of states equal to a combination of states as the particle $S_p$ is different from the combination of states as the particle $S_p$ at the time point t only by one state is predicted.

As described above, in a case where the number of factors of the FHMM is four, and each factor has two states representing an ON state and an OFF state as operating states, in relation to the particle $S_p$ at the time point t, a total of five combinations with a combination of states equal to a combination of states as the particle $S_p$ at the time point t and four combinations which are different from the combination of states as the particle $S_p$ at the time point t only by one state, are predicted as particles $S_q$ at the time point t−1.

The approximate estimation portion 42 predicts the particles $S_q = \{S_1, S_2, \ldots,$ and $S_Q\}$ at the time point t−1, then obtains the backward probability $\beta_{t+1,q}$ in the same manner as the particles $S_p$ at the time point t, and, thereafter, obtains forward probabilities at the time points t=T, T−1, ..., and 1 in the same manner.

As described above, the approximate estimation portion 42 obtains the backward probability $\beta_{t,z}$ of a combination z of states as a particle for each time point by using a combination of states of each factor #m as a particle while repeatedly predicting particles before one time point under the state transition restriction and sampling a predetermined number of particles on the basis of the backward probability $\beta_{t,z}$.

Figure 18:
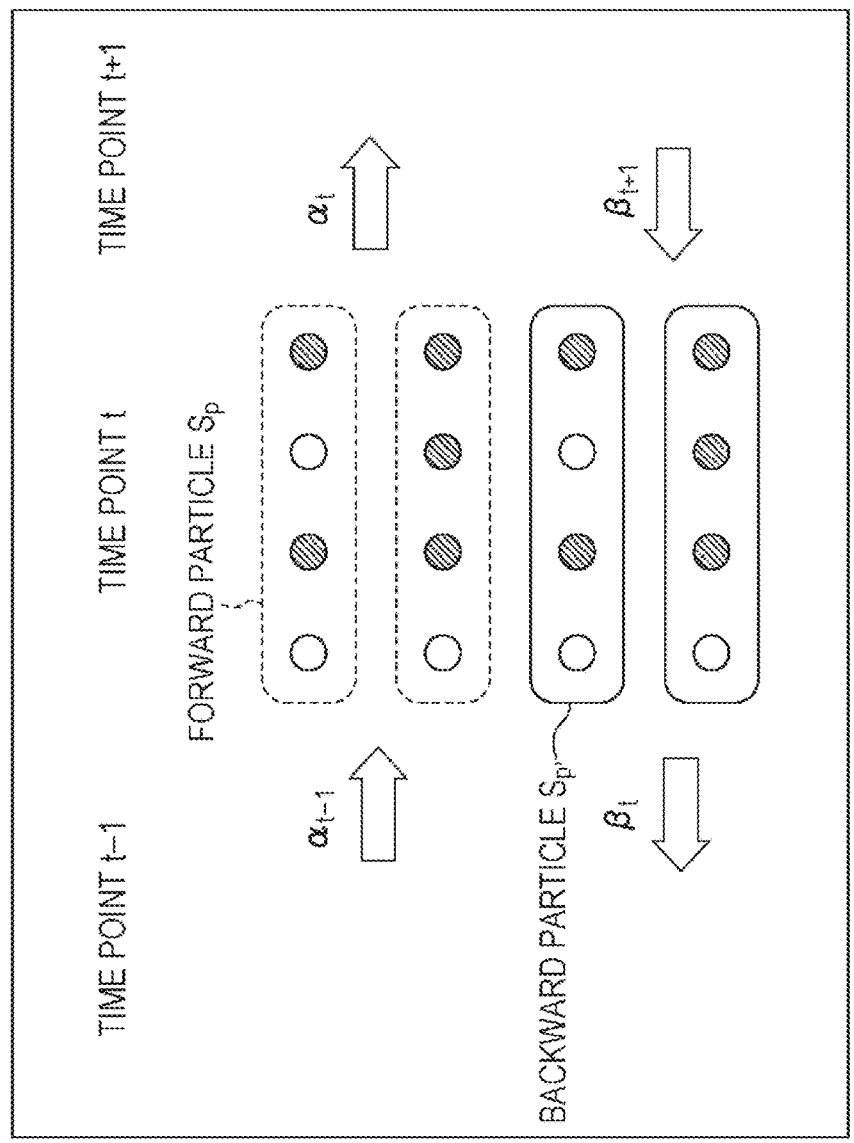
FIG. 18 is a diagram illustrating a method of obtaining the posterior probability $\text{GAMMA}_{t,p}$ by applying a particle filter to a combination z of states of the FHMM.

FIG. 18 is a diagram illustrating a method of obtaining the posterior probability $\gamma_{t,p}$ (GAMMA$_{t,p}$) by applying a particle filter to the combination z of states of the FHMM.

In a case where a combination of states as the particle (hereinafter, also referred to as a forward particle) $S_p$ of which the forward probability $\alpha_{t,p}$ has been obtained at each time point t and a combination of states as the particle (hereinafter, referred to as a backward particle) $S_{p'}$ of which the backward probability $\beta_{t,p'}$ has been obtained are the same combination z of states, the approximate estimation portion 42 obtains the posterior probability $\gamma_{t,z}$ in the combination z of states at the time point t in the FHMM as the overall models $\phi$ according to Math (23) by using the forward probability $\alpha_{t,z}$ and the backward probability $\beta_{t,z}$ relation to the combination z of states.

[Math. 24]

$$\gamma_{t,z} = \frac{\alpha_{t,z}\beta_{t,z}}{\sum_{w \in S_p \cap S_{p'}} \alpha_{t,w}\beta_{t,w}} \qquad (24)$$

Here, $\Sigma$ of the denominator of the right side of Math (24) indicates summation taken by changing w to all the combinations $S_p \cap S_{p'}$ of states which are commonly left in both the forward particle $S_p$ and the backward particle $S_{p'}$ at the time point t.

In addition, both the forward probability $\alpha_{t,z}$ of the combination z of states which is not left as the forward particle $S_p$ at the time point t and the backward probability $\beta_{t,z}$ of the combination z of states which is not left as the backward particle $S_{p'}$ at the time point t are, for example, 0.

Therefore, the posterior probability $\gamma_{t,z}$ of combinations of states other than the combinations $S_p \cap S_{p'}$ of states which are commonly left in both the forward particle $S_p$ and the backward particle $S_{p'}$ at the time point t is 0.

The monitoring system of FIG. 15 performs the same process as the monitoring system of FIG. 3 except that the posterior probability $<S^{(m)}_t>$ or the like is obtained under the state transition restriction by applying a particle filter to the combination z of states of the FHMM.

Figure 19:
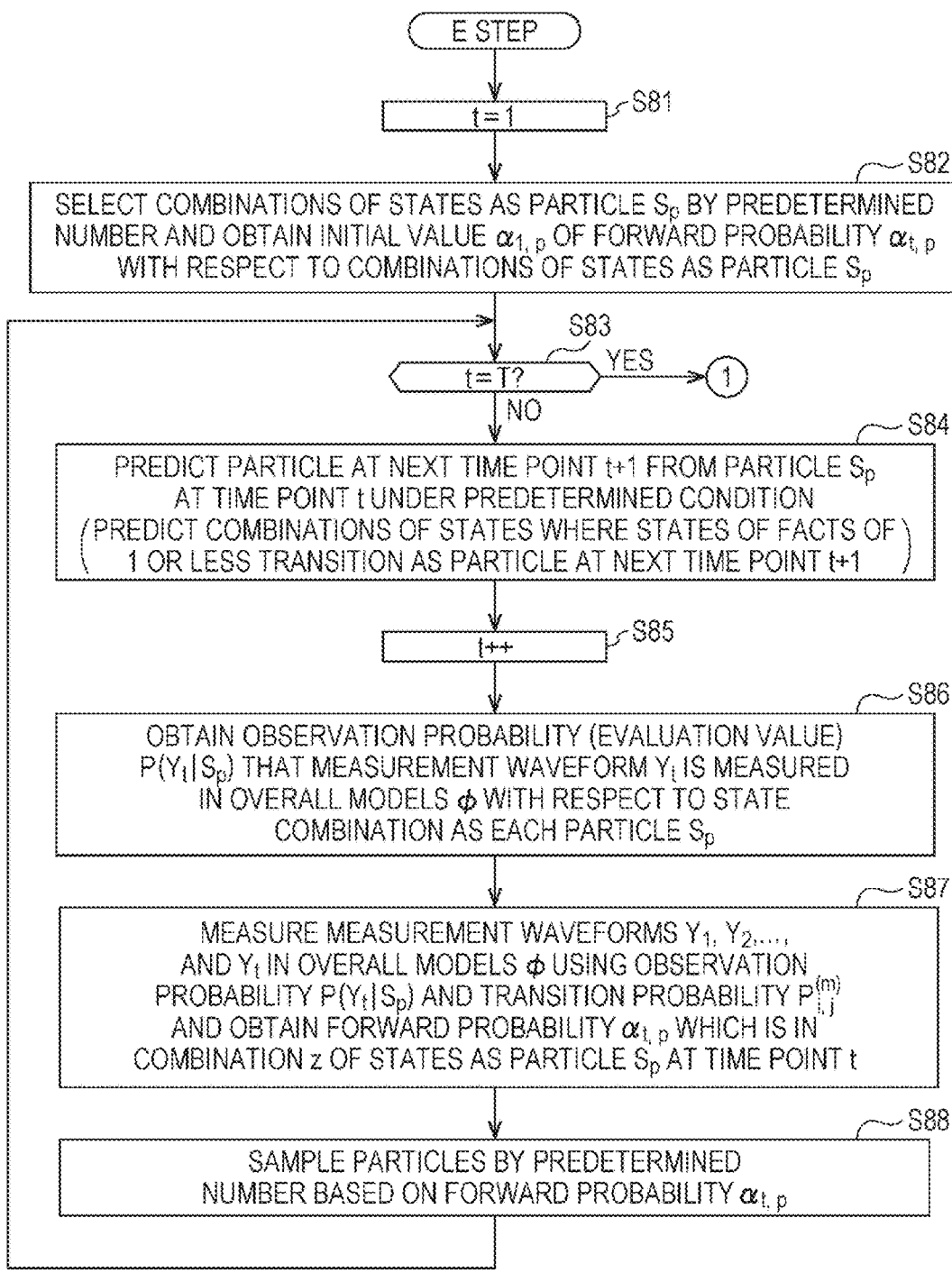
FIG. 19 is a flowchart illustrating a process of the E step performed in step S13 by the monitoring system.
Figure 20:
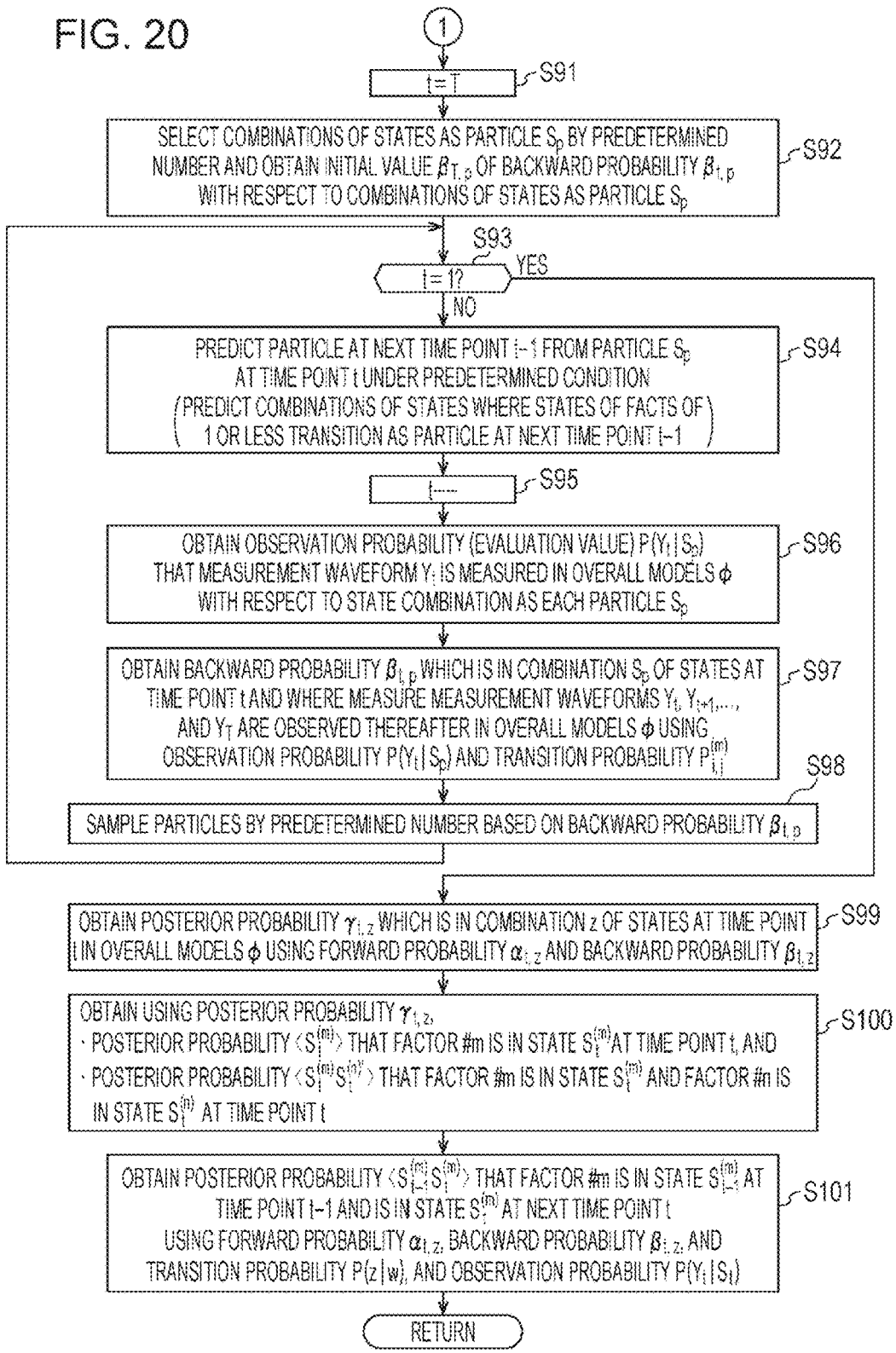
FIG. 20 is a flowchart illustrating a process of the E step performed in step S13 by the monitoring system.

FIGS. 19 and 20 are flowcharts illustrating a process of the E step performed in step S13 of FIG. 6 by the monitoring system of FIG. 15.

In addition, FIG. 20 is a flowchart subsequent to FIG. 19.

In step S81, the approximate estimation portion 42 initializes (a variable indicating) the time point t to 1 as an initial value for a forward probability, and the process proceeds to step S82.

In step S82, the approximate estimation portion 42 selects (samples) a predetermined number of combinations of states, for example, in random, from combinations of states which can be taken by the FHMM, as particles $S_p$. In addition, in step S82, all of the combinations of states which can be taken by the FHMM may be selected as the particles $S_p$.

The approximate estimation portion 42 obtains an initial value $\alpha_{1,p}$ of the forward probability $\alpha_{t,p}$ with respect to the combinations of states as the particles $S_p$, and the process proceeds from step S82 to step S83.

In step S83, it is determined whether or not the time point t is the same as the last time point (series length) T of the measurement waveform $Y_t = \{Y_1, Y_2, \ldots, $ and $Y_T\}$.

If it is determined that the time point t is not the same as the last time point T of a series of the measurement waveform $Y_t$ in step S83, that is, the time point t is less than the time point T, the process proceeds to step S84 where the approximate estimation portion 42 predicts a particle at the time point t+1 after one time point with respect to the combinations of states as the particles $S_p$ under the state transition restriction which is a predetermined condition, and the process proceeds to step S85.

In step S85, the approximate estimation portion 42 increments the time point t by 1, and the process proceeds to step S86.

In step S86, the evaluation portion 21 obtains the observation probability $P(Y_t|S_p)$ of Math (21) with respect to the combinations of states as the particles $S_p = \{S_1, S_2, \ldots, $ and $S_R\}$ at the time point t by using the variance C of the FHMM as the overall models stored in the model storage unit 13, the unique waveform $W^{(m)}$, and the measurement waveform $Y_t = \{Y_1, Y_2, \ldots, $ and $Y_T\}$ from the data acquisition unit 11. The evaluation portion 21 supplies the observation probability $P(Y_t|S_p)$ to the approximate estimation portion 42, and the process proceeds from step S86 to step S87.

In step S87, the approximate estimation portion 42 measures the measurement waveforms $Y_1, Y_2, \ldots, $ and $Y_t$ by using the observation probability $P(Y_t|S_p)$ from the evaluation portion 21, and the transition probability $P^{(m)}_{i,j}$ (and the initial state probability)

$\pi^{(m)}$)

of the FHMM as the overall models $\phi$ stored in the model storage unit 13, and obtains the forward probability $\alpha_{t,p}$ in a combination as the particle $S_p$ at the time point t, and, the process proceeds to step S88.

In step S88, the approximate estimation portion 42 samples a predetermined number of particles in descending order of the forward probability $\alpha_{t,p}$ from the particles $S_p$ so as to be left as particles at the time point t on the basis of the forward probability $\alpha_{t,p}$.

Thereafter, the process returns to step S83 from step S88, and, hereinafter, the same processes are repeatedly performed.

In addition, it is determined that the time point t is the same as the last time point T of a series of the measurement waveform $Y_t$ in step S83, the process proceeds to step S91 of FIG. 20.

In step S91, the approximate estimation portion 42 initializes the time point t to T as an initial value for a backward probability, and the process proceeds to step S92.

In step S92, the approximate estimation portion 42 selects (samples) a predetermined number of combinations of states, for example, in random, from combinations of states which can be taken by the FHMM, as particles $S_p$. In addition, in step S92, all of the combinations of states which can be taken by the FHMM may be selected as the particles $S_p$.

The approximate estimation portion 42 obtains an initial value $\alpha_{T,p}$ of the backward probability $\beta_{t,p}$ with respect to the combinations of states as the particles $S_p$, and the process proceeds from step S92 to step S93.

In step S93, it is determined whether or not the time point t is the same as the initial time point 1 of the measurement waveform $Y_t = \{Y_1, Y_2, \ldots, $ and $Y_T\}$.

If it is determined that the time point t is not the same as the initial time point 1 of a series of the measurement waveform $Y_t$ in step S93, that is, the time point t is larger than the time point 1, the process proceeds to step S94 where the approximate estimation portion 42 predicts a particle at the time point t−1 before one time point with respect to the combinations of states as the particles $S_p$ under the state transition restriction which is a predetermined condition, and the process proceeds to step S95.

In step S95, the approximate estimation portion 42 decreases the time point t by 1, and the process proceeds to step S96.

In step S96, the evaluation portion 21 obtains the observation probability $P(Y_t|S_p)$ of Math (21) with respect to the combinations of states as the particles $S_p = \{S_1, S_2, \ldots, $ and $S_R\}$ at the time point t by using the variance C of the FHMM as the overall models $\phi$ stored in the model storage unit 13, the unique waveform $W^{(m)}$, and the measurement waveform $Y_t = \{Y_1, Y_2, \ldots, $ and $Y_T\}$ from the data acquisition unit 11. The evaluation portion 21 supplies the observation probability $P(Y_t|S_p)$ to the approximate estimation portion 42, and the process proceeds from step S96 to step S97.

In step S97, the approximate estimation portion 42 obtains the backward probability $\beta_{t,p}$ which is in the combinations of states as the particles $S_p$ at the time point t, and, thereafter, that the measurement waveforms $Y_t, T_{t+1}, \ldots, $ and $Y_T$ are measured by using the observation probability $P(Y_t|S_p)$ from the evaluation portion 21, and the transition probability $P^{(m)}_{i,j}$ (and the initial state probability $\pi^{(m)}$)

of the FHMM as the overall models $\phi$ stored in the model storage unit 13, and, the process proceeds to step S98.

In step S98, the approximate estimation portion 42 samples a predetermined number of particles in descending order of the backward probability $\beta_{t,p}$ from the particles $S_p$ so as to be left as particles at the time point t on the basis of the backward probability $\beta_{t,p}$.

Thereafter, the process returns to step S93 from step S98, and, hereinafter, the same processes are repeatedly performed.

In addition, it is determined that the time point t is the same as the initial time point 1 of a series of the measurement waveform $Y_t$ in step S93, the process proceeds to step S99.

In step S99, the approximate estimation portion 42 obtains the posterior probability $\gamma_{t,z}$ in the combination z of states at the time point t in the FHMM as the overall models $\phi$ according to Math (24) by using the forward probability $\alpha_{t,z}(=\alpha_{t,p})$ and the backward probability $\beta_{t,z}(=\beta_{t,p})$ and the process proceeds to step S100.

Hereinafter, in steps S100 and S101, the same processes are in steps S25 and S26 of FIG. 7 are performed, and thus the posterior probabilities $<S^{(m)}_t>$, $<S^{(m)}_t S^{(m)}_t{}'>$ and $<S^{(m)}_{t-1} S^{(m)}_t{}'>$ are obtained.

As described above, in the approximate estimation portion 42, by applying a particle filter to the combination z of states of the FHMM, the posterior probability $<S^{(m)}_t>$ and the like are obtained under the state transition restriction, and therefore calculation for combination of which a probability is low is omitted, thereby improving efficiency of calculation of the posterior probability $<S^{(m)}_t>$ and the like.

Fourth Embodiment of Monitoring System to which Present Technology is Applied

Figure 21:
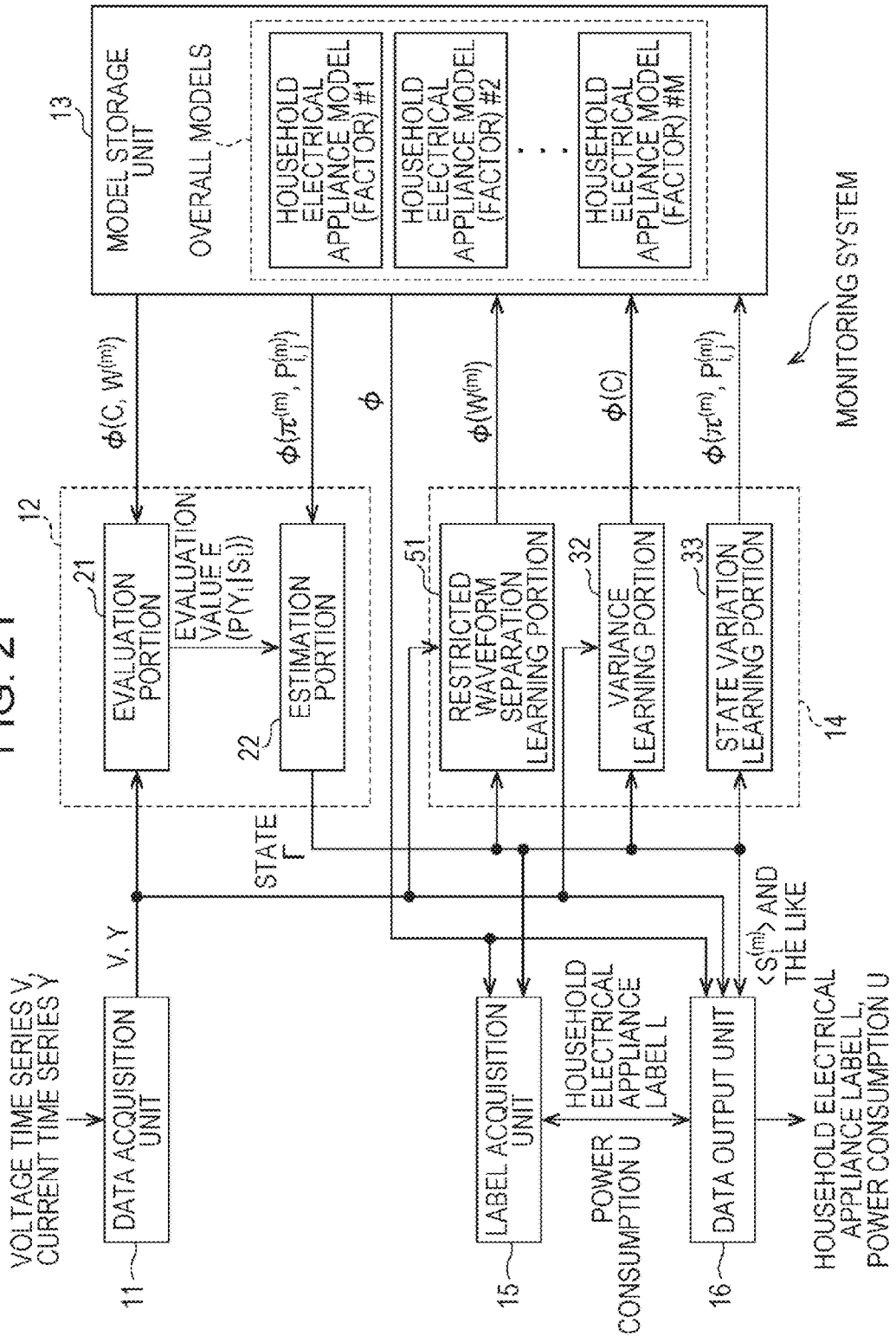
FIG. 21 is a block diagram illustrating a configuration example of the fourth embodiment of the monitoring system to which the present technology is applied.

FIG. 21 is a block diagram illustrating a configuration example of the fourth embodiment of the monitoring system to which the present technology is applied.

In addition, in the figure, portions corresponding to the case of FIG. 3 are given the same reference numerals, and, hereinafter, description thereof will be appropriately omitted.

The monitoring system of FIG. 21 is common to the monitoring system of FIG. 3 in that the data acquisition unit 11 to the data output unit 16 are provided.

However, the monitoring system of FIG. 21 is different from the monitoring system of FIG. 3 in that a restricted separation learning portion 51 is provided instead of the waveform separation learning portion 31 of the model learning unit 14.

The separation learning portion 31 of FIG. 3 obtains the unique waveform $W^{(m)}$ without particular restriction, but, the restricted waveform separation learning portion 51 obtains the unique waveform $W^{(m)}$ under a predetermined restriction distinctive to a household electrical appliance (household electrical appliance separation).

Here, in the separation learning portion 31 of FIG. 3, a particular restriction is not imposed on calculation of the unique waveform $W^{(m)}$ in the M step.

For this reason, in the separation learning portion 31 of FIG. 3, the unique waveform $W^{(m)}$ is calculated through the waveform separation learning only in consideration of the measurement waveform $Y_t$ being a waveform obtained by superimposing a plurality of current waveforms.

In other words, in the waveform separation learning of the separation learning portion 31 of FIG. 3, the measurement waveform $Y_t$ is regarded as a waveform where a plurality of current waveforms are superimposed, and the unique waveform $W^{(m)}$ as the plurality of current waveforms is separated.

In a case where there is no restriction in calculation of the unique waveform $W^{(m)}$, a degree of freedom (redundancy) of solutions of the waveform separation learning, that is, a degree of freedom of a plurality of current waveforms which can be separated from the measurement waveform $Y_t$ is very high, and thus the unique waveform $W^{(m)}$ as a current waveform which is inappropriate as a current waveform of a household electrical appliance may be obtained.

Therefore, the restricted waveform separation learning portion 51 performs the waveform separation learning under a predetermined restriction distinctive to a household electrical appliance so as to prevent the unique waveform $W^{(m)}$ as a current waveform which is inappropriate as a current waveform of a household electrical appliance from being obtained, and obtains the unique waveform $W^{(m)}$ as an accurate current waveform of a household electrical appliance.

Here, the waveform separation learning performed under a predetermined restriction is also referred to as restricted waveform separation learning.

The monitoring system of FIG. 21 performs the same processes as the monitoring system of FIG. 3 except that the restricted waveform separation learning is performed.

In the restricted waveform separation learning, as a restriction distinctive to a household electrical appliance, there is, for example, a load restriction or a base waveform restriction.

The load restriction is a restriction where power consumption $U^{(m)}$ of a household electrical appliance which is obtained by multiplication of the unique waveform $W^{(m)}$ as a current waveform of a household electrical appliance #m and a voltage waveform of a voltage applied to the household electrical appliance #m, that is, the voltage waveform $V_t$ corresponding to the measurement waveform $Y_t$ which is a current waveform does not have a negative value (the household electrical appliance #m does not generate power).

The base waveform restriction is a restriction where the unique waveform $W^{(m)}$ which is a current waveform of a current consumed in each operating state of the household electrical appliance #m is represented by one or more combinations of a plurality of waveforms prepared in advance as base waveforms for the household electrical appliance #m.

Figure 22:
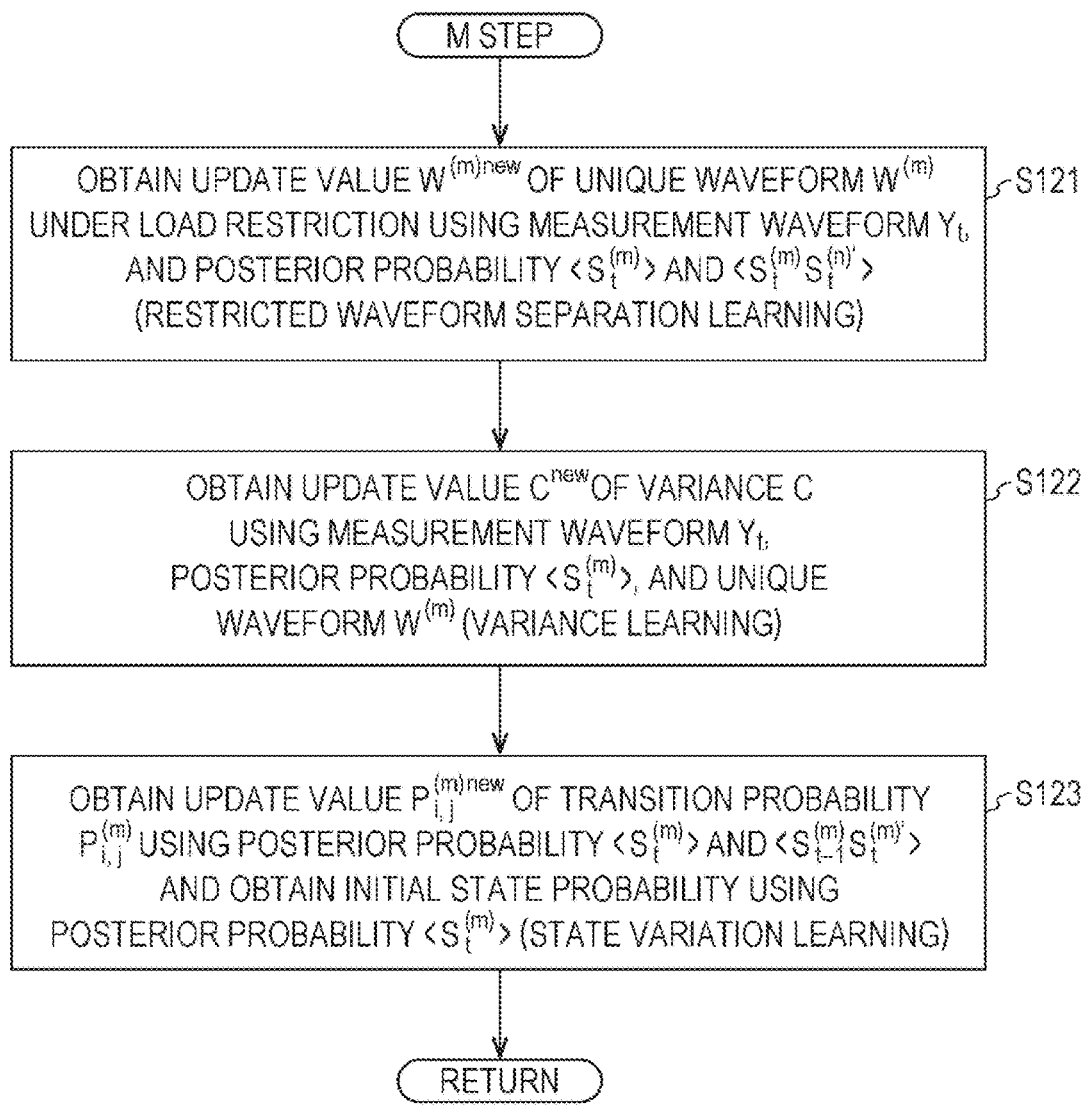
FIG. 22 is a flowchart illustrating a process of the M step of step S14 performed by the monitoring system imposing a load restriction.

FIG. 22 is a flowchart illustrating a process of the M step of step S14 of FIG. 6 performed by the monitoring system of FIG. 21 imposing the load restriction.

In step S121, the restricted waveform separation learning portion 51 performs the waveform separation learning under the load restriction by using the measurement waveform $Y_t$ from the data acquisition unit 11, and the posterior probabilities $<S^{(m)}_t>$ and $<S^{(m)}_t S^{(n)}_t{}'>$ from the estimation portion 22, so as to obtain an update value $W^{(m)new}$ of the unique waveform $W^{(m)}$, and updates the unique waveform $W^{(m)}$ stored in the model storage unit 13 to the update value $W^{(m)new}$, and the process proceeds to step S122.

In other words, the restricted waveform separation learning portion 51 solves Math (25) as the waveform separation learning under the load restriction by using a quadratic programming with a restriction, thereby obtaining the update value $W^{(m)new}$ of the unique waveform $W^{(m)}$.

[Math. 25]

$$W^{new} = \underset{W}{\operatorname{argmin}}\left\{\sum_{t=1}^{T}|Y_t\langle S_t'\rangle - W\langle S_tS_t'\rangle|^2\right\} \text{ subject to } 0 \leq V'W \quad (25)$$

Here, in Math (25), a restriction of satisfying the Math $0 \leq V'W$ as the load restriction is imposed on a unique waveform W which is an update value $W^{(m)new}$ of the unique waveform $W^{(m)}$.

V is a column vector of D rows indicating the voltage waveform $V_t$ corresponding to a current waveform as the measurement waveform $Y_t$, and V' is a row vector obtained by transposing the column vector V.

In addition, the update value $W^{new}$ of the unique waveform of Math (25), and the posterior probabilities $\langle S_t'\rangle$ and $\langle S_tS_t'\rangle$ are the same as those described in Math (12).

In other words, the update value $W^{new}$ of the unique waveform is a matrix of D rows and
K×M
columns, and a column vector of (m−1)K+k columns thereof is an update value of a unique waveform $W^{(m)}_k$ of the state #k of the factor #m.

The posterior probability $\langle S_t'\rangle$ is a row vector of columns,
K×M
and a ((m−1)K+k)-th column component thereof is a state probability that the factor #m is in the state #k at the time point t.

The posterior probability $\langle S_tS_t'\rangle$ is a matrix of
K×M
rows and
K×M
columns, and a ((m−1)K+k)-th row and ((n−1)K+k')-th column component thereof is a state probability that the factor #m is in the state #k and another factor #n is in the state #k' at the time point t.

In addition, the unique waveform W of Math (25) is a matrix of D rows and
K×M
columns which is the same as the update value $W^{new}$ of the unique waveform, and a unique waveform W which minimizes X of argmin{X} of the right side of Math (25) is obtained as an update value $W^{new}$ of the unique waveform by using a quadratic programming.

In steps S122 and S123, the same processes as in steps S32 and S33 of FIG. 9 are performed.

Figure 23:
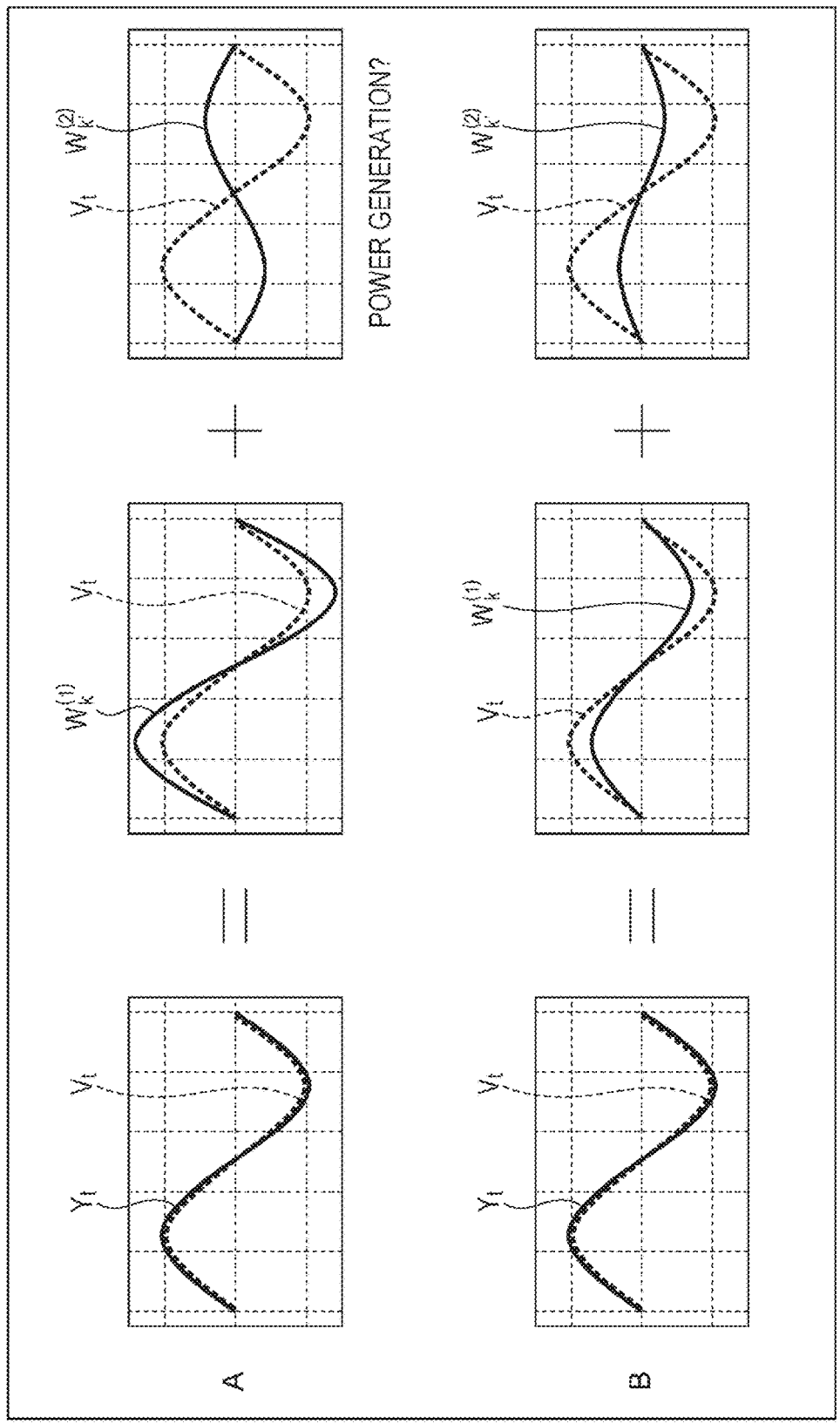
FIG. 23 is a diagram illustrating the load restriction.

FIG. 23 is a diagram illustrating the load restriction.

In other words, A of FIG. 23 shows a unique waveform $W^{(m)}$ as a current waveform obtained through the waveform separation learning without restriction, and B of FIG. 23 shows a unique waveform $W^{(m)}$ as a current waveform obtained through the waveform separation learning under the load restriction.

In addition, in FIG. 23, the number M of factors is two, and a unique waveform $W^{(1)}_k$ of the state #k in which the factor #1 is and a unique waveform $W^{(2)}_{k'}$ of the state #k' in which the factor #2 is are shown.

In A of FIG. 23 and B of FIG. 23, the current waveforms which are the unique waveform $W^{(1)}_k$ of the factor #1 are all in phase with the voltage waveform $V_t$.

However, in A of FIG. 23, since the load restriction is not imposed, the current waveform which is the unique waveform $W^{(2)}_{k'}$ of the factor #2 is in reverse phase to the voltage waveform $V_t$.

On the other hand, in B of FIG. 23, as a result of imposing the load restriction, the current waveform which is the unique waveform $W^{(2)}_{k'}$ of the factor #2 is in phase with the voltage waveform $V_t$.

The measurement waveform $Y_t$ can be separated into the unique waveform $W^{(1)}_k$ of the factor #1 and the unique waveform $W^{(2)}_{k'}$ of the factor #2, shown in A of FIG. 23, and can be separated into the unique waveform $W^{(1)}_k$ of the factor #1 and the unique waveform $W^{(2)}_{k'}$ of the factor #2, shown in B of FIG. 23.

However, in a case where the measurement waveform $Y_t$ is separated into the unique waveform $W^{(1)}_k$ of the factor #1 and the unique waveform $W^{(2)}_{k'}$ of the factor #2, shown in A of FIG. 23, the household electrical appliance #2 corresponding to the factor #2 of which the unique waveform $W^{(2)}_{k'}$ is reverse phase to the voltage waveform $V_t$ generates power, and thus there is concern in which it is difficult to perform appropriate household electrical appliance separation.

On the other hand, when the load restriction is imposed, the measurement waveform $Y_t$ is separated into the unique waveform $W^{(1)}_k$ of the factor #1 and the unique waveform $W^{(2)}_{k'}$ of the factor #2, shown in B of FIG. 23.

The unique waveform $W^{(1)}_k$ and the unique waveform $W^{(2)}_{k'}$ of B of FIG. 23 are all in phase with the voltage waveform $V_t$, and, thus, according to the load restriction, since the household electrical appliance #1 corresponding to the factor #1 and the household electrical appliance #2 corresponding to the factor #2 are all loads consuming powers, it is possible to perform appropriate household electrical appliance separation.

Figure 24:
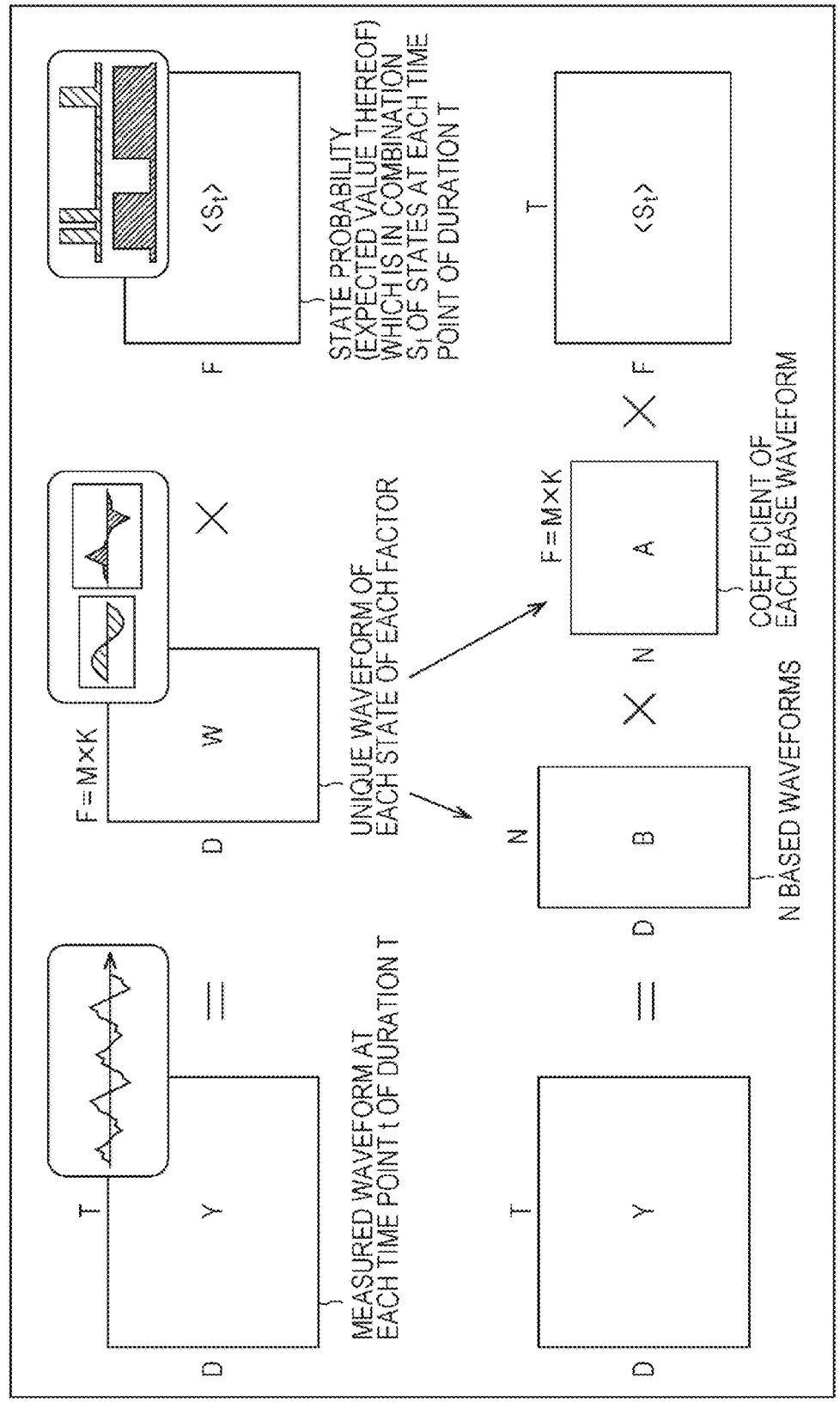
FIG. 24 is a diagram illustrating a base waveform restriction.

FIG. 24 is a diagram illustrating the base waveform restriction.

In FIG. 24, Y is a matrix of D rows and T columns where the measurement waveform $Y_t$ which is a column vector of D rows is arranged from the left to the right in order of the time point t. A t-th column vector of the measurement waveform Y which is a matrix of D rows and T columns is the measurement waveform $Y_t$ at the time point t.

In FIG. 24, W is a matrix of D rows and
K×M
columns in which the unique waveform $W^{(m)}$ of the factor #m which is a matrix of D rows and K columns is arranged in order of the factor #m from the left to the right. A column vector of (m−1)K+k columns of the unique waveform W which is a matrix of D rows and
K×M
columns is a unique waveform $W^{(m)}_k$ of the state #k of the factor #m.

In FIG. 24, F indicates
K×M.

In FIG. 24, $\langle S_e\rangle$ is a matrix of
K×M
rows and T columns obtained by arranging a column vector of $$F=K\times M$$

rows in which the posterior probability $\langle S^{(m)}_t\rangle$ at the time point t which is a column vector of K rows is arranged in order of the factor #m from the top to the bottom, in order of time point t from the left to the right. A ((m−1)K+k)-th row and t-th column component of the posterior probability $\langle S_t\rangle$ which is a matrix of
K×M
rows and T columns is a state probability that the factor #m is in the state #k at the time point t.

In the waveform separation learning, in the FHMM, as shown in FIG. 24, a product
W×<$S_t$>
of the unique waveform W and the posterior probability <$S_t$> is observed as the measurement waveform Y, and thereby the unique waveform W is obtained.

As described above, since the base waveform restriction is a restriction where the unique waveform $W^{(m)}$ which is a current waveform of a current consumed in each operating state of the household electrical appliance #m is represented by one or more combinations of a plurality of waveforms prepared in advance as base waveforms for the household electrical appliance #m, as shown in FIG. 24, the unique waveform W is indicated by a product
B×A
of a predetermined number N of base waveforms B and a predetermined coefficient A, and thereby the unique waveform W is obtained.

Here, when an n-th base waveform B is indicated by $B_n$ among a predetermined number N of the base waveforms B, $B_n$ is a column vector of D rows which has, for example, a sample value of a waveform as a component, and the base waveform B is a matrix of D rows and N columns in which the base waveform $B_n$ which is a column vector of D rows is arranged in order of the index n from the left to the right.

The coefficient A is a matrix of N rows and
K×M
columns, and, an n-th row and ((m−1)K+k)-th column component is a coefficient which is multiplied by the n-th base waveform $B_n$ in representing the unique waveform $W^{(m)}{}_k$ as a combination (superimposition) of N base waveforms $B_1, B_2, \ldots,$ and $B_N$.

Here, when the unique waveform $W^{(m)}{}_k$ is represented by a combination of N base waveforms $B_1$ to $B_N$, for example, if a column vector of N rows which is a coefficient multiplied by the N base waveforms $B_1$ to $B_N$ is indicated by a coefficient $A^{(m)}{}_k$, and a matrix of N rows and K columns in which the coefficient $A^{(m)}{}_k$ is arranged in order of K states #1 to #K of the factor #m from the left to the right is indicated by a coefficient $A^{(m)}$, a coefficient A is a matrix in which the coefficient $A^{(m)}$ is arranged in order of the factor #m from the left to the right.

The base waveform B may be prepared (acquired) by performing base extraction such as, for example, ICA (Independent Component Analysis) or NMF (Non-negative Matrix Factorization) used for an image process, for the measurement waveform Y.

The measurement wave form may include a sum of electric signals of electric apparatus in a house, or may include a group of electric signals of electric apparatus existing in a house (e.g., a group of electrical signals of each electrical apparatus existing in a house).

In addition, in a case where a manufacturer or the like allows a base waveform of a household electrical appliance to be open to public on a home page or the like, the base waveform B may be prepared by accessing the home page.

Figure 25:
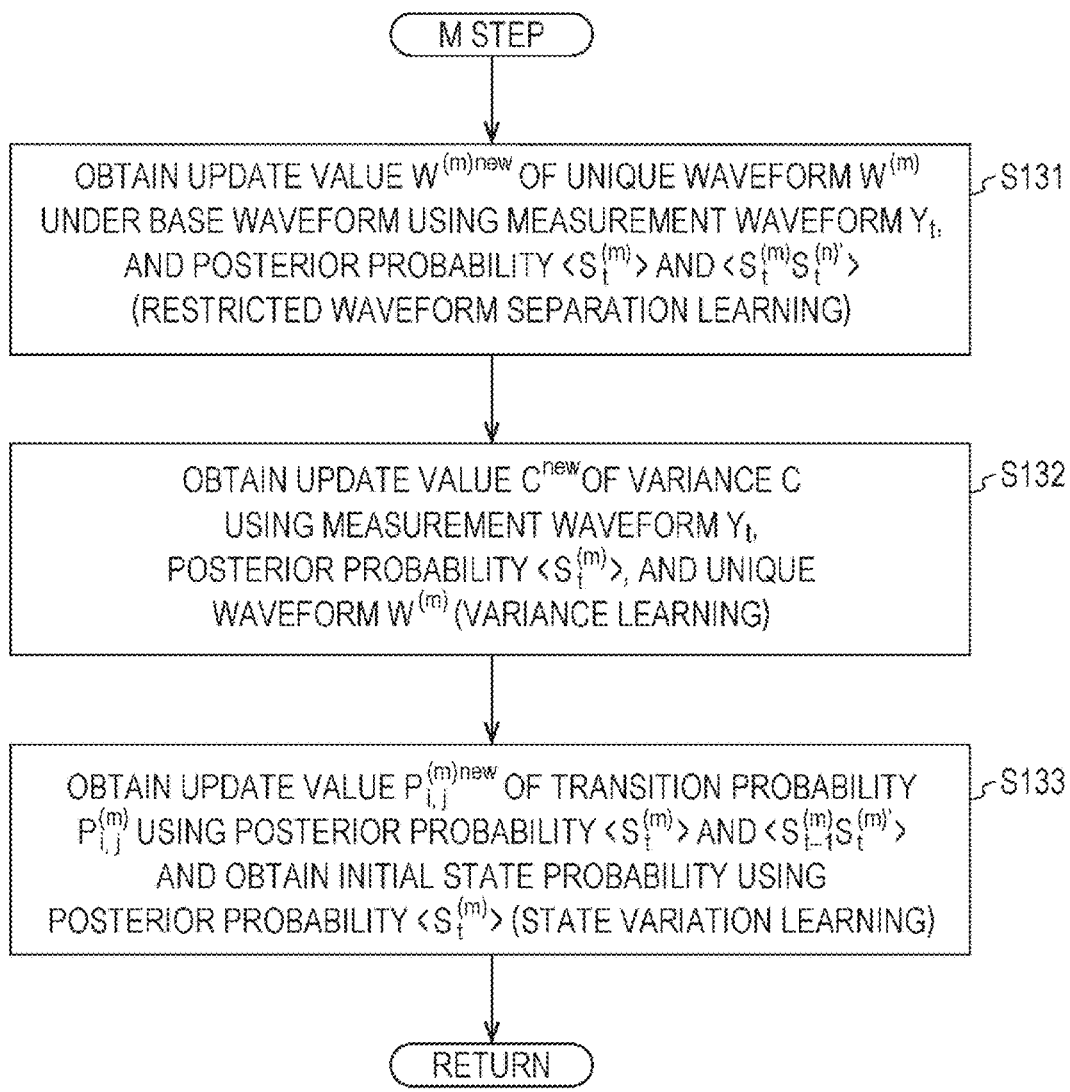
FIG. 25 is a flowchart illustrating a process of the M step of step S14 performed by the monitoring system imposing the base waveform restriction.

FIG. 25 is a flowchart illustrating a process of the M step of step S14 of FIG. 6 performed by the monitoring system of FIG. 21 imposing the base waveform restriction.

In step S131, the restricted waveform separation learning portion 51 performs the waveform separation learning under the base waveform restriction by using the measurement waveform $Y_t$ from the data acquisition unit 11, and the posterior probabilities <$S^{(m)}{}_t$> and <$S^{(m)}{}_t S^{(m)}{}_t$'> from the estimation portion 22, so as to obtain an update value $W^{(m)new}$ of the unique waveform $W^{(m)}$, and updates the unique waveform $W^{(m)}$ stored in the model storage unit 13 to the update value $W^{(m)new}$, and the process proceeds to step S132.

In other words, the restricted waveform separation learning portion 51 solves Math (26) as the waveform separation learning under the base waveform restriction by using a quadratic programming with a restriction, thereby obtaining a coefficient $A^{new}$ for representing the unique waveform W by a combination of the base waveforms B.

[Math. 26]

$$A^{new} = \underset{A}{\operatorname{argmin}}\left\{\sum_{t=1}^{T}|Y_t\langle S'_t\rangle - BA\langle S_t S'_t\rangle|^2\right\} \text{ subject to min } A \quad (26)$$

Here, in Math (26), to indicating the unique waveform W by a product of
B×A
of a predetermined number N of the base waveforms B and a predetermined coefficient A and to minimize the coefficient A (minA) are imposed as the base waveform restriction.

To minimize the coefficient A (minA) means that a value (magnitude) of each component of the matrix of N rows and
K×M
columns which is the coefficient A is minimized, and that the matrix of N rows and
K×M
columns which is the coefficient A becomes as sparse as possible.

The matrix of N rows and
K×M
columns which is the coefficient A becomes as sparse as possible, and thereby the unique waveform $W^{(m)}{}_k$ is indicated by a combination of the base waveforms $B_n$ of which the number is as small as possible.

If the coefficient $A^{new}$ is obtained according to Math (26), the restricted separation learning portion 51 obtains the update value $W^{(m)new}$ of the unique waveform $W^{(m)}$ according to Math (27) by using the coefficient $A^{new}$ and the base waveform B.

[Math.27]

$$W^{new} = BA^{new} \quad (27)$$

In steps S132 and S133, the same processes as in steps S32 and S33 of FIG. 9 are performed.

In a case where current consumed by a household electrical appliance forms waveforms of one or more combinations of base waveforms, a waveform of current which cannot be obtained as current consumed by the household electrical appliance is prevented from being obtained as a unique waveform by imposing the base waveform restriction, and thus it is possible to obtain a unique waveform appropriate for the household electrical appliance.

In addition, in the above description, the load restriction and the base waveform restriction are separately imposed, but the load restriction and the base waveform restriction may be imposed together.

In a case of imposing the load restriction and the base waveform restriction together, in the M step, the restricted separation learning portion 51 solves Math (28) as the waveform separation learning under the load restriction and the base waveform restriction by using a quadratic programming with a restriction, thereby obtaining a coefficient $A^{new}$ for representing the unique waveform W by a combination of the base waveforms B and coefficient $A^{new}$ for making power consumption of a household electrical appliance obtained using the unique waveform W not a negative value.

[Math. 28]

$$A^{new} = \underset{A}{\text{argmin}}\left\{\sum_{t=1}^{T}|Y_t\langle S'_t\rangle - BA\langle S_t S'_t\rangle|^2\right\} \text{ subject to min } A \cdot 0 \leq V'BA \quad (28)$$

In addition, the restricted waveform separation learning portion 51 obtains the update value $W^{(m)new}$ of the unique waveform $W^{(m)}$ by using the coefficient $A^{new}$ obtained according to Math (28) and the base waveform B obtained according to Math (29).

[Math.29]

$$W^{new} = BA^{new} \quad (29)$$

Fifth Embodiment of Monitoring System to which Present Technology is Applied

Figure 26:
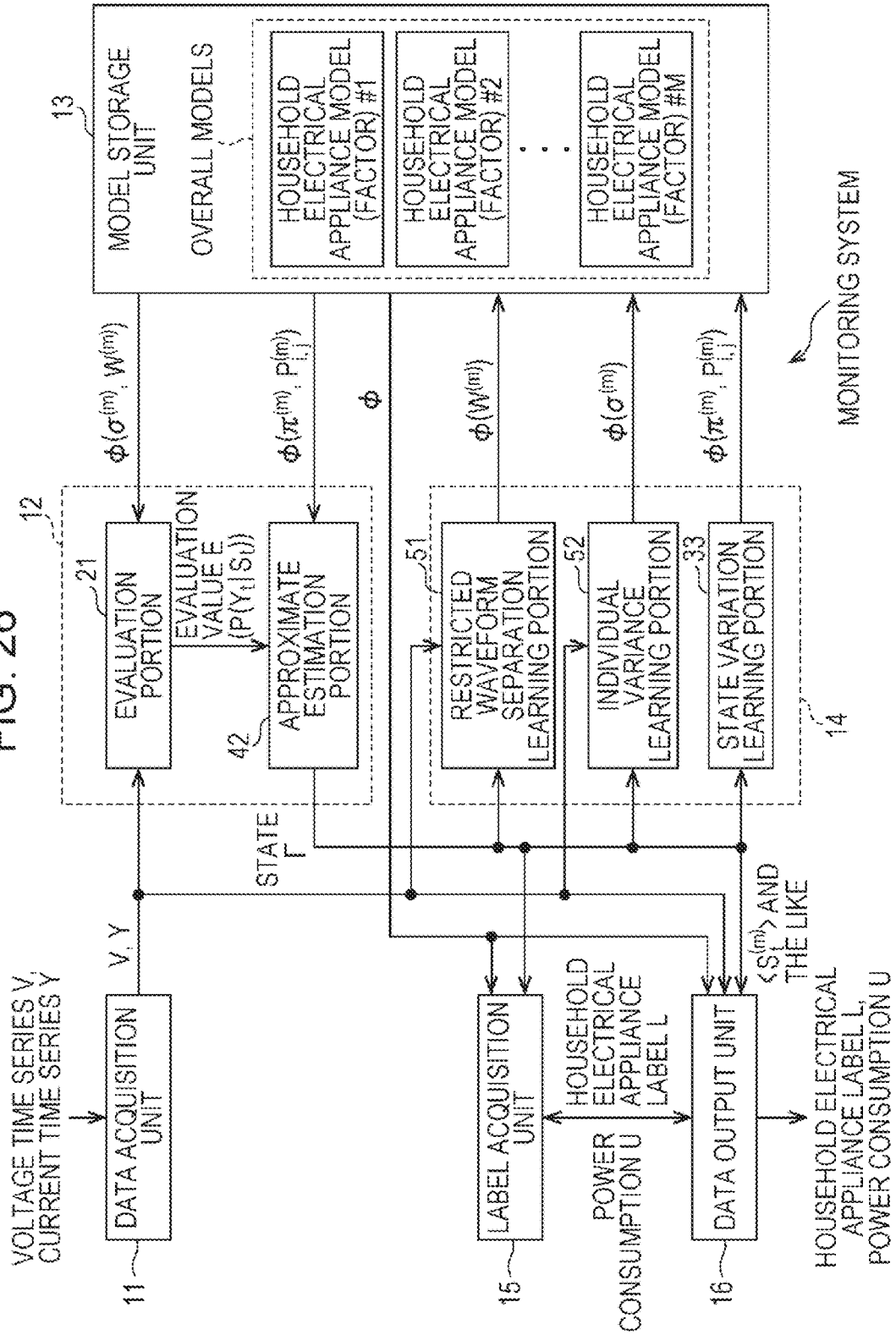
FIG. 26 is a block diagram illustrating a configuration example of the fifth embodiment of the monitoring system to which the present technology is applied.

FIG. 26 is a block diagram illustrating a configuration example of the fifth embodiment of the monitoring system to which the present technology is applied.

In addition, in the figure, portions corresponding to the case of FIG. 3 are given the same reference numerals, and, hereinafter, description thereof will be appropriately omitted.

The monitoring system of FIG. 26 is common to the monitoring system of FIG. 3 in that the data acquisition unit 11 to the data output unit 16 are provided.

However, first, the monitoring system of FIG. 26 is different from the monitoring system of FIG. 3 in that the individual variance learning portion 52 of FIG. 12 is provided instead of the variance learning portion 32 of the model learning unit 14.

Second, the monitoring system of FIG. 26 is different from the monitoring system of FIG. 3 in that the approximate estimation portion 42 of FIG. 15 is provided instead of the estimation portion 22 of the state estimation unit 12.

Third, the monitoring system of FIG. 26 is different from the monitoring system of FIG. 3 in that the restricted separation learning portion 51 of FIG. 21 is provided instead of the waveform separation learning portion 31 of the model learning unit 14.

Therefore, the monitoring system of FIG. 26 performs individual variance learning for obtaining an individual variance $\sigma^{(m)}$ for each factor #m or for each state #k of each factor #m.

In addition, the monitoring system of FIG. 26 performs approximate estimation for obtaining the posterior probability (state probability)$\langle S^{(m)}_t\rangle$ under the state transition restriction where the number of factors of which a state transitions for one time point is restricted.

In addition, the monitoring system of FIG. 26 obtains the unique waveform $W^{(m)}$ through the restricted waveform separation learning.

Further, the monitoring system may perform the individual variance learning, the approximate estimation, and the restricted waveform separation learning independently, may perform the individual variance learning, the approximate estimation, and the restricted waveform separation learning together, or may perform any two of the individual variance learning, the approximate estimation, and the restricted waveform separation learning.

<Application of Monitoring System to Cases Other than Household Electrical Appliance Separation>

As above, although a case where the monitoring system performing learning of the FHMM monitors a current waveform as sum total data and performs household electrical appliance separation has been described, the monitoring system performing learning of the FHMM may be applied to any application where a superposition signal on which one or more signals are superimposed is monitored and a signal superimposed on the superimposition signal is separated.

Figure 27:
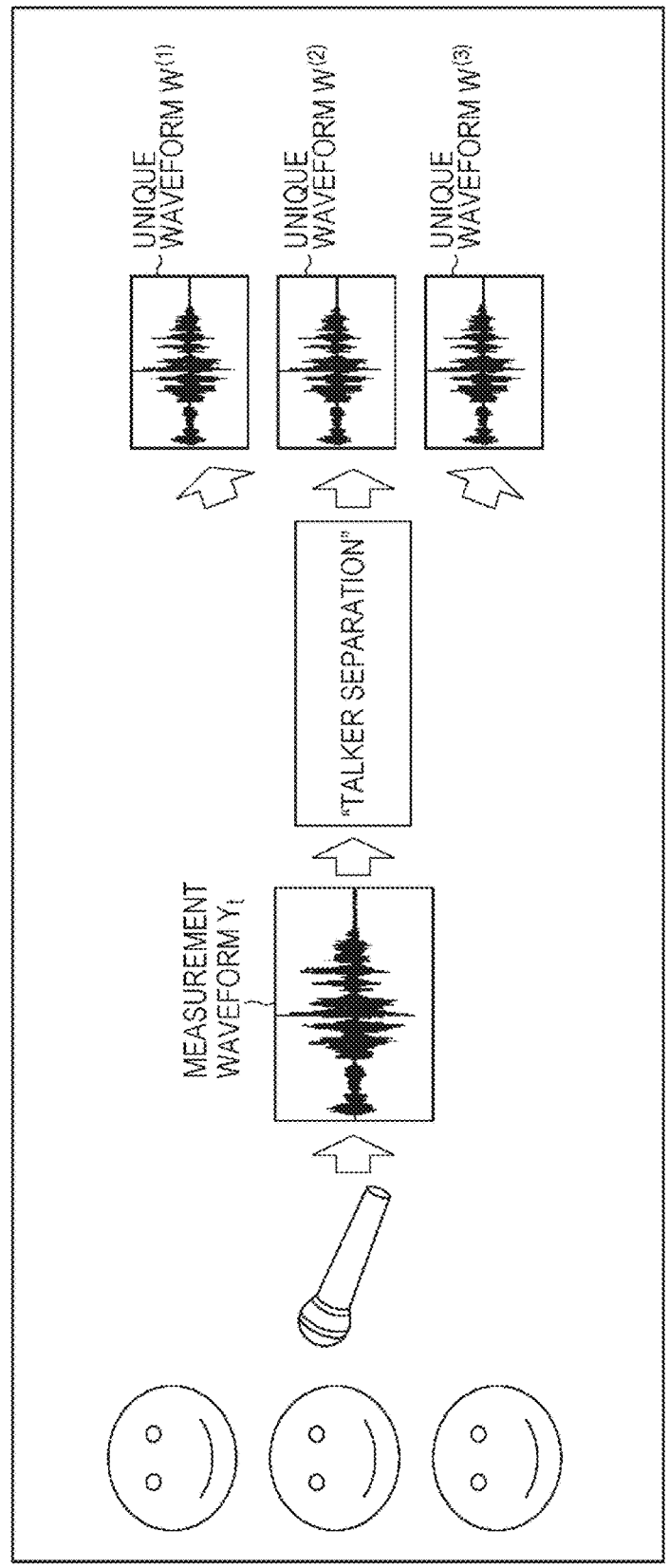
FIG. 27 is a diagram illustrating an outline of talker separation by the monitoring system which performs learning of the FHMM.

FIG. 27 is a diagram illustrating an outline of talker separation by the monitoring system which performs learning of the FHMM.

According to the monitoring system which performs learning of the FHMM, instead of a current waveform used as the measurement waveform $Y_t$ in the household electrical appliance separation, by using an audio signal where a plurality of talkers' utterances are superimposed, it is possible to perform talker separation for separating a voice of each talker from the audio signal where the plurality of talkers' utterances are superimposed.

In a case where the monitoring system performing learning of the FHMM performs the talker separation as well, in the same manner as the case of the household electrical appliance separation, the individual variance learning, the approximate estimation, and the restricted waveform separation learning may be performed.

A case of using the individual variance $\sigma^{(m)}$ for each factor #m, or for each state #k of each factor #m in the talker separation, a representation performance of the FHMM is further improved than a case of using a signal variance C, and thus it is possible to increase accuracy of the talker separation.

In addition, since a probability that all of utterance states of a plurality of talkers are varied for each time is very low, even if a talker of which an utterance state varies is restricted to one or several persons or less for one time point, accuracy of the talker separation is not greatly influenced.

Therefore, in the talker separation, under a state transition restriction where the number of factors of which a state transitions for one time point is restricted to, for example, one or less (a talker of which an utterance state varies is restricted to one person or less), approximate estimation for obtaining the posterior probability $\langle S^{(m)}_t\rangle$ may be performed. In addition, according to the approximate estimation for obtaining the posterior probability $\langle S^{(m)}_t\rangle$ under the state transition restriction, the number of combinations z of states in which the posterior probability $\gamma_{t,z}$ used to obtain the posterior probability $\langle S^{(m)}_t\rangle$ is required to be strictly calculated is considerably reduced, and thus a calculation amount can be notably reduced.

In addition, in the talker separation, the individual waveform $W^{(m)}$ is a waveform of a person's voice, and thus a frequency component exists in a frequency band which can be taken by a person's voice. Therefore, in restricted waveform separation learning performed in the talker separation, a restriction distinctive to a person' voice may be employed in which a frequency component of the individual waveform $W^{(m)}$ is restricted to a frequency component within a frequency band which can be taken by a person's voice. In this case, a unique waveform $W^{(m)}$ which is appropriate as a waveform of a person' voice can be obtained.

Further, in the talker separation, as a restriction imposed on the restricted waveform separation learning, for example, a base waveform restriction may be employed in the same manner as a case of the household electrical appliance separation.

Sixth Embodiment of Monitoring System to which Present Technology is Applied

Figure 28:
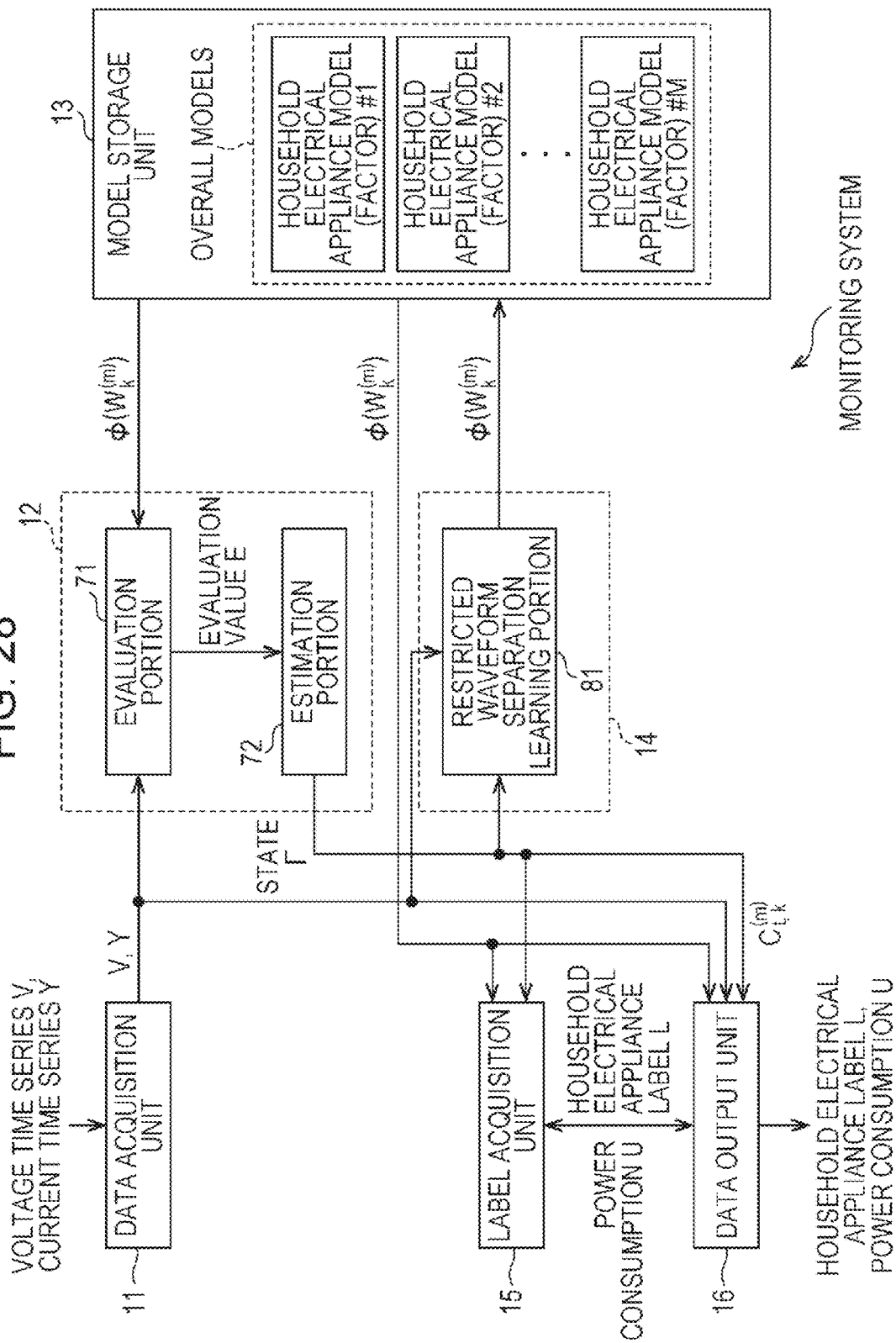
FIG. 28 is a block diagram illustrating a configuration example of the sixth embodiment of the monitoring system to which the present technology is applied.

FIG. 28 is a block diagram illustrating a configuration example of the sixth embodiment of the monitoring system to which the present technology is applied.

In addition, in the figure, portions corresponding to the case of FIG. 3 are given the same reference numerals, and, hereinafter, description thereof will be appropriately omitted.

The monitoring system of FIG. 28 is common to the monitoring system of FIG. 3 in that the data acquisition unit 11 to the data output unit 16 are provided.

However, first, the monitoring system of FIG. 28 is different from the monitoring system of FIG. 3 in that an evaluation portion 71 and an estimation portion 72 are respectively provided instead of the evaluation portion 21 and the estimation portion 22 in the state estimation unit 12.

Second, the monitoring system of FIG. 28 is different from the monitoring system of FIG. 3 in that a restricted separation learning portion 81 is provided instead of the waveform separation learning portion 31, and the variance learning portion 32 and the state variation learning portion 33 are not provided, in the model learning unit 14.

The monitoring system of FIG. 3 performs the household electrical appliance separation by using the FHMM as the overall models
φ,
but, the monitoring system of FIG. 28 performs the household electrical appliance separation by using, for example, a model (hereinafter, also referred to as a waveform mode) which has only the unique waveform $W^{(m)}$ as a model parameter, as the overall models
φ
instead of the FHMM.

Therefore, in FIG. 28, the waveform mode is stored as the overall models
φ
in the model storage unit 13. Here, the waveform model has the unique waveform $W^{(m)}$ as a model parameter, and, in this waveform model, a single unique waveform $W^{(m)}$ corresponds to a household electrical appliance model #m.

The state estimation unit 12 has the evaluation portion 71 and the estimation portion 72, and performs state estimation for estimating operating states of a plurality of M household electrical appliances #1, #2, . . . , and #m by using the measurement waveform $Y_t$ from the data acquisition unit 11, and the waveform model stored in the model storage unit 13.

In other words, the evaluation portion 71 obtains an evaluation value E where an extent that a current waveform Y supplied from the data acquisition unit 11 is observed is evaluated so as to be supplied to the estimation portion 72, in each household electrical appliance model #m forming the waveform model as the overall models
φ
stored in the model storage unit 13.

The estimation portion 72 estimates an operating state $C^{(m)}_{t,k}$ at the time point t of each household electrical appliance indicated by each household electrical appliance model #m by using the evaluation value E supplied from the evaluation portion 71, for example, according to an integer programming, so as to be supplied to the model learning unit 14, the label acquisition unit 15, and the data output unit 16.

Here, the estimation portion 72 solve an integer programming program of Math (30) according to the integer programming and estimates the operating state $C^{(m)}_{t,k}$ of the household electrical appliance #m.

[Math. 30]

$$\text{minimize} E = \left| Y_t - \sum_{m=1}^{M} \sum_{k=1}^{K(m)} W_k^{(m)} \cdot C_{t,k}^{(m)} \right| \text{ subject to } 0 \leq C_{t,k}^{(m)} \in_{integer} \quad (30)$$

Here, in Math (30), E indicates an error of the measurement waveform $Y_t$ and a current waveform)
$\Sigma\Sigma W^{(m)}_k C^{(m)}_{t,k}$
which is sum total data observed in the waveform model as the overall models
φ,
and the estimation portion 72 obtains an operating state $C^{(m)}_{t,k}$ which minimizes the error E.

In addition, in Math (30), the unique waveform $W^{(m)}_k$ indicates a unique waveform which is a current waveform unique to the operating state $C^{(m)}_{t,k}$ of the factor #m, and is a column vector of D rows in the same manner as the measurement waveform $Y_t$.

In addition, in Math (30), K(m) indicates the number (the number of kinds) of operating state $C^{(m)}_{t,k}$ of the household electrical appliance #m.

The operating state $C^{(m)}_{t,k}$ is an integer of 0 or more and is a scalar value, and indicates an operating state of the household electrical appliance #m at the time point t. The operating state $C^{(m)}_{t,k}$ corresponds to, for example, a mode (setting) of the household electrical appliance #m, and, it is assumed that a mode where the household electrical appliance #m is an ON state is restricted to one or less.

Math (31) indicates that a mode where the household electrical appliance #m is an ON state is restricted to one or less.

[Math.31]

$$c^{(m)}_{t,1} + c^{(m)}_{t,2} + \ldots + c^{(m)}_{t,K(m)} \leq 1 \quad (31)$$

According to Math (31), a value which the operating state $C^{(m)}_{t,k}$ which is an integer of 0 or more can take is 0 or 1.

In addition, a method of estimating an operating state of a household electrical appliance according to the integer programming is disclosed in, for example, "Non-intrusive Appliance Load Monitoring System", Shinkichi Inagaki, Tsukasa Egami, Tatsuya Suzuki (Nagoya University), Hisahide Nakamura, Koichi Ito (TOENEC CORP.), The 42nd Workshop on Discrete Event Systems of the Society of Instrument and Control Engineers, pp. 33-38, Dec. 20, 2008, Osaka University.

As above, in a case of the estimation portion 72 estimates the operating state $C^{(m)}_{t,k}$ of the household electrical appliance #m by solving Math (30), the evaluation portion 71 obtains an error E of Math (30) by using the measurement waveform $Y_t$ supplied from the data acquisition unit 11 and the unique waveform $W^{(m)}_k$ of the waveform model stored in the model storage unit 13, so as to be supplied to the estimation portion 72 as an evaluation value E.

In the model learning unit 14, in the same manner as the restricted waveform separation learning portion 51 of FIG. 21, the restricted waveform separation learning portion 81 performs the waveform separation learning under a predetermined restriction (waveform separation learning with restriction) distinctive to a household electrical appliance so as to prevent the unique waveform $W^{(m)}_k$ as a current waveform which is inappropriate as a current waveform of a household electrical appliance from being obtained, and obtains the unique waveform $W^{(m)}_k$ as an accurate current waveform of a household electrical appliance.

That is to say, the restricted waveform separation learning portion 81 performs the waveform separation learning, for example, under the load restriction by using the measurement waveform $Y_t$ from the data acquisition unit 11, and the operating state $C^{(m)}_{t,k}$ of the household electrical appliance #m from the estimation portion 72, so as to obtain an update value $W^{(m)new}_k$ of the unique waveform $W^{(m)}_k$, and updates the unique waveform $W^{(m)}_k$ stored in the model storage unit 13 to the update value $W^{(m)new}_k$.

In other words, the restricted waveform separation learning portion 81 solves the quadratic programming problem of Math (32) as the waveform separation learning under the load restriction according to the quadratic programming, thereby obtaining the update value $W^{(m)new}_k$ of the unique waveform $W^{(m)}_k$.

[Math. 32]

$$W^{new} = \underset{W}{\operatorname{argmin}} \left\{ \sum_{t=1}^{T} |Y_t - W \cdot C_t|^2 \right\} \text{ subject to } 0 \leq V'W \quad (32)$$

Here, in Math (32), a restriction of satisfying the math $0 \leq V'W$ as the load restriction is imposed on a unique waveform W which is an update value $W^{(m)new}_k$ of the unique waveform $W^{(m)}_k$.

In Math (32), V is a column vector of D rows indicating the voltage waveform $V_t$ corresponding to a current waveform as the measurement waveform $Y_t$, and V' is a row vector obtained by transposing the column vector V.

In addition, if a mode of the household electrical appliance #m of which the operating state $C^{(m)}_{t,k}$ indicates ON and OFF is a mode #k, in Math (32), W is a column vector of (m−1)K+k columns and is a matrix of D rows and K×M columns which is a unique waveform of the mode #k of the household electrical appliance #m (is turned on). In addition, here, K indicates the maximum value of, for example, K(1), K(2), . . . , and K(M).

The update value $W^{new}$ of the unique waveform is a matrix of D rows and K×M columns, and a column vector of (m−1)K+k columns thereof is an update value of a unique waveform $W^{(m)}_k$ of the state #k of the factor #m.

Further, in Math (32), $C_t$ is a column vector of K×M rows in which a component of the (m−1)K+k row is in the operating state $C^{(m)}_{t,k}$.

Further, the restricted waveform separation learning portion 81 may impose other restrictions. In other words, for example, in the same manner as the restricted waveform separation learning portion 51 of FIG. 21, the restricted waveform separation learning portion 81 may impose a base waveform restriction instead of the load restriction or may impose both the load restriction and the base waveform restriction.

Figure 29:
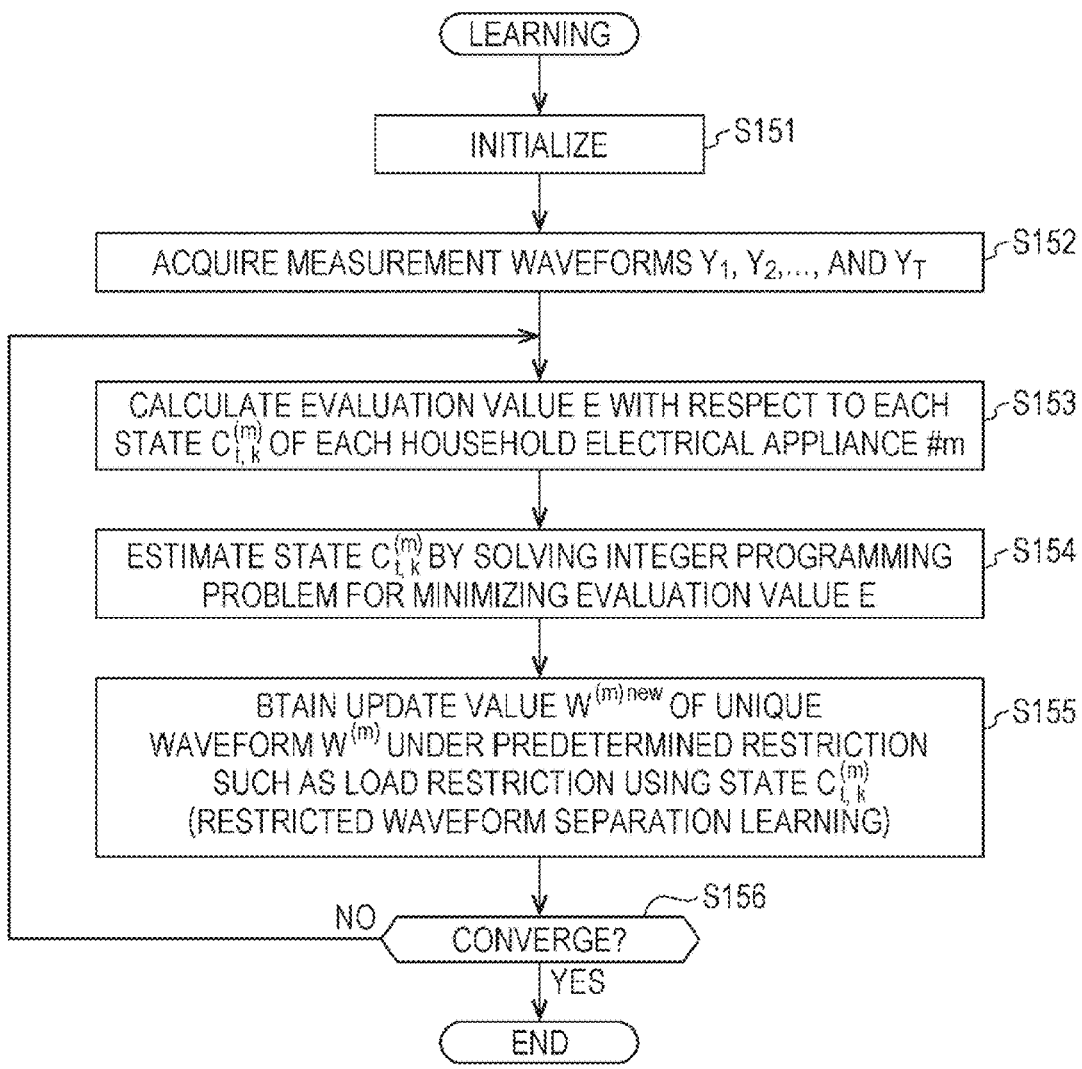
FIG. 29 is a flowchart illustrating a process of model learning (learning process) performed by the monitoring system.

FIG. 29 is a flowchart illustrating a process of learning (learning process) of a waveform model performed by the monitoring system of FIG. 28.

In step S151, the model learning unit 14 initializes the unique waveform $W^{(m)}_k$ as the model parameter

ϕ of the overall models stored in the model storage unit 13, and the process proceeds to step S152.

Here, the respective components of a column vector of D rows which is the unique waveform $W^{(m)}_k$ are initialized using, for example, random numbers.

In step S152, the data acquisition unit 11 acquires current waveforms corresponding to a predetermined time T and supplies current waveforms at the respective time points t=1, 2, . . . , and T to the state estimation unit 12 and the model learning unit 14 as measurement waveforms $Y_1, Y_2, \ldots,$ and $Y_T$, and the process proceeds to step S153.

Here, the data acquisition unit 11 also acquires voltage waveforms along with the current waveforms at the time points t=1, 2, . . . , and T. The data acquisition unit 11 supplies the voltage waveforms at the time points t=1, 2, . . . , and T to the data output unit 16.

In the data output unit 16, the voltage waveforms from the data acquisition unit 11 are used to calculate power consumption in the information presenting process (FIG. 10).

In step S153, the evaluation portion 71 of the state estimation unit 12 obtains an error E which is an evaluation value E of Math (30) for obtaining the operating state $C^{(m)}_{t,k}$ of each household electrical appliance #m by using the measurement waveforms $Y_1$ to $Y_T$ from the data acquisition unit 11, and the unique waveform $W^{(m)}_k$ of the waveform model stored in the model storage unit 13.

In addition, the evaluation portion 71 supplies the error E to the estimation portion 72, and the process proceeds from step S153 to step S154.

In step S154, the estimation portion 72 estimates the operating state $C^{(m)}_{t,k}$ of each household electrical appliance #m by minimizing the error E of Math (30) from the evaluation portion 71, so as to be supplied to the model learning unit 14, the label acquisition unit 15, and the data output unit 16, and the process proceeds to step S155.

In step S155, the restricted waveform separation learning portion 81 of the model learning unit 14 performs the waveform separation learning under a predetermined restriction such as the load restriction by using the measurement waveform $Y_t$ supplied from the data acquisition unit 11 and the operating state $C^{(m)}_{t,k}$ of the household electrical appliance #m supplied from the estimation portion 72, thereby obtaining an update value $W^{(m)new}_k$ of the unique waveform $W^{(m)}_k$.

In other words, the restricted waveform separation learning portion 81 solves Math (32) as the waveform separation learning, for example, under a load restriction, thereby obtaining the update value $W^{(m)new}_k$ of the unique waveform $W^{(m)}_k$ In addition, the restricted waveform separation learning portion 81 updates the unique waveform $W^{(m)}_k$ stored in the model storage unit 13 to the update value $W^{(m)new}_k$ of the unique waveform $W^{(m)}_k$, and the process proceeds from step S155 to step S156.

In step S156, the model learning unit 14 determines whether or not a convergence condition of the model parameter

ϕ is satisfied.

Here, as the convergence condition of the model parameter

φ, for example, a condition in which the estimation of the operating state $C^{(m)}_{t,k}$ in step S154 and the update of unique waveform $W^{(m)}_k$ through the restricted waveform separation learning in step S155 are repeatedly performed a predetermined number of times set in advance, or a condition that a variation amount in the error E of Math (30) before update of the model parameter

φ and after update thereof is in a threshold value set in advance, may be employed.

In step S156, if it is determined that the convergence condition of the model parameter

φ is not satisfied, the process returns to step S153, and, thereafter, the processes in steps S153 to S156 are repeatedly performed.

The processes in steps S153 to S156 are repeatedly performed, thus the estimation of the operating state $C^{(m)}_{t,k}$ in step S154 and the update of unique waveform $W^{(m)}_k$ through the restricted waveform separation learning in step S155 are alternately repeated, and thereby accuracy of an operating state $C^{(m)}_{t,k}$ obtained in step S154 and (an update value of) a unique waveform $W^{(m)}_k$ obtained in step S155 is increased.

Thereafter, if it is determined that the convergence condition of the model parameter

φ is satisfied in step S156, the learning process finishes.

In addition, the state estimation unit 12 may estimate an operating state of a household electrical appliance using any other methods instead of the integer programming or the FHMM.

<Description of Computer to which Present Technology is Applied>

Meanwhile, the above-described series of processes may be performed by hardware or software. When a series of processes is performed by the software, a program constituting the software is installed in a general purpose computer or the like.

Figure 30:
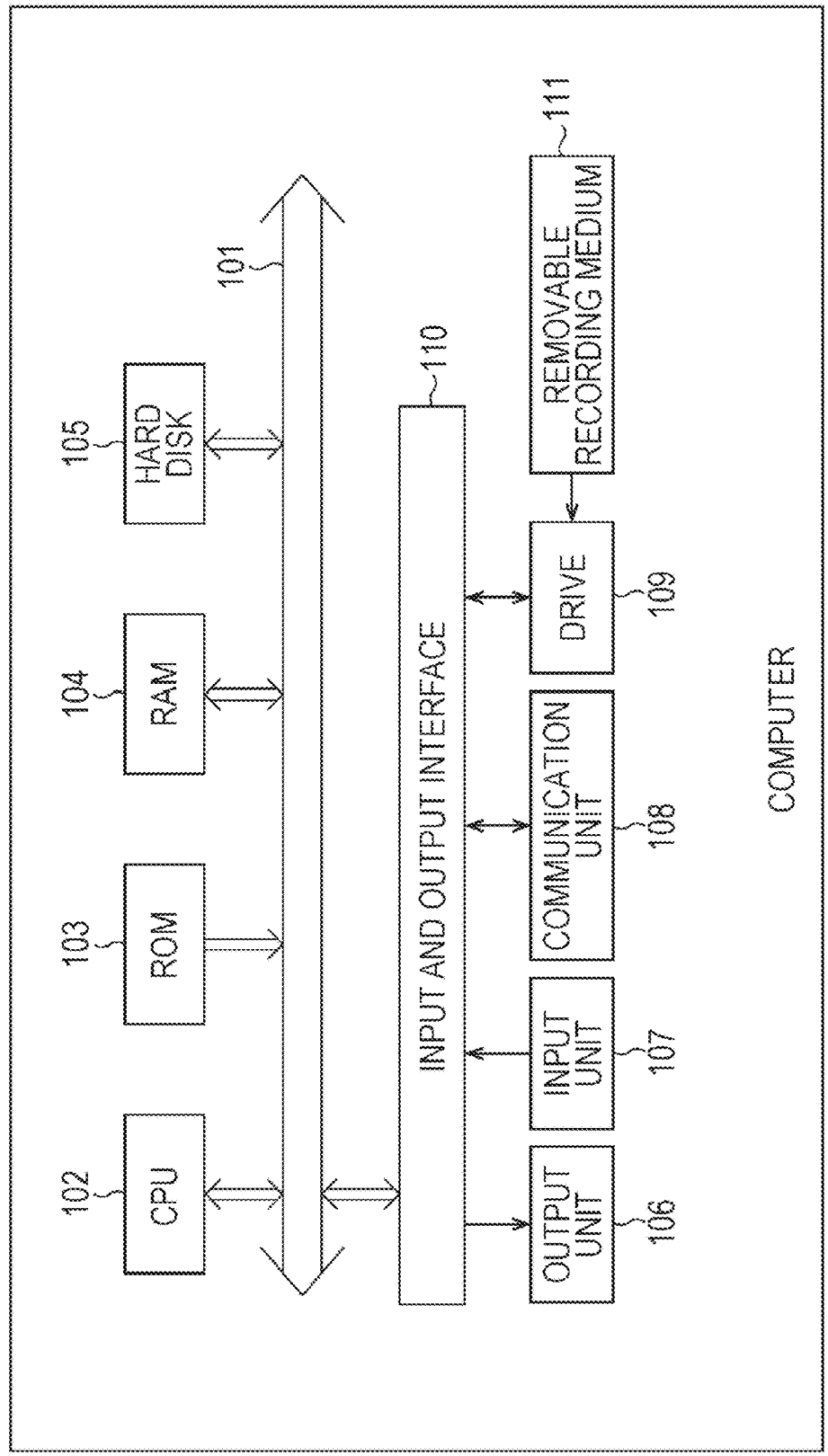
FIG. 30 is a block diagram illustrating a configuration example of an embodiment of a computer to which the present technology is applied.

Therefore, FIG. 30 shows a configuration example of an embodiment of a computer in which the program for executing the above-described series of processes is installed.

The program may be recorded on a hard disk 105 or a ROM 103 which is a recording medium embedded in the computer.

Alternatively, the program may be stored on a removable recording medium 111. The removable recording medium 111 may be provided as so-called package software. Here, the removable recording medium 111 includes, for example, a flexible disc, a CD-ROM (Compact Disc Read Only Memory), an MO (Magneto Optical) disc, a DVD (Digital Versatile Disc), a magnetic disk, a semiconductor memory, and the like.

In addition, the program may be installed into the computer from the removable recording medium 111 as described above, and further may be downloaded to the computer via a communication network or a broadcasting network and installed in the hard disk 105. That is to say, the program may be transmitted to the computer, for example, in a wireless manner, from a download site via an artificial satellite for digital satellite broadcasting, or may be transmitted to the computer in a wired manner via a network such as a LAN (Local Area Network) or the Internet.

The computer has a CPU (Central Processing Unit) 102 embedded therein, and the CPU 102 is connected to an input and output interface 110 via a bus 101.

When a command is input by a user via the input and output interface 110 through an operation of an input unit 107 or the like, the CPU 102 executes a program stored in a ROM (Read Only Memory) 103 in response thereto. Alternatively, the CPU 102 loads a program stored in the hard disk 105 to a RAM (Random Access Memory) 104 so as to be executed.

Thereby, the CPU 102 performs the process according to the above-described flowchart or the process performed by the above-described configuration of the block diagram. In addition, the CPU 102 outputs or transmits the processed result from an output unit 106 or a communication unit 108 via, for example, the input and output interface 110, or records the result on the hard disk 105, as necessary.

In addition, the input unit 107 includes a keyboard, a mouse, a microphone, or the like. Further, the output unit 106 includes an LCD (Liquid Crystal Display), a speaker, or the like.

Here, in the present specification, a process performed by the computer according to the program is not necessarily performed in a time series according to an order described as a flowchart. In other words, the process performed by the computer according to the program also includes a process (for example, a parallel process or a process using objects) performed in parallel or separately.

In addition, the program may be processed by a single computer (processor) or may be processed so as to be distributed by a plurality of computers. Further, the program may be transmitted to a remote computer and be executed.

In addition, in the present specification, the system indicates an assembly of a plurality of constituent elements (devices, modules (components), or the like), and whether or not all the constituent elements are in the same casing is not important. Therefore, both a plurality of devices which are accommodated in separate casings and are connected to each other via a network, and a single device where a plurality of modules are accommodated in a single casing are a system.

In addition, embodiments of the present technology are not limited to the above-described embodiments but may have various modifications without departing from the scope of the present technology.

For example, the present technology may employ cloud computing where a single function is distributed to a plurality of devices via a network and is processed in cooperation.

In addition, each step described in the above flowchart may be not only executed by a single device, but may be also distributed to a plurality of devices and be executed.

Further, in a case where a single step includes a plurality of processes, a plurality of processes included in the step may be not only executed by a single device, but may be also distributed to a plurality of devices and be executed.

In addition, the present technology may have the following configurations.

(A1) A method for monitoring an electrical device, comprising: obtaining data representing a sum of electrical signals of two or more electrical devices, the two or more electrical devices including a first electrical device; processing the data with a Factorial Hidden Markov Model (FHMM) to produce an estimate of an electrical signal of the first electrical device; and outputting the estimate of the electrical signal of the first electrical device, wherein the FHMM has a factor corresponding to the first electrical device, the factor having three or more states.

(A2) The method of (A1), wherein: the three or more states of the factor correspond to three or more respective electrical signals of the first electrical device in three or more respective operating states of the first electrical device.

(A3) The method of any of (A1), further comprising obtaining one or more parameters of the FHMM from a model storage unit.

(A4) The method of any of (A1), wherein the data comprises a time series of current values and/or a time series of voltage values.

(A5) The method of any of (A1), wherein the electrical signal is a current signal or a power signal.

(A6) The method of any of (A1), further comprising: calculating a variance of the data representing the sum of the electrical signals; and using the calculated variance as a parameter of the FHMM.

(A7) The method of any of (A1), wherein: the FHMM has a second factor corresponding to a second electrical device of the two or more electrical devices; and the method further comprises: processing the data with the FHMM to produce a second estimate of a second electrical signal of the second electrical device; calculating a first individual variance of the estimate of the electrical signal of the first electrical device, and using the first individual variance as a parameter of the factor corresponding to the first electrical device; and calculating a second individual variance of the second estimate of the second electrical signal of the second electrical device, and using the second individual variance as a parameter of the second factor corresponding to the second electrical device.

(A8) The method of any of (A1), further comprising: restricting the FHMM such that a number of factors of the FHMM which undergo state transition at a same time point is less than a threshold number.

(A9) The method of any of (A1), further comprising imposing a restriction on the estimate of the electrical signal of the first electrical device.

(A10) The method of (A9), wherein: the electrical signal is a power signal; and imposing the restriction comprises restricting the estimate of the power signal of the first electrical device to have a non-negative value.

(A11) The method of (A9), wherein imposing the restriction comprises restricting the electrical signal to correspond to one or more combinations of a plurality of predetermined base electrical signals.

(A12) The method of any of (A1), wherein processing the data with the Factorial Hidden Markov Model (FHMM) comprises using cloud computing to process at least a portion of the data.

(A13) The method of any of (A1), wherein outputting the estimate of the electrical signal comprises displaying the estimate of the electrical signal.

(A14) The method of any of (A1), wherein outputting the estimate of the electrical signal comprises transmitting the estimate of the electrical system to a remote computer.

(A15) The method of (A1), wherein the estimate of the electrical signal is an estimate of a voltage signal.

(A16) The method of any of (A1), wherein the method is performed by a smart meter.

(B1) A monitoring apparatus, comprising: a data acquisition unit for obtaining data representing a sum of electrical signals of two or more electrical devices, the two or more electrical devices including a first electrical device; a state estimation unit for processing the data with a Factorial Hidden Markov Model (FHMM) to produce an estimate of an operating state of the first electrical device, the FHMM having a factor corresponding to the first electrical device, the factor having three or more states; and a data output unit for outputting an estimate of an electrical signal of the first electrical device, the estimate of the electrical signal being based at least in part on the estimate of the operating state of the first electrical device.

(B2) The monitoring apparatus of (B1), further comprising: a model storage unit for storing the factor of the FHMM, wherein: the three or more states of the factor correspond to three or more respective electrical signals of the first electrical device in three or more respective operating states of the first electrical device.

(B3) The monitoring apparatus of any of (B1), further comprising a model storage unit for storing one or more parameters of the FHMM.

(B4) The monitoring apparatus of any of (B1), wherein the data comprises a time series of current values and/or a time series of voltage values.

(B5) The monitoring apparatus of any of (B1), wherein the estimate of the electrical signal is an estimate of a current signal or a power signal.

(B6) The monitoring apparatus of any of (B1), further comprising a model learning unit for updating a parameter of the FHMM, wherein updating the parameter of the FHMM includes: calculating a variance of the data representing the sum of the electrical signals, and using the calculated variance as the parameter.

(B7) The monitoring apparatus of any of (B1), further comprising a model learning unit for updating one or more parameters of the FHMM, wherein: the state estimation unit is for processing the data with the FHMM to produce a second estimate of a second electrical signal of a second of the two or more electrical devices, the FHMM having a second factor corresponding to the second electrical device; and updating the one or more parameters of the FHMM includes: calculating a first individual variance of the estimate of the electrical signal of the first electrical device, and using the first individual variance as a parameter of the factor corresponding to the first electrical device; and calculating a second individual variance of the second estimate of the second electrical signal of the second electrical device, and using the second individual variance as a parameter of the second factor corresponding to the second electrical device.

(B8) The monitoring apparatus of any of (B1), wherein processing the data comprises restricting the FHMM such that a number of factors of the FHMM which undergo state transition at a same time point is less than a threshold number.

(B9) The monitoring apparatus of (B1), wherein processing the data comprises imposing a restriction on the estimate of the electrical signal of the first electrical device.

(B10) The monitoring apparatus of (B9), wherein: the electrical signal is a power signal; and imposing the restriction comprises restricting the estimate of the power signal of the first electrical device to have a non-negative value.

(B11) The monitoring apparatus of (B9), wherein imposing the restriction comprises restricting the electrical signal to correspond to one or more combinations of a plurality of predetermined base electrical signals.

(B12) The monitoring apparatus of any of (B1), wherein processing the data with the Factorial Hidden Markov Model (FHMM) comprises using cloud computing to process at least a portion of the data.

(B13) The monitoring apparatus of any of (B1), wherein outputting the estimate of the electrical signal comprises displaying the estimate of the electrical signal.

(B14) The monitoring apparatus of any of (B1), further comprising a communication unit, wherein outputting the estimate of the electrical signal comprises transmitting the estimate of the electrical system to a remote computer.
(B15) The monitoring apparatus of (B1), wherein the estimate of the electrical signal is an estimate of a voltage signal.
(B16) The monitoring apparatus of any of (B1), wherein the monitoring apparatus is a smart meter.
(C1) A monitoring apparatus, comprising: a data acquisition unit for obtaining data representing a sum of electrical signals of two or more electrical devices, the two or more electrical devices including a first electrical device; a state estimation unit for processing the data with a Factorial Hidden Markov Model (FHMM) to produce an estimate of an operating state of the first electrical device, the FHMM having a factor corresponding to the first electrical device, the factor having three or more states; a model learning unit for updating one or more parameters of the FHMM, wherein updating the one or more parameters of the FHMM comprises performing restricted waveform separation learning; and a data output unit for outputting an estimate of an electrical signal of the first electrical device, the estimate of the electrical signal being based at least in part on the estimate of the operating state of the first electrical device.
(C2) The monitoring apparatus of (C1), wherein performing restricted waveform separation learning comprises imposing a restriction distinctive to the first electrical device on a value of a corresponding parameter of the FHMM.
(C3) The monitoring apparatus of (C2), wherein the restriction comprises a load restriction.
(C4) The monitoring apparatus of any of (C2), wherein the restriction comprises a base waveform restriction.
(D1) A data processing apparatus, comprising:
a data acquisition unit configured to obtain data representing a mixed signal of two or more time series signals;
a state estimation unit configure to estimate a parameter for modeling a time series signal with a stochastic dynamics model;
wherein the state estimation unit is configured to estimate the parameter under a specific restriction.
(D2) A data processing apparatus of (D1),
wherein the stochastic dynamics model is FHMM (Factorial Hidden Markov Model).
(D3) A data processing apparatus of (D1),
wherein the state estimation unit is configured to estimate the parameter under the specific restriction by controlling the data to be additive data of positive factors.
(D4) A data processing apparatus of (D1),
wherein the state estimation unit is configured to estimate the parameter under the specific constraint controlling at least one state of factors to output zero signals.
(D5) A data processing apparatus of (D2),
wherein the state estimation unit is configured to estimate the parameter under the specific constraint controlling to minimize the probability of selecting non-zero state of factors.
(D6) A data processing apparatus of (D1),
wherein the state estimation unit is configured to estimate the parameter under the specific restriction by restricting the FHMM such that a number of factors of the FHMM (Factorial Hidden Markov Model) which can undergo state transition at a same time point is less than a threshold number.
(D7). A data processing apparatus of (D1),
wherein the state estimation unit is configured to estimate the parameter under the specific restriction by restricting the estimated parameter to one or more combinations of a plurality of predetermined parameters.
(D8) A data processing apparatus of (D1),
wherein the state estimation unit is configured to estimate the parameter under the specific restriction by restricting the estimated parameter to one or more combinations of a plurality of time series signals.
(D9) The data processing apparatus of (D2), wherein the state estimation unit is configured to estimate the parameter under the specific restriction by:
calculating a variance of the data representing the mixed signal of the two or more time series signals; and
using the calculated variance as a parameter of the FHMM (Factorial Hidden Markov Model).
(E1) A data processing apparatus including a state estimation unit that performs state estimation for obtaining a state probability which is in a state of each factor of an FHMM (Factorial Hidden Markov Model) by using sum total data regarding a sum total of current consumed by a plurality of electrical appliances; and a model learning unit that performs learning of the FHMM of which each factor has three or more states by using the state probability.
(E2) The data processing apparatus set forth in (E1), wherein the FHMM includes as model parameters
a unique waveform unique to each state of each factor, used to obtain an average value of observation values of the sum total data observed in combinations of states of the respective factors; a variance of observation values of the sum total data observed in the combinations of states of the respective factors; an initial state probability that a state of each factor is an initial state; and a transition probability that a state of each factor transitions, and wherein the model learning unit includes a waveform separation learning portion that performs waveform separation learning for obtaining the unique waveform; a variance learning portion that performs variance learning for obtaining the variance; and a state variation learning portion that performs state variation learning for obtaining the initial state probability and the transition probability.
(E3) The data processing apparatus set forth in (E2), wherein the variance learning portion obtains an individual variance for each factor, or an individual variance for each state of each factor.
(E4) The data processing apparatus set forth in (E2) or (E3), wherein the state estimation unit obtains the state probability under a state transition restriction where the number of factors of which a state transitions for one time point is restricted.
(E5) The data processing apparatus set forth in (E4), wherein the state estimation unit obtains an observation probability that the sum total data is observed in the combinations of states of the respective factors by using the average value and the variance; a forward probability $\alpha_{t,z}$ that the sum total data Y1, Y2, . . . , and Yt is observed and which is in a combination z of states of the respective factors at the time point t, and a backward probability $\beta_{t,z}$ which is in the combination z of states of the respective factors at the time point t and thereafter that sum total data Yt, Yt+1, . . . , and YT is observed, with respect to a series Y1, Y2, . . . , and YT of the sum total data, by using the observation probability and the transition probability; a posterior probability $\gamma_{t,z}$ which is in the combination z of states of the respective factors at the time point t by using the forward probability $\alpha_{t,z}$ and the backward probability $\beta_{t,z}$; and the state probability by marginalizing the posterior probability $\gamma_{t,z}$ and wherein the state estimation unit, by using a combination of states of the respective factors as a particle, predicts a particle after one time point under the state transition restriction, and obtains the forward probability $\alpha_{t,z}$ of the combination z of states as the particle while repeating sampling of a predetermined number of particles on the basis of the forward probability $\alpha_{t,z}$ and predicts a particle before one time point under the state transition restriction, and obtains the backward probability $\beta_{t,z}$ of the combination z of states as the particle while repeating sampling of a predetermined number of particles on the basis of the backward probability $\beta_{t,z}$.

(E6) The data processing apparatus set forth in any one of (E2) to (E5), wherein the waveform separation learning portion obtains the unique waveform under a restriction distinctive to the electrical appliance.

(E7) The data processing apparatus set forth in (E6), wherein the waveform separation learning portion obtains the unique waveform under a load restriction where power consumption of the electrical appliance obtained using the unique waveform does not have a negative value.

(E8) The data processing apparatus set forth in (E6), wherein the waveform separation learning portion obtains the unique waveform under a base waveform restriction where the unique waveform is represented by one or more combinations of a plurality of base waveforms prepared for the electrical appliances.

(E9) A data processing method including the steps of performing state estimation for obtaining a state probability which is in a state of each factor of an FHMM (Factorial Hidden Markov Model) by using sum total data regarding a sum total of current consumed by a plurality of electrical appliances; and performing learning of the FHMM of which each factor has three or more states by using the state probability.

(E10) A program causing a computer to function as a state estimation unit that performs state estimation for obtaining a state probability which is in a state of each factor of an FHMM (Factorial Hidden Markov Model) by using sum total data regarding a sum total of current consumed by a plurality of electrical appliances; and a model learning unit that performs learning of the FHMM of which each factor has three or more states by using the state probability.

REFERENCE SIGNS LIST

11 DATA ACQUISITION UNIT
12 STATE ESTIMATION UNIT
13 MODEL STORAGE UNIT
14 MODEL LEARNING UNIT
15 LABEL ACQUISITION UNIT
16 DATA OUTPUT UNIT
21 EVALUATION PORTION
22 ESTIMATION PORTION
31 WAVEFORM SEPARATION LEARNING PORTION
32 VARIANCE LEARNING PORTION
33 STATE VARIATION LEARNING PORTION
42 ESTIMATION PORTION
51 RESTRICTED WAVEFORM SEPARATION LEARNING PORTION
52 INDIVIDUAL VARIANCE LEARNING PORTION
71 EVALUATION PORTION
72 ESTIMATION PORTION
81 RESTRICTED WAVEFORM SEPARATION LEARNING PORTION
101 BUS
102 CPU
103 ROM
104 RAM
105 HARD DISK
106 OUTPUT UNIT
107 INPUT UNIT
108 COMMUNICATION UNIT
109 DRIVE
110 INPUT AND OUTPUT INTERFACE
111 REMOVABLE RECORDING MEDIUM

The invention claimed is:

1. A data processing apparatus including a processor and associated memory, comprising:
   a data acquisition unit configured to obtain data representing a mixed signal of two or more time series signals composed of utterances of respective talkers;
   a state estimation unit configured to estimate a parameter for modeling a time series signal with a stochastic dynamics model; and
   a model learning unit configured to learn a restricted wave form separation, an individual variance, and a state variation;
   wherein the state estimation unit is configured to estimate the parameter under a specific restriction;
   wherein the specific restriction is a frequency component within a frequency band that is distinctive of a person's voice among the utterances of the respective talkers in the mixed signal of two or more time series signals,
   wherein the model leaning unit learns the individual variance using the parameter provided by the state estimation unit to identify an individual talker from among the respective talkers.

2. The data processing apparatus of claim 1, wherein the stochastic dynamics model is FHMM (Factorial Hidden Markov Model).

3. The data processing apparatus of claim 1, wherein the state estimation unit is configured to estimate the parameter under the specific restriction by controlling the data to be additive data of positive factors.

4. The data processing apparatus of claim 1, wherein the state estimation unit is configured to estimate the parameter under a specific constraint controlling at least one state of factors to output zero signals.

5. The data processing apparatus of claim 1, wherein the state estimation unit is configured to estimate the parameter under a specific constraint controlling to minimize the probability of selecting non-zero state of factors.

6. The data processing apparatus of claim 2, wherein the state estimation unit is configured to estimate the parameter under the specific restriction by restricting the FHMM such that a number of factors of the FHMM (Factorial Hidden Markov Model) which can undergo state transition at a same time point is less than a threshold number.

7. The data processing apparatus of claim 1, wherein the state estimation unit is configured to estimate the parameter under the specific restriction by restricting the estimated parameter to one or more combinations of a plurality of predetermined parameters.

8. The data processing apparatus of claim 1, wherein the state estimation unit is configured to estimate the parameter under the specific restriction by restricting the estimated parameter to one or more combinations of a plurality of time series signals.

9. The data processing apparatus of claim 2, wherein the state estimation unit is configured to estimate the parameter under the specific restriction by: calculating a variance of the data representing the mixed signal of the two or more time series signals; and using the calculated variance as a parameter of the FHMM (Factorial Hidden Markov Model).

* * * * *